(12) United States Patent
Kondo

(10) Patent No.: US 10,809,642 B2
(45) Date of Patent: Oct. 20, 2020

(54) LIGHT EMITTING COMPONENT, PRINT HEAD, IMAGE FORMING APPARATUS, AND LIGHT IRRADIATING DEVICE

(71) Applicant: FUJI XEROX CO., LTD., Tokyo (JP)

(72) Inventor: Takashi Kondo, Ebina (JP)

(73) Assignee: FUJI XEROX CO., LTD., Tokyo (JP)

( * ) Notice: Subject to any disclaimer, the term of this patent is extended or adjusted under 35 U.S.C. 154(b) by 0 days.

(21) Appl. No.: 16/746,577

(22) Filed: Jan. 17, 2020

(65) Prior Publication Data

US 2020/0225602 A1 Jul. 16, 2020

Related U.S. Application Data

(63) Continuation of application No. PCT/JP2018/027772, filed on Jul. 24, 2018.

(30) Foreign Application Priority Data

Nov. 22, 2017 (JP) ................................. 2017-225144

(51) Int. Cl.
*G03G 15/04* (2006.01)
*G03G 15/00* (2006.01)

(52) U.S. Cl.
CPC ....... *G03G 15/04054* (2013.01); *G03G 15/80* (2013.01); *G03G 2215/0409* (2013.01)

(58) Field of Classification Search
CPC ........... G03G 15/043; G03G 15/04036; G03G 15/04045; G03G 15/04054; G03G 2215/04; G03G 2215/0402; G03G 2215/0407; G03G 2215/0409
See application file for complete search history.

(56) References Cited

U.S. PATENT DOCUMENTS

| | | | |
|---|---|---|---|
| 5,451,977 A | 9/1995 | Kusuda et al. | |
| 5,814,841 A | 9/1998 | Kusuda et al. | |
| 10,477,635 B1* | 11/2019 | Kondo | H05B 45/44 |
| 2009/0297223 A1 | 12/2009 | Suzuki | |
| 2013/0240832 A1 | 9/2013 | Hersee | |
| 2017/0277065 A1* | 9/2017 | Kondo | H01L 33/105 |

(Continued)

FOREIGN PATENT DOCUMENTS

| | | |
|---|---|---|
| JP | H01-238962 A | 9/1989 |
| JP | 2001-308385 A | 11/2001 |

(Continued)

OTHER PUBLICATIONS

Oct. 16, 2018 International Search Report issued in International Patent Application No. PCT/JP2018/027772.

(Continued)

*Primary Examiner* — Thomas S Giampaolo, II
(74) *Attorney, Agent, or Firm* — Oliff PLC

(57) ABSTRACT

Provided is a light emitting chip C including: a substrate 80; light emitting elements each having one terminal connected to a predetermined reference potential and the other terminal, the light emitting element having a rectifying characteristic; and thyristors each connected in series with the other terminal of the light emitting elements, respectively, the thyristors being configured to make the light emitting element connected thereto emit light or increase light emission amount of the light emitting element when the thyristors turn on in an ON state.

16 Claims, 35 Drawing Sheets

(56) References Cited

U.S. PATENT DOCUMENTS

2018/0309890 A1* 10/2018 Kondo .............. H04N 1/00891
2020/0077478 A1* 3/2020 Kondo .................... H01L 27/32

FOREIGN PATENT DOCUMENTS

| JP | 2008-246903 A | | 10/2008 |
|---|---|---|---|
| JP | 2009-286048 A | | 12/2009 |
| JP | 2017-183436 A | | 10/2017 |
| JP | 2019111664 A | * | 7/2019 |

OTHER PUBLICATIONS

Oct. 16, 2018 Written Opinion issued in International Patent Application No. PCT/JP2018/027772.

* cited by examiner

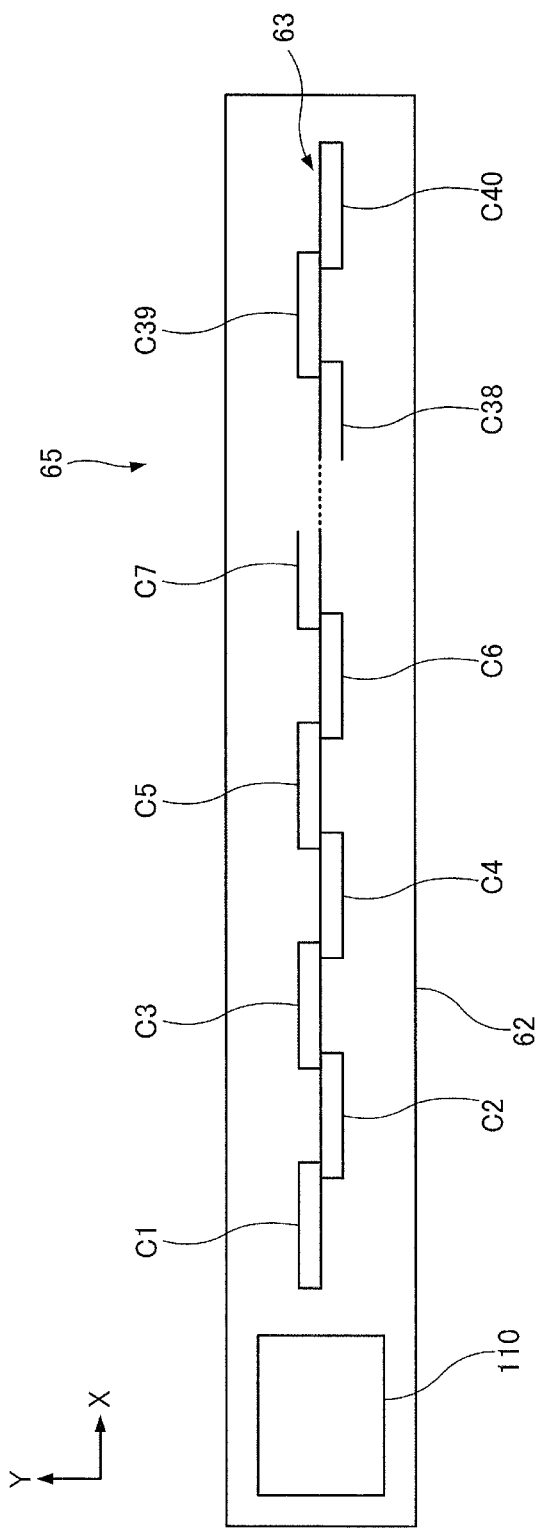

LIGHT EMITTING COMPONENT, PRINT HEAD, IMAGE FORMING APPARATUS, AND LIGHT IRRADIATING DEVICE

CROSS-REFERENCE TO RELATED APPLICATIONS

This is a continuation of International Application No. PCT/JP18/027772 filed on Jul. 24, 2018, and claims priority from Japanese Patent Application No. 2017-225144 filed on Nov. 22, 2017.

BACKGROUND

Technical Field

The present invention relates to a light emitting component, a print head, an image forming apparatus and a light irradiating device.

Related Art

Patent Literature 1 discloses a light emitting element array which is configured by arranging a number of light emitting elements whose threshold voltage or threshold current is controlled from the outside, one-dimensionally, two-dimensionally, or three-dimensionally, and connecting electrodes of the individual light emitting elements for controlling the threshold voltage or the threshold current to one another by electrical means, and connecting clock lines for applying voltage or current from the outside, to the individual light emitting elements.

Patent Literature 2 discloses a self-scanning type light source head which includes a substrate, surface emitting type semiconductor lasers arranged in an array on the substrate, and thyristors arranged as switch elements in an array on the substrate and configured to selectively turn on and off light emission of the surface emitting type semiconductor lasers.

Patent Literature 3 discloses a self-scanning type light emitting device which is configured by configuring light emitting elements in a six-layer p-n-p-n-p-n semiconductor structure, and providing electrodes in the first p-type layers and the sixth n-type layers positioned at their ends and the third p-type layers and the fourth n-type layers positioned at their centers such that in each six layer p-n-p-n-p-n semiconductor structure, the p-n structure composed of the first p-type layer and the second n-type layer serves as a light emitting diode and the p-n-p-n structure composed of the other layers serves as a thyristor.

[Patent Literature 1] Japanese Patent Application Laid-Open No. H01-238962
[Patent Literature 2] Japanese Patent Application Laid-Open No. 2009-286048
[Patent Literature 3] Japanese Patent Application Laid-Open No. 2001-308385

SUMMARY

By the way, for example, in the case of a self-scanning type light emitting element array including a light emitting unit and a drive unit, if light emitting elements of the light emitting unit and transfer elements of the drive unit for sequentially driving the light emitting elements are configured in the same semiconductor layer laminate, it is difficult to independently set light emission characteristics of the light emitting elements and driving characteristics of the transfer elements. For this reason, it may be considered to configure the light emitting elements in another semiconductor layer laminate and independently set light emission characteristics and driving characteristics. In this case, if the elements having rectifying characteristics such as the light emitting elements are connected to the elements for controlling them, a malfunction (an erroneous operation) attributable to the characteristics of the elements having the rectifying characteristics may occur.

Aspects of non-limiting embodiments of the present disclosure relate to provide light emitting components and so on more hard to malfunction as compared to the case where a reference potential is supplied to elements for controlling elements having rectifying characteristics.

Aspects of certain non-limiting embodiments of the present disclosure address the above features and/or other features not described above. However, aspects of the non limiting embodiments are not required to address the features described above, and aspects of the non-limiting embodiments of the present disclosure may not address features described above.

According to an aspect of the present invention, there is provided a light emitting component including: a substrate; a plurality of light emitting elements whose terminals positioned on one side connected to a predetermined reference potential and which have a rectifying characteristic; and a plurality of thyristors which is connected in series with terminals of the light emitting elements positioned on the other side, respectively, and makes the light emitting elements connected thereto emit light or increases light emission amounts of the light emitting elements when the thyristors are in the ON state.

BRIEF DESCRIPTION OF DRAWINGS

Exemplary embodiment(s) of the present invention will be described in detail based on the following figures, wherein:

FIG. 3 is a top view illustrating an example of a light emitting device;

DETAILED DESCRIPTION

Hereinafter, embodiments of the present invention will be described in detail with reference to the accompanying drawings.

Moreover, hereinafter, atomic symbols will be used for denotation such as referring to aluminum as Al.

First Embodiment

Here, a light emitting chip C which is an example of a light emitting component will be described taking, as an example, the case where the light emitting chip C is applied to an image forming apparatus 1.

(Image Forming Apparatus 1)

Figure 1:
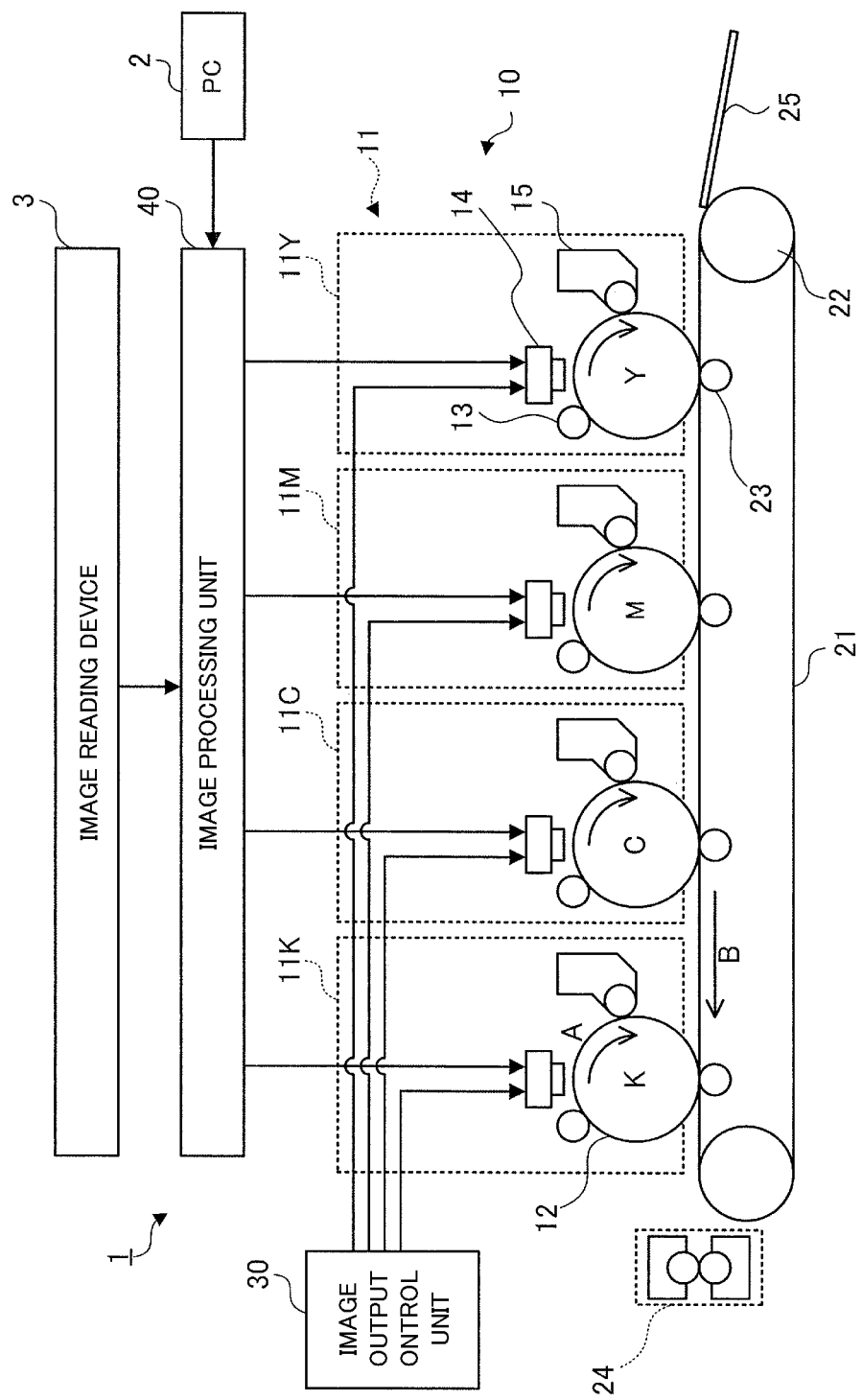
FIG. 1 is a view illustrating an example of the overall configuration of an image forming apparatus to which a first embodiment is applied

FIG. 1 is a view illustrating an example of the overall configuration of the image forming apparatus 1 to which a first exemplary embodiment is applied. The image forming apparatus 1 shown in FIG. 1 is an image forming apparatus that is generally called a tandem type. This image forming apparatus 1 includes an image forming process unit 10 which performs image formation according to image data of individual colors, an image output control unit 30 which controls the image forming process unit 10, and an image processing unit 40 which is connected, for example, to a personal computer (PC) 2 and an image reading apparatus 3 and performs predetermined image processing on image data received from them.

The image forming process unit 10 includes image forming units 11Y, 11M, 11C, and 11K (which are referred to as the image forming units 11 unless they need to be distinguished from one another) which are disposed in parallel at predetermined intervals. The image forming units 11 include photoconductive drums 12 which are examples of image carriers on which electrostatic latent images are formed and which carry toner images, chargers 13 which are examples of a charging unit for charging the surfaces of the photoconductive drums 12 with a predetermined potential, print heads 14 for exposing the photoconductive drums 12 charged by the chargers 13, and developers 15 which are examples of a developing unit for developing electrostatic latent images obtained by the print heads 14. The individual image forming units 11Y, 11M, 11C, and 11K form toner images of yellow (Y), magenta (M), cyan (C), and black (K), respectively.

Also, in order to transfer toner images of the individual colors formed on the photoconductive drums 12 of the individual image forming units 11Y, 11M, 11C, and 11K onto a recording sheet 25 which is an example of a transfer object so as to be superimposed, the image forming process unit 10 includes a sheet conveying belt 21 for conveying the recording sheet 25, a driving roller 22 for driving the sheet conveying belt 21, transfer rollers 23 which are examples of a transfer unit for transferring toner images of the photoconductive drums 12 onto a recording sheet 25, and a fixer 24 for fixing the toner images on the recording sheet 25.

In this image forming apparatus 1, the image forming process unit 10 performs an image forming operation on the basis of various control signals which are supplied from the image output control unit 30. Moreover, under the control of the image output control unit 30, image data received from the personal computer (PC) 2 or the image reading apparatus 3 undergoes image processing by the image processing unit 40, and is supplied to the image forming units 11. Then, for example, in the image forming unit 11K for black (K), the photoconductive drum 12 is charged with a predetermined potential by the charger 13 while rotating in the direction of an arrow A, and is exposed to light which the print head 14 emits on the basis of the image data supplied from the image processing unit 40. As a result, on the photoconductive drum 12, an electrostatic latent image for the black (K) image is formed.

Subsequently, the electrostatic latent image formed on the photoconductive drum 12 is developed by the developer 15, whereby a black (K) toner image is formed on the photoconductive drum 12. Also, in the image forming units 11Y, 11M, and 11C, toner images of the individual colors, i.e. the yellow (Y), the magenta (M), and the cyan (C) are formed, respectively.

The toner images of the individual colors formed on the photoconductive drums 12 by the individual image forming units 11 are electrostatically transferred in succession onto a recording sheet 25 which is fed as the sheet conveying belt 21 moves in the direction of an arrow B, by electric fields for transfer which are applied to the transfer rollers 23. In other words, toner of the individual colors is superimposed on the recording sheet 25. As a result, a synthetic toner image is formed.

Then, the recording sheet 25 having the synthetic toner image electrostatically transferred thereon is conveyed to the fixer 24. The synthetic toner image on the recording sheet 25 conveyed to the fixer 24 undergoes a fixing process using heat and pressure by the fixer 24, thereby being fixed on the recording sheet 25, which is discharged from the image forming apparatus 1.

(Print Heads 14)

Figure 2:
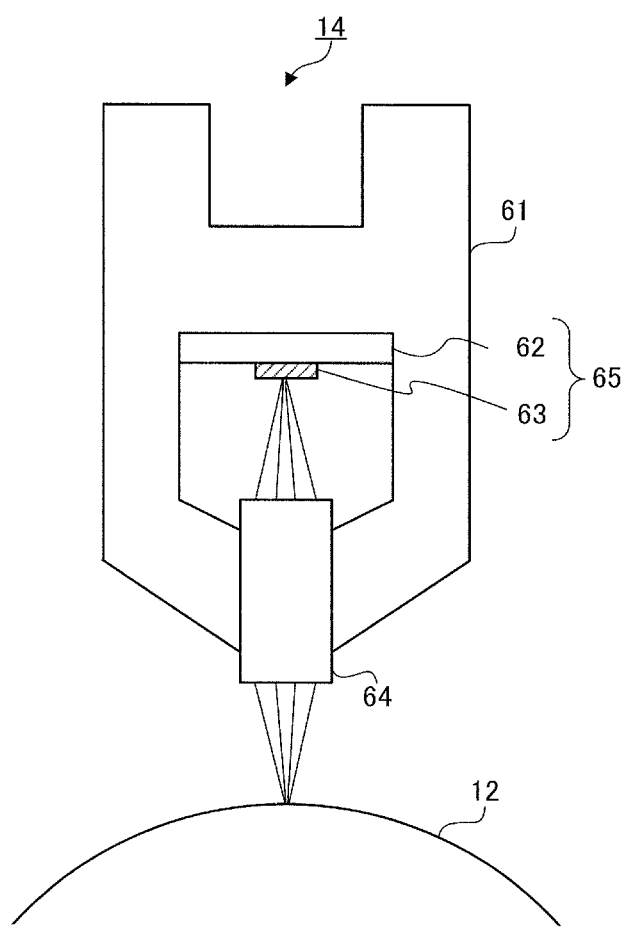
FIG. 2 is a cross-sectional view illustrating an example of the configuration of a print head.

FIG. 2 is a cross-sectional view illustrating an example of the configuration of a print head 14. Each print head 14 which is an example of an exposing unit includes a housing 61, a light emitting device 65 which is an example of a light emitting unit and includes a light source part 63 having a plurality of light emitting elements for exposing a photoconductive drum 12 (in the first exemplary embodiment, the light emitting elements are laser diodes LD), and a rod lens array 64 which is an example of optical means for forming an image of light emitted from the light source part 63 on the surface of the photoconductive drum 12.

The light emitting device 65 includes a circuit board 62 for mounting the above-mentioned light source part 63, a signal generating circuit 110 (see FIG. 3 to be described below) for driving the light source part 63, and so on.

The housing 61 is made of, for example, a metal, and is set such that it supports the circuit board 62 and the rod lens array 64 and the light emission surfaces of the light emitting elements of the light source part 63 are positioned on the focal plane of the rod lens array 64. Also, the rod lens array 64 is disposed along the axial direction of the photoconductive drum 12 (which is a main scanning direction and is the X direction of FIG. 3 and FIG. 4B).

(Light Emitting Devices 65)

FIG. 3 is a top view of an example of a light emitting device 65.

In the light emitting device 65 illustrated as an example in FIG. 3, the light source part 63 is configured by disposing forty light emitting chips C1 to C40 (which are examples of light emitting components and are referred to as the light emitting chips C unless they need to be distinguished from one another) on the circuit board 62 in a zigzag pattern in two rows in the X direction which is the main scanning direction. The light emitting chips C1 to C40 may have the same configuration.

In this specification, the term "A to B" where A and B are numbers is used to indicate a plurality of constituent elements which are distinguished from one another by numbers ranging from A to B, both inclusive. For example, the light emitting chips C1 to C40 include the light emitting chip C1 to the light emitting chip C40 in numerical order.

Incidentally, in the first exemplary embodiment, forty is used as the total number of light emitting chips C; however, the number of light emitting chips is not limited thereto.

The light emitting device 65 includes the signal generating circuit 110 for driving the light source part 63. The signal generating circuit 110 is configured with, for example, an integrated circuit (IC), or the like. However, the light emitting device 65 does not necessarily need to include the signal generating circuit 110. In this occasion, the signal generating circuit 110 may be provided outside the light emitting device 65 so as to be able to supply control signals for controlling the light emitting chip C, and so on through cables and so on. Here, on the assumption that each light emitting devices 65 includes the signal generating circuit 110, a description will be made.

The arrangement of the light emitting chips C will be described below in detail.

Figure 4A:
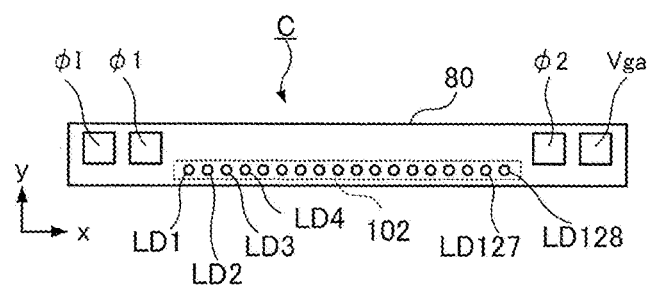
FIG. 4A is a view illustrating an example of the configuration of a light emitting chip.
Figure 4B:
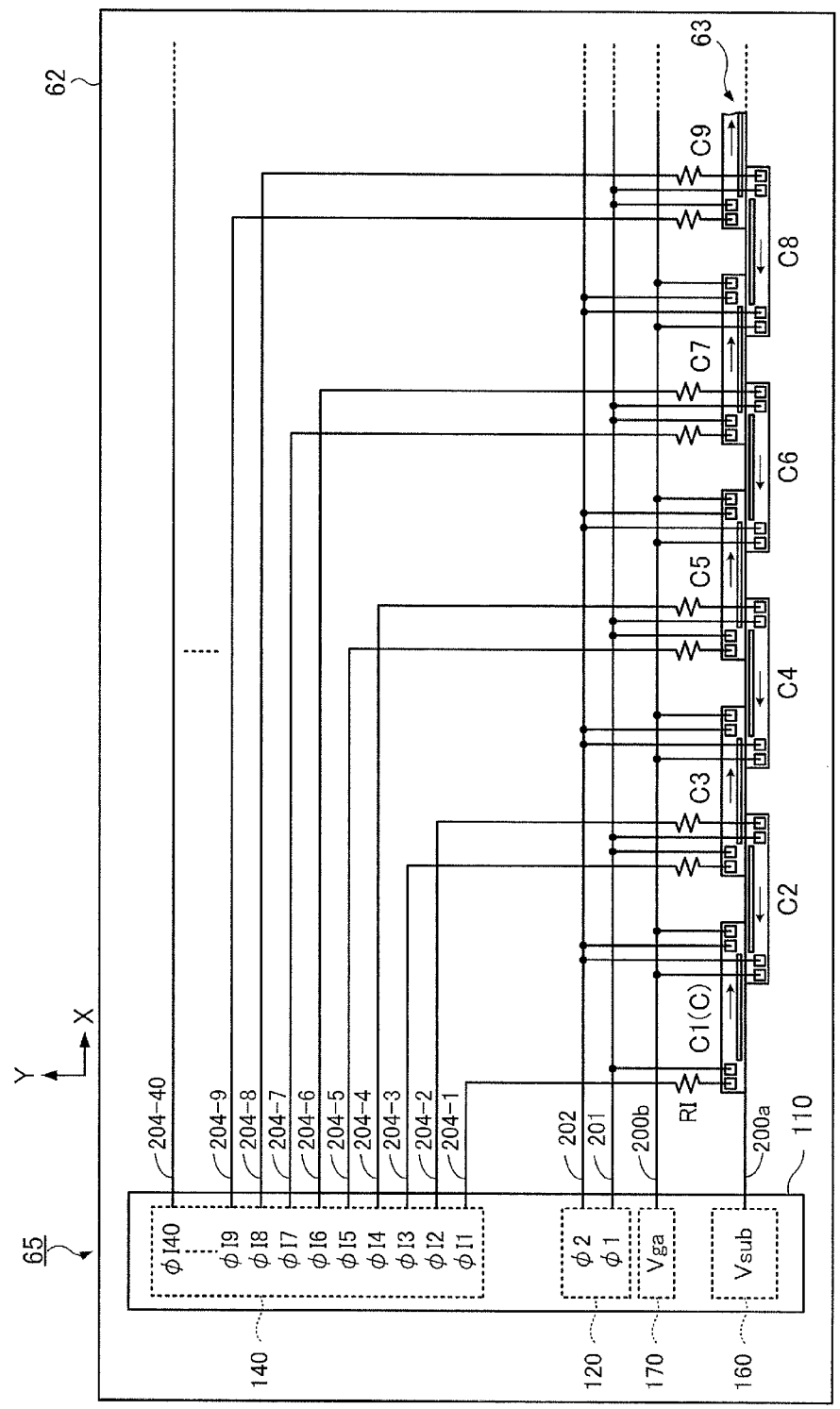
FIG. 4B is a view illustrating the configuration of a signal generating circuit of a light emitting device, and the configuration of wires (lines) on a circuit board 62.

FIGS. 4A and 44B are views illustrating an example of the configuration of a light emitting chip C, the configuration of a signal generating circuit 110 in a light emitting device 65, and the configuration of wires (lines) on a circuit board 62 in the light emitting device. FIG. 4A illustrates the configuration of the light emitting chip C, and FIG. 4B illustrates the configuration of the signal generating circuit 110 in the light emitting device 65, and the configuration of the wires (lines) on the circuit board 62. However, in FIG. 4B, some of the light emitting chips C1 to C40, i.e. the light emitting chips C1 to C9 are illustrated.

First of all, the configuration of the light emitting chip C illustrated in FIG. 4A will be described.

The light emitting chip C includes a light emitting part 102, which is configured so as to include a plurality of light emitting elements (in the first exemplary embodiment, laser diodes LD1 to LD128 (which are referred to as the laser diodes LD unless they need to be distinguished from one another) arranged close to one side of long sides of the front surface of a substrate 80, in a row along the corresponding long side. The front surface is rectangular. Further, the light emitting chip C includes a plurality of terminals (a φ1 terminal, a φ2 terminal, a Vga terminal, and a φI terminal), which are provided on both end parts in the long-side direction of the front surface of the substrate 80 and are bonding pads for taking in various control signals and so on. These terminals are provided such that the φI terminal and the φ1 terminal are arranged in the order, from one end part of the substrate 80, and the Vga terminal and the φ2 terminal are arranged in the order, from the other end part of the substrate 80. Between the φ1 terminal and the φ2 terminal, the light emitting part 102 is provided. Further, on the back surface of the substrate 80, a back electrode 91 (see FIG. 6 to be described below) is provided as a Vsub terminal.

Here, the laser diodes LD are examples of light emitting elements (elements which are used for light emission).

However, the expression "arranged in a row" refers not only to a state in which the plurality of light emitting elements is arranged in a straight line as shown in FIG. 4A, but also to a state where the plurality of individual light emitting elements is arranged so as to have different deviations in the direction perpendicular to the row direction, respectively. For example, the individual light emitting elements may be disposed so as to have deviations in the direction perpendicular to the row direction. Alternatively, the light emitting elements may be disposed alternately in a zigzag pattern, or sets each of which is composed of a plurality of light emitting elements are arranged in a zigzag pattern.

Now, with reference to FIG. 4B, the configuration of the signal generating circuit 110 of the light emitting device 65 and the configuration of the wires (lines) on the circuit board 62 will be described.

As described above, on the circuit board 62 of the light emitting device 65, the signal generating circuit 110 and the light emitting chips C1 to C40 are mounted, and the wires (lines) for connecting the signal generating circuit 110 and the light emitting chips C1 to C40 are provided.

First, the configuration of the signal generating circuit 110 will be described.

To the signal generating circuit 110, image data subjected to image processing and various control signals are input from the image output control unit 30 and the image processing unit 40 (see FIG. 1). Based on the image data and the various control signals, the signal generating circuit 110 performs image data rearrangement, light amount correction, and the like.

Also, the signal generating circuit 110 includes a transfer signal generating unit 120 for transmitting a first transfer signal φ1 and a second transfer signal φ2 to the light emitting chips C1 to C40, on the basis of various control signals.

Further, the signal generating circuit 110 includes a lighting-signal generating unit 140, which transmits lighting signals φI1 to φI40 (which are referred to as the lighting signals φI unless they need to be distinguished from one another) to the light emitting chips C1 to C40, respectively, on the basis of various control signals.

Furthermore, the signal generating circuit 110 includes a reference potential supplying unit 160 which supplies a reference potential Vsub as a potential reference to the light emitting chips C1 to C40, and a power supply potential supplying unit 170 which supplies the power supply potential Vga for driving the light emitting chips C1 to C40.

However, the reference potential Vsub and the power supply potential Vga do not necessarily need to fixed values, and may vary in such a range that the light emitting chips C perform operations to be described below. The same is true of the first transfer signal φ1, the transfer signal φ2, and the lighting signals φI1 to φI40.

Now, the arrangement of the light emitting chips C1 to C40 will be described.

The odd-numbered light emitting chips C1, C3, C5, etc. are arranged in a row at intervals in the long-side directions of the individual substrates 80. The even-numbered light emitting chips C2, C4, C6, etc. also are arranged in a row at intervals in the long-side directions of the individual substrates 80 in the same way. Further, the odd-numbered light emitting chips C1, C3, C5, etc. and the even-numbered light emitting chips C2, C4, C6, etc. are arranged in such a zigzag pattern that the odd-numbered light emitting chips and the even-numbered light emitting chips face the opposite sides such that long sides of the odd-numbered and even-numbered light emitting chips C closer to the light emitting parts 102 face each other. Furthermore, the positions of the light emitting chips C are set such that the laser diodes LD are arranged at predetermined intervals in the main scanning direction (the X direction). In each of the light emitting chips C1 to C40 shown in FIG. 4B, the direction of arrangement of the laser diodes LD (in the order of the laser diodes LD1 to LD128) shown in FIG. 4A is indicated by an arrow.

The wires (lines) which connect the signal generating circuit 110 and the light emitting chips C1 to C40 will be described.

On the circuit board 62, a power supply line 200a for supplying the reference potential Vsub is provided so as to be connected between the reference potential supplying unit 160 of the signal generating circuit 110 and the back electrodes 91 (see FIG. 6 to be described below) provided as Vsub terminals on the back surfaces of the substrates 80 of the light emitting chips C.

Further, on the circuit board 62, a power supply line 200b for supplying the power supply potential Vga for driving is provided so as to be connected between the power supply potential supplying unit 170 of the signal generating circuit 110 and Vga terminals provided on the light emitting chips C.

On the circuit board 62, a first transfer signal line 201 for transmitting the first transfer signal φ1 from the transfer signal generating unit 120 of the signal generating circuit 110 to the φ1 terminals of the light emitting chips C1 to C40, and a second transfer signal line 202 for transmitting the second transfer signal φ2 from the transfer signal generating unit to the φ2 terminals of the light emitting chips C1 to C40 are provided. The first transfer signal φ1 and the second transfer signal φ2 are transmitted to the light emitting chips C1 to C40 in common (in parallel).

In addition, on the circuit board 62, lighting signal lines 204-1 to 204-40 (which are referred to as the lighting signal lines 204 unless they need to be distinguished from one another) for transmitting lighting signals φI1 to φI40 from the lighting-signal generating unit 140 of the signal generating circuit 110 to the φI terminals of the light emitting chips C1 to C40 through current limiting resistors RI, respectively, are provided As described above, the reference potential Vsub and the power supply potential Vga are supplied to all the light emitting chips C1 to C40 provided on the circuit board 62, in common. The first transfer signal φ1 and the second transfer signal φ2 also are transmitted to the light emitting chips C1 to C40 in common (in parallel). Meanwhile, the lighting signals φI1 to φI40 are individually transmitted to the light emitting chips C1 to C40, respectively.

Figure 5:
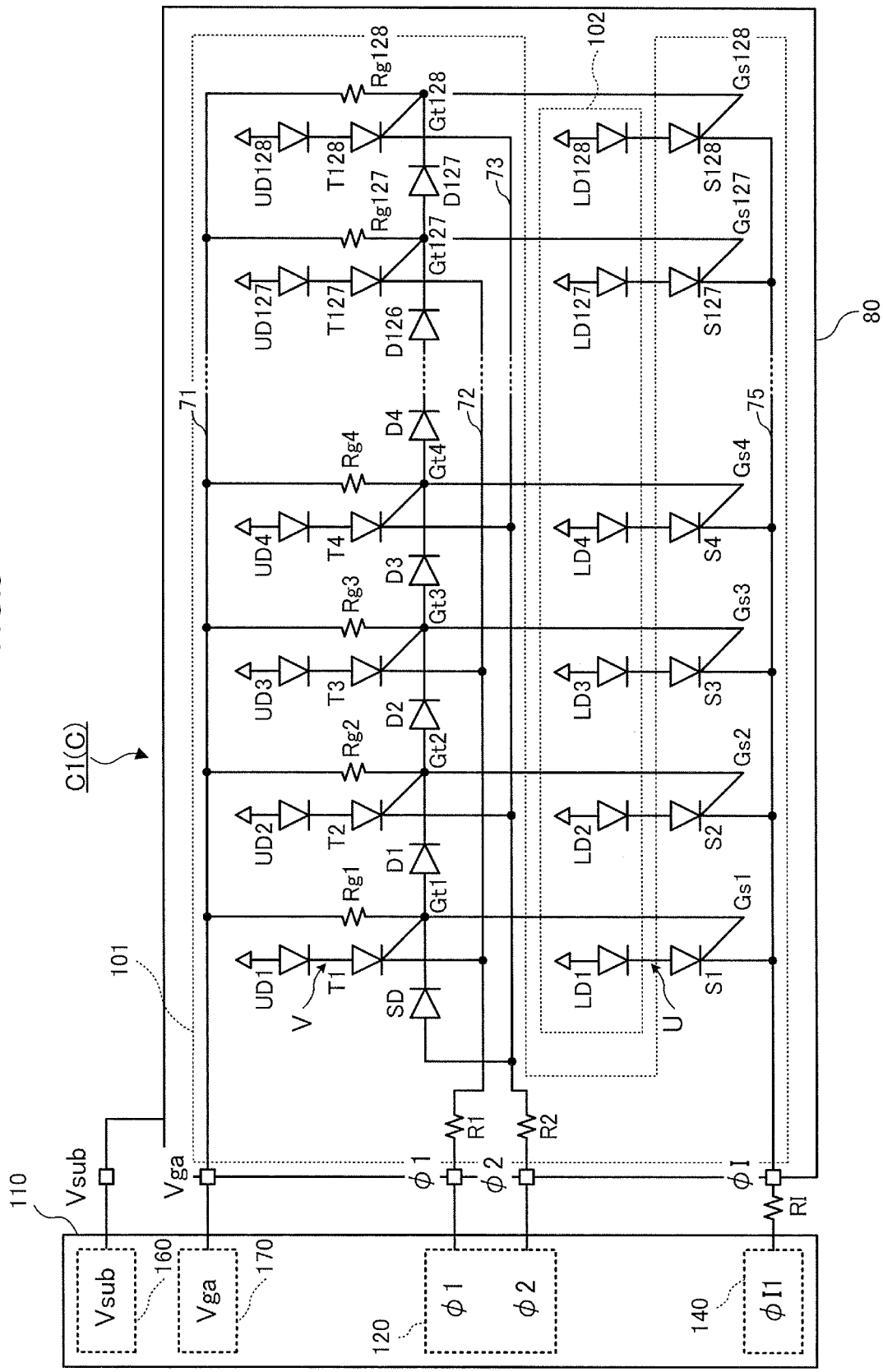
FIG. 5 is an equivalent circuit diagram for explaining the circuit configuration of a light emitting chip equipped with a self-scanning type light emitting element array (SLED) according to the first embodiment.

(Light Emitting Chips C) FIG. 5 is an equivalent circuit diagram for explaining the circuit configuration of a light emitting chip C equipped with a self-scanning type light emitting element array (a self-scanning light emitting device (SLED) according to the first exemplary embodiment. The individual elements to be described below, except for the terminal (the φ1 terminal, the φ2 terminal, the Vga terminal, and the φI terminal), are disposed on the basis of the layout on the light emitting chip C (see FIG. 6 to be described below). The terminals (the φ1 terminal, the φ2 terminal, the Vga terminal, and the φI terminal) are illustrated at the left end of FIG. 6 in order to explain the connection relations between the terminals and the signal generating circuit 110, although their positions are different from those in FIG. 4A. Further, the Vsub terminal provided on the back surface of the substrate 80 is illustrated outside the substrate 80.

Here, a light emitting chip C will be described with respect to the relation with a signal generating circuit 110 and taking the light emitting chip C1 as an example. For this reason, in FIG. 5, the light emitting chip is denoted by C1(C), instead of C. The other light emitting chips C2 to C40 have the same configuration as that of the light emitting chip C1.

The light emitting chip C1(C) includes a light emitting part 102 (see FIG. 4A) configured with laser diodes LD1 to LD128.

Further, the light emitting chip C1(C) includes setting thyristors S1 to S128 (which are referred to as the setting thyristors S unless they need to be distinguished from one another). The laser diodes LD1 to LD128 and the setting thyristors S1 to S128 are provided such that each pair of a laser diode LD and a setting thyristor S having the same number are connected in series. Here, the cathodes of the laser diodes LD and the anodes of the setting thyristors S are connected. By the way, as shown in FIG. 6B to be described below, the setting thyristors S are stacked on the laser diodes LD arranged in a row on the substrate 80. Therefore, the setting thyristors S1 to S128 also are arranged in a row.

If a setting thyristor S gets into the ON state, it makes a laser diode LD emit light, or increases the light emission amount, as will be described below. In other words, the setting thyristor S sets the laser diode LD to a state where the laser diode has emitted light, or a state where the light emission amount has increased. This is the reason why the term "setting thyristor S" is used. Further, through the setting thyristors S, current is supplied to the laser diodes LD. In other words, the light emitting elements (such as the laser diodes LD, and light emitting diodes LED, vertical cavity surface emitting lasers VCSEL, etc. according to other exemplary embodiments to be described below) are elements having rectifying characteristics (two-terminal elements), and the setting thyristors S are elements for controlling the elements having the rectifying characteristics. Therefore, the setting thyristors S are also referred to as the thyristors.

Also, the light emitting chip C1(C) includes transfer thyristors T1 to T128 (which are referred to as the transfer thyristors T unless they need to be distinguished from one another) arranged in a row, similarly to the laser diodes LD1 to LD128 and the setting thyristors S1 to S128.

Further, the light emitting chip C1(C) includes under diodes UD1 to UD128 (which are referred to as the under diodes UD unless they need to be distinguished from one another) having the same structure as that of the laser diodes LD1 to LD128. The under diodes UD1 to UD128 and the transfer thyristors T1 to T128 are provided such that each pair of an under diode UD and a transfer thyristor T having the same number are connected in series.

By the way, as shown in FIG. 6B, the transfer thyristors T are stacked on the under diodes UD arranged in a row on the substrate 80. Therefore, the under diodes UD1 to UD128 also are arranged in a row.

Here, a description will be made using the transfer thyristors T as examples of transfer elements. However, other circuit elements may be used as long as they may sequentially get into the ON state. For example, circuit elements which are combinations of shift registers and a plurality of transistors may be used.

Also, the light emitting chip C1(C) includes coupling diodes D1 to D127 (which are referred to as the coupling diodes D unless they need to be distinguished from one another) each of which is provided between a pair of transfer thyristors when the transfer thyristors T1 to T128 are paired in the numbered order.

Further, the light emitting chip C1(C) includes power-supply-line resistors Rg1 to Rg128 (which are referred to as the power-supply-line resistors Rg unless they need to be distinguished from one another).

Also, the light emitting chip C1(C) includes one start diode SD. In addition, the light emitting chip C1(C) includes current limiting resistors R1 and R2 provided in order to prevent excess current from flowing into a first transfer signal line 72 and a second transfer signal line 73 which will be described below. Through the first transfer signal line, the first transfer signal φ1 may be transmitted, and through the second transfer signal line, the second transfer signal φ2 may be transmitted.

Here, the setting thyristors S1 to S128, the transfer thyristors T1 to T128, the under diodes UD1 to UD128, the power-supply-line resistors Rg1 to Rg128, the coupling diodes D1 to D127, the start diode SD, and the current limiting resistors R1 and R2 constitute a driving unit 101. Also, the setting thyristors S and the transfer thyristors T included in the driving unit 101 are referred to as the driving elements, and the setting thyristors S and the transfer thyristors T included in the driving unit 101 are referred to as driving the light emitting part 102. Moreover, a characteristic of the driving unit 101 related to driving of the light emitting part 102 is referred to as the driving characteristic, and a characteristic of the light emitting part 102 related to light emission is referred to as the light emission characteristic.

The laser diodes LD1 to LD128 of the light emitting part 102, and the setting thyristors S1 to S128, the transfer thyristors T1 to T128, and the under diodes UD1 to UD128 included in the driving unit 101 are arranged in numerical order from the left side in FIG. 5. Further, the coupling diodes D1 to D127 and the power-supply-line resistors Rg1 to Rg128 also are arranged in numerical order from the left side in FIG. 5.

In addition, the light emitting chip C includes a power supply line 71 to which the power supply potential Vga is supplied, the first transfer signal line 72 to which the first transfer signal φ1 is supplied, the second transfer signal line 73 to which the second transfer signal φ2 is supplied, and a lighting signal line 75 for supplying current for lighting to the laser diodes LD.

In the first exemplary embodiment, the number of laser diodes LD which are included in the light emitting part 102, and the numbers of setting thyristors S, transfer thyristors T, under diodes UD, and power-supply-line resistors Rg which are included in the driving unit 101 are all 128. Incidentally, the number of coupling diodes D is 127, which is one less than the number of the transfer thyristors T.

The numbers of laser diodes and so on are not limited thereto, and may be any predetermined numbers. Moreover, the number of transfer thyristors T may be larger than the number of laser diodes LD.

Each of the above-mentioned diodes (the laser diodes LD, the under diodes UD, the coupling diodes D, and the start diode SD) is a two-terminal semiconductor element having an anode terminal (an anode) and a cathode terminal (a cathode), and each of the thyristors (the setting thyristors S and the transfer thyristors T) is a three-terminal semiconductor element having an anode terminal (an anode), a gate terminal (a gate), and a cathode terminal (a cathode).

By the way, as will be described below, in some cases, the diodes (the laser diodes LD, the under diodes UD, the coupling diodes D, and the start diode SD) and the thyristors (the setting thyristors S and the transfer thyristors T) do not necessarily need to have anode terminals, gate terminals, and cathode terminals as electrodes. Therefore, hereinafter, in some cases, the term "terminal" will be omitted, and the terms in the parentheses will be used.

Now, the electrical connections of the individual elements in the light emitting chip C1(C) will be described.

The anode of each of the laser diodes LD and the under diodes UD is connected to the substrate 80 of the light emitting chip C1(C) (an anode-common configuration). These anodes are connected to the power supply line 200*a* (see FIG. 4B) through the back electrode 91 (see FIG. 6B to be described below) which is the Vsub terminal provided on the back surface of the substrate 80. To the power supply line 200*a*, the reference potential Vsub is supplied from the reference potential supplying unit 160.

By the way, this connections are configured when the substrate 80 is a p-type substrate. In the case of using an n-type substrate, the polarities are reverse, and in the case of using an intrinsic I type substrate containing no impurities, on the side of the substrate where the driving unit 101 and the light emitting part 102 are provided, the terminals are provided so as to be connected to the power supply line 200*a* for supplying the reference potential Vsub.

Moreover, the cathodes of the laser diodes LD are connected to the anodes of the setting thyristors S, respectively. Also, the cathodes of the under diodes UD are connected to the anodes of the transfer thyristors T, respectively. In other words, the laser diodes LD and the setting thyristors S are connected in series. Similarly, the under diodes UD and the transfer thyristors T are connected in series.

The cathodes of the setting thyristors S are connected to the lighting signal line 75. The lighting signal line 75 is connected to a φI terminal. In the light emitting chip C1, the φI terminal is connected to the lighting signal line 204-1 through the current limiting resistor RI provided outside the light emitting chip C1(C), such that the lighting signal φI1 may be transmitted from the lighting-signal generating unit 140 thereto. The lighting signal φI1 supplies current for lighting to the laser diodes LD1 to LD128. Meanwhile, the φI terminals of the other light emitting chips C2 to C40 are connected to the lighting signal lines 204-2 to 204-40 through the current limiting resistors RI, respectively, such that lighting signals φI2 to φI40 may be transmitted from the lighting-signal generating unit 140 thereto (see FIG. 4B).

According to the arrangement of the transfer thyristors T, the cathodes of the odd-numbered transfer thyristors T1, T3, etc. are connected to the first transfer signal line 72. Further, the first transfer signal line 72 is connected to the φ1 terminal through the current limiting resistor R1. This φ1 terminal is connected to the first transfer signal line 201 (see FIG. 4B) such that the first transfer signal φ1 may be transmitted from the transfer signal generating unit 120 thereto.

Meanwhile, according to the arrangement of the transfer thyristors T, the cathodes of the even-numbered transfer thyristors T2, T4, etc. are connected to the second transfer signal line 73. Further, the second transfer signal line 73 is connected to the φ2 terminal through the current limiting resistor R2. This φ2 terminal is connected to the second transfer signal line 202 (see FIG. 4B) such that the second transfer signal φ2 may be transmitted from the transfer signal generating unit 120 thereto.

Gates Gt1 to Gt128 (which are referred to as the gates Gt unless they need to be distinguished from one another) configured in the transfer thyristors T1 to T128 are connected to gates Gs1 to Gs128 (which are referred to as the gates Gs unless they need to be distinguished from one another) configured in the setting thyristors S1 to S128 having the same numbers as those of the gates Gt1 to Gt128, respectively, in one-to-one correspondence. Therefore, each pair of the gates Gt1 to Gt128 and the gates Gs1 to Gs128 having the same number have the same electric potential. Therefore, for example, the expression "the gate Gt1 (the gate Gs1)" indicates that the gate Gt1 and the gate Gs1 have the same potential.

The coupling diodes D1 to D127 are connected between pairs of the gates Gt1 to Gt128 of the transfer thyristors T1 to T128, respectively, when the gates are paired in numerical order. In other words, the coupling diodes D1 to D127 are connected in series such that each of the coupling diodes is interposed between two of the gates Gt1 to Gt128, respectively. The coupling diode D1 is connected in such a direction that current flows from the gate Gt1 to the gate Gt2. The same is true of the other coupling diodes D2 to D127.

The gates Gt of the transfer thyristors T are connected to the power supply line 71 through power-supply-line resistors Rg provided so as to correspond to the transfer thyristors T. The power supply line 71 is connected to the Vga terminal. The Vga terminal is connected to the power supply line 200*b* (see FIG. 4B) such that the power supply potential Vga may be supplied from the power supply potential supplying unit 170 thereto. By the way, the gates Gs of the setting thyristors S are connected to the gates Gt of the transfer thyristors T. Therefore, the gates Gs of the setting thyristors S also are connected to the power supply line 71.

Further, the gate Gt1 of the transfer thyristor T1 is connected to the cathode of the start diode SD. Meanwhile, the anode of the start diode SD is connected to the second transfer signal line 73.

Figure 6A:
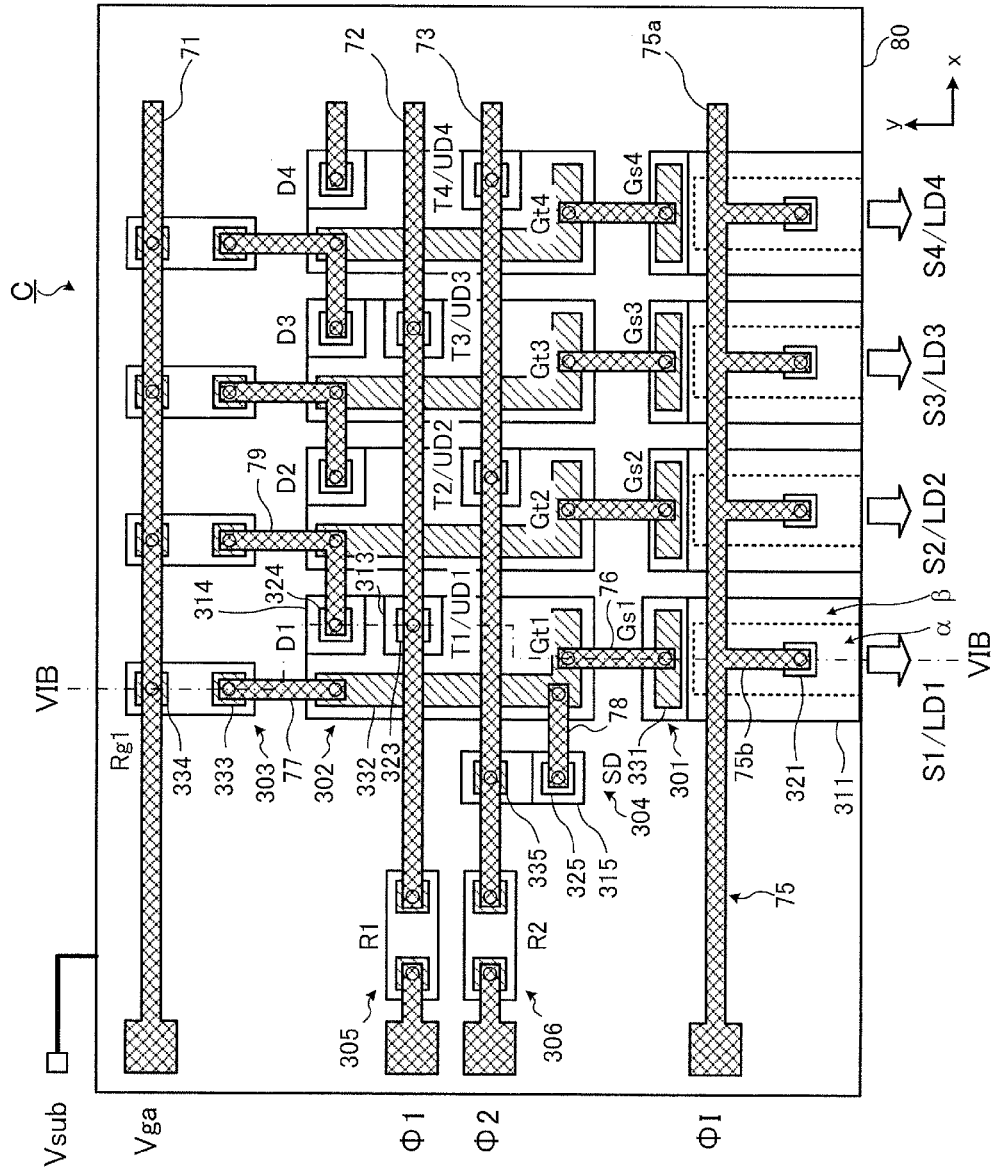
FIG. 6A is a planar layout diagram of the light emitting chip according to the first embodiment.
Figure 6B:
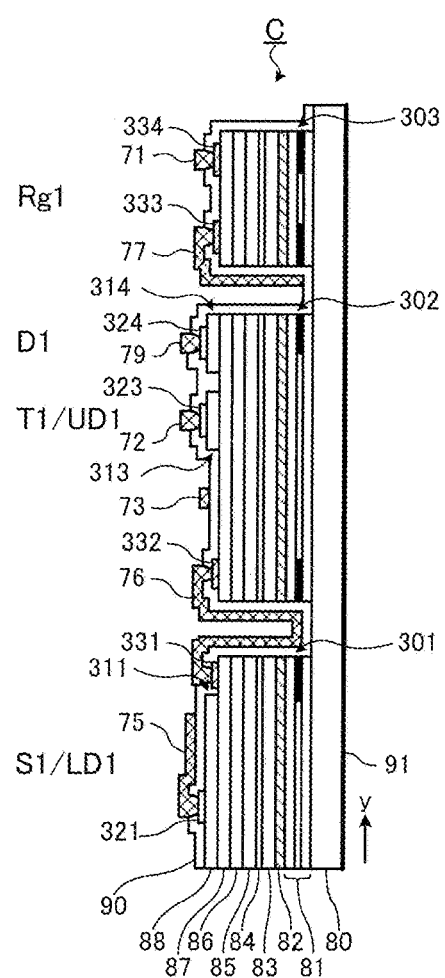
FIG. 6B is a cross-sectional view taken along a line VIB-VIB of FIG. 6A.

FIGS. 6A and 6B are examples of a planar layout diagram and a cross-sectional view of the light emitting chip C according to the first exemplary embodiment. FIG. 6A is a planar layout diagram of the light emitting chip C, and FIG. 6B is a cross-sectional view taken along a line VIB-VIB of FIG. 6A. Here, the connection relation between the light emitting chip C and the signal generating circuit 110 is not illustrated. Therefore, it is unnecessary to take the light emitting chip C1 as an example. Therefore, the light emitting chip is denoted simply by C.

In FIG. 6A, a part mainly including the laser diodes LD1 to LD4, the setting thyristors S1 to S4, the transfer thyristors T1 to T4, and the under diodes UD1 to UD4 is illustrated. The terminals (the φ1 terminal, the φ2 terminal, the Vga terminal, and the φI terminal) are illustrated at the left end part of FIG. 6 for the purpose of illustration, although their positions are different from those in FIG. 4A. Further, the Vsub terminal (the back electrode 91) provided on the back surface of the substrate 80 is illustrated outside the substrate 80. If the terminals are provided so as to correspond to FIG. 4A, the φ2 terminal, the φI terminal, and the current limiting resistor R2 are provided on the right end part of the substrate 80. Also, the start diode SD may be provided on the right end part of the substrate 80.

In FIG. 6A, directions in which light from the laser diodes LD is emitted are shown by arrows. Here, the light emission surfaces of the laser diodes LD are configured as cleavage surfaces. The reason why the light emission surfaces of the laser diodes LD are configured as cleavage surfaces will be described below.

In FIG. 6B which is a cross-sectional view taken along the line VIB-VIB of FIG. 6A, from the bottom of the drawing, the laminate of the setting thyristor S1 and the laser diode LD1, the laminate of the transfer thyristor T1 and the under diode UD1, the coupling diode D1, and the power-supply-line resistor Rg1 are illustrated. By the way, on the laser diode LD1, the setting thyristor S1 is stacked. Similarly, on the under diode UD1, the transfer thyristor T1 is stacked.

Further, in FIGS. 6A and 6B, main elements and terminals are denoted by names. Also, on the front surface of the substrate 80, the arrangement direction of the laser diodes LD (the laser diodes LD1 to LD4) will be referred to as an x direction, and a direction perpendicular to the x direction will be referred to as a y direction. Further, a direction from the back surface of the substrate 80 toward the front surface will be referred to as a z direction. By the way, in some cases, a direction along the xy plane will be referred to as a transverse direction, and the positive z direction will be referred to as an upward direction, and the negative z direction will be referred to as a downward direction.

First, the cross-section structure of the light emitting chip C will be described with reference to FIG. 6B.

On a p-type substrate 80 (the substrate 80), a p-type anode layer 81 (a p anode layer 81), a light emitting layer 82, and an n-type cathode layer 83 (an n cathode layer 83) to constitute the laser diodes LD and the under diodes UD are formed.

Further, on the n cathode layer 83, a tunnel junction (tunnel diode) layer 84 (a tunnel junction layer 84) is formed.

Furthermore, on the tunnel junction layer 84, a p-type anode layer 85 (a p anode layer 85), an n-type gate layer 86 (an n gate layer 86), a p-type gate layer 87 (a p gate layer 87), and an n-type cathode layer 88 (an n cathode layer 88) to constitute the setting thyristors S, the transfer thyristors T, the coupling diode D1, and the power-supply-line resistor Rg1 are formed in the order.

Hereinafter, the terms in the parentheses will be used. The same is true of other cases.

Moreover, in the light emitting chip C, as shown in FIG. 6B, a protective layer 90 is formed of an insulating material so as to cover the front surfaces and side surfaces of those islands. As described above, the light emission surfaces of the laser diodes LD are configured, for example, as cleavage surfaces. To this end, on the light emission surfaces of the laser diodes LD, the protective layer 90 is not formed.

As will be described below, in order to emit light of the laser diodes LD through the protective layer 90 without removing the protective layer 90, the protective layer 90 needs to have translucency for light which the laser diodes LD emit.

Also, these islands are connected to the power supply line 71, the first transfer signal line 72, the second transfer signal line 73, the lighting signal line 75, and so on via through-holes (shown by 0 in FIG. 6A) formed in the protective layer 90. Hereinafter, a description of the protective layer 90 and the through-holes will not be made.

Also, as shown in FIG. 6B, on the back surface of the substrate 80, the back electrode 91 to serve as the Vsub terminal is provided.

The p anode layer 81, the light emitting layer 82, the n cathode layer 83, the tunnel junction layer 84, the p anode layer 85, the n gate layer 86, the p gate layer 87, and the n cathode layer 88 are semiconductor layers, and are monolithically stacked by epitaxial growth.

Then, in order to form a plurality of separate islands (islands 301, 302, 303, etc. to be described below), parts of the semiconductor layers between the islands are removed by etching (mesa etching). Alternatively, the p anode layer 81 may also serve as the substrate 80.

Here, the terms "p anode layer 81" and "n cathode layer 83" correspond to functions (operations) when the corresponding layers constitute the laser diodes LD and the under diodes UD. In other words, the p anode layer 81 serves as anodes, and the n cathode layer 83 serves as cathodes. By the way, in each laser diode LD, each of the p anode layer 81 and the n cathode layer 83 serves as a clad. For this reason, they are also referred to as the p anode (clad) layer 81 and the n cathode (clad) layer 83.

Also, the terms "p anode layer 85", "n gate layer 86", "p gate layer 87", and "n cathode layer 88" correspond to functions (operations) when they constitute the setting thyristors S and the transfer thyristors T. In other words, the p anode layer 85 serves as anodes, and the n gate layer 86 and the p gate layer 87 serve as gates, and the n cathode layer 88 serve as cathodes.

On the other hand, when they constitute the coupling diodes D and the power-supply-line resistors Rg, they have other functions as will be described below.

As will be described below, the plurality of islands includes some islands each of which does not include any parts of some of the p anode layer 81, the light emitting layer 82, the n cathode layer 83, the tunnel junction layer 84, the p anode layer 85, the n gate layer 86, the p gate layer 87, and the n cathode layer 88. For example, the island 301 does not include any part of the n cathode layer 88.

Now, the planer layout of the light emitting chip C will be described with reference to FIG. 6A.

In the island 301, the laser diode LD1 and the setting thyristor S1 are provided. In the island 302, the under diode UD1, the transfer thyristor T1, and the coupling diode D1 are provided. In the island 303, the power-supply-line resistor Rg1 is provided. In the island 304, the start diode SD is provided. In the island 305, the current limiting resistor R1 is provided, and in the island 306, the current limiting resistor R2 is provided.

Moreover, in the light emitting chip C, a plurality of islands identical to each of the islands 301, 302, and 303 is formed in parallel. In these islands, the laser diodes LD2, LD3, LD4, etc., the setting thyristors S2, S3, S4, etc., the transfer thyristors T2, T3, T4, etc., the under diodes UD2, UD3, UD4, etc., the coupling diodes D2, D3, D4, etc., and so on are provided similarly in the islands 301, 302, and 303.

Now, the island 301 to the island 306 will be described in detail with reference to FIGS. 6A and 6B.

The laser diode LD1 provided in the island 301 is composed of the p anode layer 81, the light emitting layer 82, and the n cathode layer 83. The setting thyristor S1 is composed of the p anode layer 85, the n gate layer 86, the p gate layer 87, and the n cathode layer 88 stacked on the tunnel junction layer 84 staked on the n cathode layer 83 of the laser diode LD1. An n-type ohmic electrode 321 (an n ohmic electrode 321) provided on the n cathode layer 88 (a region 311) is referred to as a cathode electrode.

Also, a p-type ohmic electrode 331 (a p ohmic electrode 331) provided on the p gate layer 87 exposed by removing the n cathode layer 88 is referred to as an electrode serving as the gate Gs1 (also referred to as the gate terminal Gs1).

By the way, in the p anode layer 81, a current constriction layer 81b (see FIG. 7 to be described below) is included. The current constriction layer 81b is provided in order to restrict current flowing in the laser diodes LD to the central parts of the laser diodes LD (in order to perform current constriction). In other words, the peripheral parts of the laser diodes LD have lots of defects due to mesa etching. Therefore, non-radiative recombination is likely to occur. For this reason, the current constriction layer 81b is provided such that the central part of each laser diode LD serves as a current passing part α through which it is easy for current to flow and the peripheral part thereof serves as a current blocking part β through which it is difficult for current to flow. In the laser diode LD1 shown in FIG. 6A, a part inside a broken line is a current passing part α, and a part outside the broken line is a current blocking part β.

If a laser diode LD has a current blocking part β on the light emission side, a loss may occur, resulting in a reduction in the amount of light. For this reason, the light emission surfaces (end faces) of the laser diodes LD from which light is emitted as illustrated by the arrows are configured as cleavage surfaces so as not to have current blocking parts β Therefore, on the light emission surface side of each laser diode LD (on the negative side in the y direction of FIG. 6A), there is no current blocking part β. By the way, the light emission surfaces of the laser diodes LD may be formed by etching, and in the case where a loss is small, it is unnecessary to remove some of the current blocking parts β. Also, if any of the current blocking parts β is not removed, the light emission parts have non-radiative parts. Therefore, there is an advantage that it is possible to avoid COD (Catastrophic Optical Damage) which becomes an issue when an end face emission type outputs high-intensity light.

If the current constriction layer 81b is provided, power consumption for non-radiative recombination is suppressed. Therefore, power consumption decreases, and light extraction efficiency improves. The light extraction efficiency is the amount of light which may be extracted per unit power.

In the case of forming the current blocking parts β by oxidation as will be described below, a region equidistant from the periphery of the island 301 becomes a current blocking parts β. However, in FIG. 6A, the current blocking part β is schematically illustrated as not being equidistant from the periphery of the island 301. In other words, in FIG. 6A, the width of the current blocking part β of the island 301 in the y direction is illustrated as being different from the widths of the current blocking part β in the positive x direction and the negative x direction.

By the way, the current constriction layer 81b will be described below.

The under diode UD1 provided in the island 302 is composed of the p anode layer 81, the light emitting layer 82, and the n cathode layer 83. The transfer thyristor T1 is composed of the p anode layer 85, the n gate layer 86, the p gate layer 87, and the n cathode layer 88. An n ohmic electrode 323 provided on the n cathode layer 88 (a region 313) is referred to as a cathode electrode. Also, a p ohmic electrode 332 provided on a part of the p gate layer 87 exposed by removing the n cathode layer 88 is referred to as a terminal serving as the gate Gt1 (also referred to as the gate terminal Gt1).

Similarly, the coupling diode D1 provided in the island 302 is composed of the p gate layer 87 and the n cathode layer 88. An n ohmic electrode 324 provided on the n cathode layer 88 (a region 314) is referred to as a cathode terminal. Also, the p ohmic electrode 332 provided on the part of the p gate layer 87 exposed by removing the n cathode layer 88 is referred to as an anode terminal. In other words, the coupling diode D1 has the p gate layer 87 as the anode, and has the n cathode layer 88 as the cathode. Here, the p ohmic electrode 332 which is the anode terminal of the coupling diode D1 is the same as the gate Gt1 (the gate terminal Gt1).

The power-supply-line resistor Rg1 provided in the island 303 is composed of the p gate layer 87. In other words, the power-supply-line resistor Rg1 is a part of the p gate layer 87 exposed between a p ohmic electrode 333 and a p ohmic electrode 334 provided on parts of the p gate layer 87 by removing the n cathode layer 88.

The start diode SD provided in the island 304 is composed of the p gate layer 87 and the n cathode layer 88. In other words, the start diode SD has an n ohmic electrode 325 provided on the n cathode layer 88 (a region 315) as the cathode terminal. Further, the start diode has a p ohmic electrode 335 provided on a part of the p gate layer 87 exposed by removing the n cathode layer 88, as the anode terminal. In other words, the start diode SD has the p gate layer 87 as the anode, and has the n cathode layer 88 as the cathode.

The current limiting resistor R1 provided in the island 305, and the current limiting resistor R2 provided in the island 306 are provided similarly to the power-supply-line resistor Rg1 provided in the island 303, and each of them is a part of the p gate layer 87 between two p ohmic electrodes (without reference symbols assigned).

The connection relations among the individual elements will be described with reference to FIG. 6A.

The lighting signal line 75 includes a trunk part 75a and a plurality of branch parts 75b. The trunk part 75a is provided so as to extend in the row direction of the laminates of the setting thyristors S and the laser diodes LD. A branch part 75b branches from the trunk part 75a and is connected to the n ohmic electrode 321 which the cathode terminal of the setting thyristor S1 provided in the island 301. The cathode terminals of the other setting thyristors S also are connected to the lighting signal line 75 in the same way. Further, the lighting signal line 75 is connected to the φI terminal.

The first transfer signal line 72 is connected to the n ohmic electrode 323 which is the cathode terminal of the transfer thyristor T1 provided in the island 302. The first transfer signal line 72 is connected to the cathode terminals of the other odd-numbered transfer thyristors T provided in the islands identical to the island 302. The first transfer signal line 72 is connected to the φ1 terminal through the current limiting resistor R1 provided in the island 305.

Meanwhile, the second transfer signal line 73 is connected to n ohmic electrodes (without reference symbols assigned) which are the cathode terminals of odd-numbered transfer thyristors T provided in islands without reference symbols assigned. The second transfer signal line 73 is connected to the φ2 terminal through the current limiting resistor R2 provided in the island 306.

The power supply line 71 is connected to the p ohmic electrode 334 which is one terminal of the power-supply-line resistor Rg1 provided in the island 303. One terminal of each of the other power-supply-line resistors Rg also is connected to the power supply line 71.

The power supply line 71 is connected to the Vga terminal.

Further, the p ohmic electrode 331 (the gate terminal Gs1) of the setting thyristor S1 provided in the island 301 is connected to the p ohmic electrode 332 which is the gate terminal Gt1 of the transfer thyristor T1 provided in the island 302, through a connection wire 76.

Moreover, the p ohmic electrode 332 which is the gate terminal Gt1 of the transfer thyristor T1 provided in the island 302 is connected to the p ohmic electrode 333 which is the other terminal of the power-supply-line resistor Rg1 provided in the island 303, through a connection wire 77.

The n ohmic electrode 324 which is the cathode terminal of the coupling diode D1 provided in the island 302 is connected to a p ohmic electrode (without a reference symbol assigned) which is the gate terminal Gt2 of the transfer thyristor T2 adjacent to the n ohmic electrode 324, through a connection wire 79.

The other laser diodes LD, the other setting thyristors S, the other transfer thyristors T, the other coupling diodes D, and so on are connected similarly; however, a description thereof will not be made herein.

The p ohmic electrode 332 which is the gate terminal Gt1 of the transfer thyristor T1 provided in the island 302 is connected to the n ohmic electrode 325 which is the cathode terminal of the start diode SD provided in the island 304, through a connection wire 78. The p ohmic electrode 335 which is the anode terminal of the start diode SD is connected to the second transfer signal line 73.

By the way, the connections and the configurations described above are those in the case where the p-type substrate 80 is used. In the case of using an n-type substrate, the polarities are reverse. In the case of using an intrinsic type substrate, on one side of the substrate where the driving unit 101 and the light emitting part 102 are provided, a terminal to be connected to the power supply line 200a for supplying the reference potential Vsub is provided. Also, connections and configurations are the same as those in any one of the case of using a p-type substrate and the case of using an n-type substrate.

(Laminate Structures of Laser Diodes LD and Setting Thyristors S)

Figure 7:
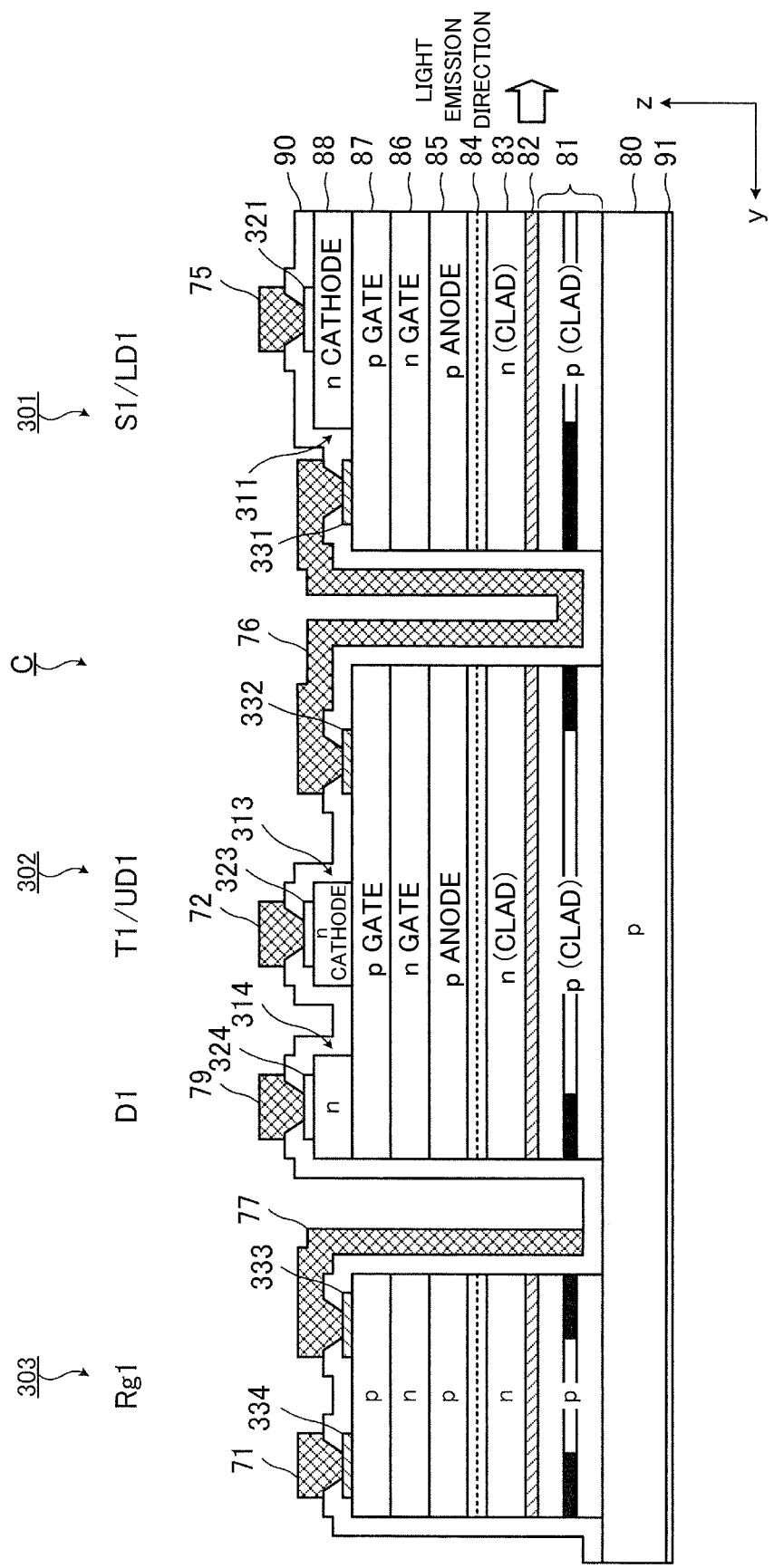
FIG. 7 is an enlarged cross-sectional view illustrating an island having a laser diode and a setting thyristor, an island having a transfer thyristor and so on, and an island having a power-supply-line resistor, in the light emitting chip according to the first embodiment.

FIG. 7 is an enlarged cross-sectional view illustrating the island 301 having the laser diode LD1 and the setting thyristor S1, the island 302 having the transfer thyristor T and so on, and the island 303 having the power-supply-line resistor Rg1, in the light emitting chip C according to the first exemplary embodiment. Also, FIG. 7 is a cross-sectional view taken along the line VIB-VIB of FIG. 6A, but is a cross-sectional view illustrating the opposite side to the side illustrated in FIG. 6B as seen from the negative x direction.

Hereinafter, the laminate structure of the laser diode LD1 and the setting thyristor S1 in the island 301 will be described in detail.

As shown in the island 301, the laser diode LD1 is composed of the p anode layer 81 serving as a clad layer, the light emitting layer 82, and the n cathode layer 83 serving as a clad layer. Therefore, the p anode layer 81 is referred to as the p anode (clad) layer 81, and the n cathode layer 83 is referred to as the n cathode (clad) layers 83, and in FIG. 7, the p anode (clad) layer 81 is denoted by p (Clad), and the n cathode (clad) layer 83 is denoted by n (Clad).

The p anode (clad) layer 81 is configured to include the current constriction layer 81b. In other words, the p anode (clad) layer 81 is composed of a lower p anode (clad) layer 81a, the current constriction layer 81b, and an upper p anode (clad) layer 81c.

The light emitting layer 82 has a quantum well structure having well layers and barrier layers alternately stacked. However, the light emitting layer 82 may be an intrinsic I layer containing no impurities. Alternatively, the light emitting layer 82 may have a structure other than the quantum well structure, and may be, for example, a quantum line (quantum wire) or a quantum box (quantum dot).

The p anode (clad) layer 81, the n cathode (clad) layer 83, and the light emitting layer 82 are set such that light which is emitted from the light emitting layer 82 is confined between the p anode (clad) layer 81 and the n cathode (clad) layer 83 and laser oscillation occurs between the side surfaces (end surfaces) of the light emitting layer 82. In this case, light is emitted from the side surface (end surface) of the light emitting layer 82, in parallel with the substrate 80, as shown by an arrow.

The tunnel junction layer 84 is composed of an $n^{++}$ layer 84a containing (doped with) a high concentration of n-type impurities (a dopant) and a $p^{++}$ layer 84b containing a high concentration of p-type impurities.

The setting thyristor S1 is composed of the p anode layer 85, the n gate layer 86, the p gate layer 87, and the n cathode layer 88. In FIG. 7, the p anode layer 85 is denoted by p Anode or p, and the n gate layer 86 is denoted by n Gate or n, and the p gate layer 87 is denoted by p Gate or p, and the n cathode layer 88 is denoted by n Cathode or n.

Meanwhile, the under diode UD1 and the transfer thyristor T1 provided in the island 302 have the same structures as those of the laser diode LD1 and the setting thyristor S1

<Tunnel Junction Layer 84>

Now, the tunnel junction layer 84 will be described.

Figure 8A:
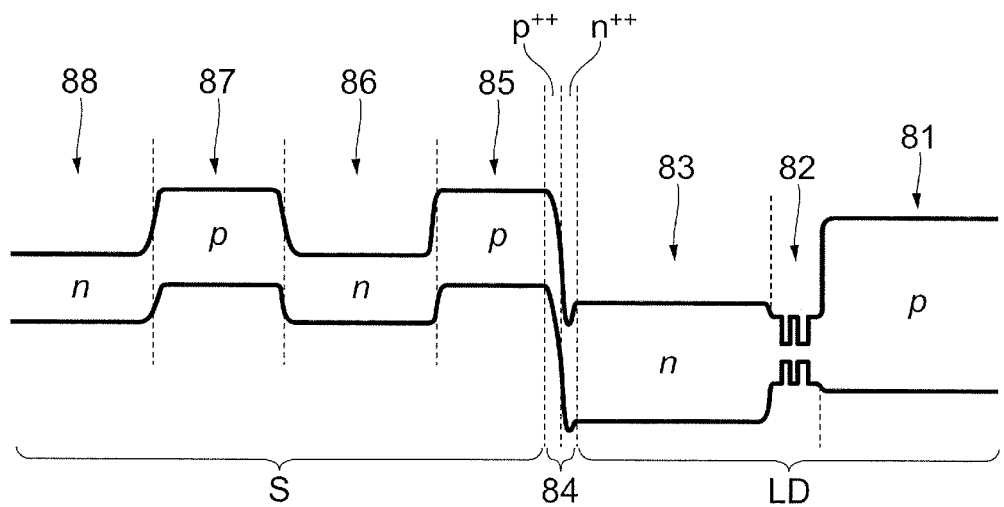
FIG. 8A is a schematic energy band diagram of the laminate structure of the laser diode and the setting thyristor.
Figure 8B:
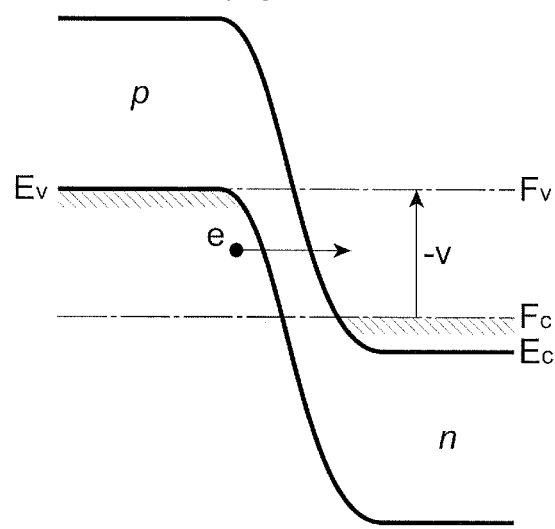
FIG. 8B is an energy band diagram in a state where a tunnel junction layer is reverse-biased.
Figure 8C:
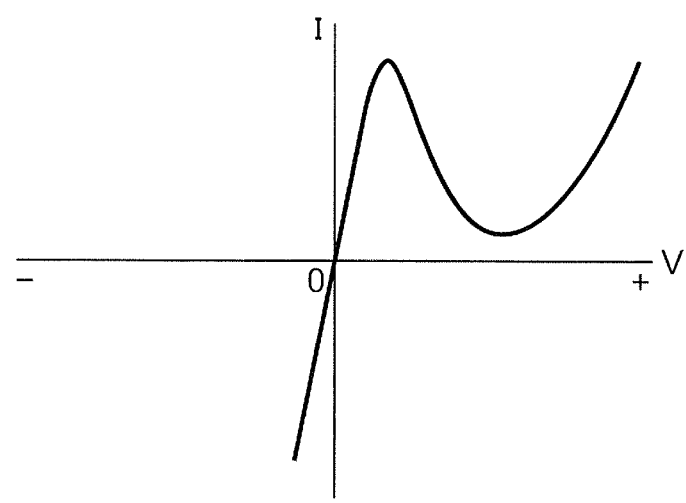
FIG. 8C illustrates the current-voltage characteristic of the tunnel junction layer.

FIGS. 8A to 8C are views for further explaining the laminate structure of the laser diode LD and the setting thyristor S. FIG. 8A is a schematic energy band diagram illustrating the laminate structure of the laser diode LD and the setting thyristor S, and FIG. 8B is an energy band diagram in a state where the tunnel junction layer 84 is reverse-biased, and FIG. 8C illustrates the current-voltage characteristic of the tunnel junction layer 84.

As shown in the energy band diagram of FIG. 8A, if voltage is applied between the n ohmic electrode 321 of FIG. 7 and the back electrode 91 such that the laser diode LD and the setting thyristor S are forward-biased, a reverse bias is applied between the $n^{++}$ layer 84a and the $p^{++}$ layer 84b constituting the tunnel junction layer 84.

The tunnel junction layer 84 is the junction of the $n^{++}$ layer 84a containing the high concentration of n-type impurities and the $p^{++}$ layer 84b containing the high concentration of p-type impurities. Therefore, the depletion region is narrow. Therefore if the tunnel junction layer is forward-biased, electrons tunnel from the conduction band of the $n^{++}$ layer (84a) side to the valance band of the $p^{++}$ layer (84b) side. On this occasion, a negative resistance characteristic appears.

Meanwhile, as shown in FIG. 8B, if the tunnel junction layer 84 (a tunnel junction) is reverse-biased (−V), the potential Ev of the valance band of the $p^{++}$ layer (84b) side becomes larger than the potential Ec of the conduction band of the $n^{++}$ layer (84a) side. Then, electrons tunnel from the valance band of the $p^{++}$ layer 84b to the conduction band of the n++ layer (84a) side. Also, as the reverse bias voltage (−V) increases, it becomes easier for electrons to tunnel. In other words, as shown in FIG. 8C, when the tunnel junction layer 84 (a tunnel junction) is reverse-biased, it is easy for current to flow therethrough.

As described above, the laser diode LD and the setting thyristor S are electrically connected in series through the tunnel junction layer 84.

Therefore, as shown in FIG. 8A, if the setting thyristor S is turned on, current flows between the laser diode LD and the setting thyristor S, even when the tunnel junction layer 84 is reverse-biased. Therefore, the laser diode LD emits light (it is lit).

As will be described below, if the transfer thyristor T connected to the setting thyristor S is turned on, the setting thyristor S gets into a state where a transition to the ON state is possible (a state where the setting thyristor may transition to the ON state). Then, when the lighting signal φI is switched to "L" as will be described below, the setting thyristor S is turned on, thereby turning on the laser diode LD (setting the laser diode to the ON state).

By the way, the relation between the under diodes UD and the transfer thyristors T is the same as the relation between the laser diodes LD and the setting thyristors S. However, light which is emitted from the under diodes UD is not used. Therefore, in the case where it is feared that light which is emitted from the under diodes UD will leak, the size of the under diodes UD may be reduced, or light of the under diodes may be blocked by the material constituting wires, and the like.

<Thyristors>

Now, a basic operation of the thyristors (the transfer thyristors T and the setting thyristors S) will be described. As described above, each of the thyristors is a semiconductor element having three terminals, i.e. an anode terminal (an anode), a cathode terminal (a cathode), and a gate terminal (a gate), and is configured by sequentially forming a p-type semiconductor layer (the p anode layer 85 or the p gate layer 87), and an n-type semiconductor layer (the n gate layer 86 or the n cathode layer 88) of, for example, GaAs, GaAlAs, AlAs, or the like, on the substrate 80. In other words, each thyristor has a p-n-p-n structure. Herein, a description will be made on the assumption that the forward potential (diffusion potential) Vd of a p-n junction which is formed of a p-type semiconductor layer and an n-type semiconductor layer is 1.5 V as an example.

Hereinafter, a description will be made on the assumption that the reference potential Vsub which is supplied to the back electrode 91 (see FIG. 5 and FIG. 6) which is the Vsub terminal is a high-level potential (hereinafter, referred to as "H") and is 0 V, and the power supply potential Vga which is supplied to the Vga terminal is a low-level potential (hereinafter, referred to as "L") and is −5 V. Also, the first transfer signal φ1 and the second transfer signal φ2 are signals having "H" (0 V) and "L" (−5 V). Moreover, the lighting signal φI is a signal having "H" (0 V) and "L" (−5 V). Hereinafter, "H" (0 V) and "L" (−5 V)" are also referred to simply as "H" and "L".

First of all, an operation of a single thyristor will be described. Here, it is assumed that the anode of the thyristor is 0 V.

When the thyristor is in the OFF state in which current does not flow between the anode and the cathode, if a potential equal to or lower than a threshold voltage (a negative voltage whose absolute value is equal to or larger than the absolute value of the threshold voltage) is applied to the cathode, the thyristor transitions to the ON state (i.e. the thyristor is turned on). Here, the threshold voltage of the thyristor is a value which is obtained by subtracting the forward potential Vd (1.5 V) of the p-n junction from the potential of the gate.

If the thyristor is turned on, the potential of the gate of the thyristor gets close to the potential of the anode terminal. Here, since the anode has 0 V, it may be considered that the potential of the gate becomes 0 V. Also, when the thyristor is in the ON state, the potential of the cathode gets close to a potential which is obtained by subtracting the forward potential Vd (1.5 V) of the p-n junction from the potential of the anode. Here, since the anode is 0 V, the potential of the cathode of the thyristor in the ON state changes to a potential close to −1.5 V (a negative potential whose absolute value is larger than 1.5 V). By the way, the potential of the cathode is set in relation to the power supply which supplies current to the thyristor which is in the ON state.

When the thyristor is in the ON state, if the potential of the cathode changes to a potential (a negative potential, 0 V, or a positive potential whose absolute value is small) higher than a potential required to maintain the ON state (the above-mentioned potential close to −1.5 V), the thyristor transitions to the OFF state (i.e. the thyristor is turned off).

Meanwhile, when the thyristor is in the ON state, if a potential equal to or lower than the potential required to maintain the ON state (i.e. a negative potential whose absolute value is equal to or larger than the absolute value of the potential required to maintain the ON state) is continuously applied to the cathode, and current capable of maintaining the ON state (maintenance current) is supplied, the thyristor maintains the ON state.

Each of the pairs of the laser diodes LD and the setting thyristors S are stacked and are connected in series. Here, an operation of a laser diode LD and a setting thyristor S connected in series will be described using the laser diode LD1 and the setting thyristor S1 included in the light emitting chip C1(C) shown in FIG. 5 and FIG. 7. To the series circuit of the laser diode LD1 and the setting thyristor S1, the reference potential Vsub ("H" (0 V)) and the potential of the lighting signal φI1 ("H" (0 V) or "L" (−5 V)) are applied. Then, the potential of the lighting signal φI1 is divided by the laser diode LD1 and the setting thyristor S1. Here, a description will be made on the assumption that voltage which is applied to the laser diode LD1 is −1.7 V. In this case, when the setting thyristor S1 is in the OFF state, −3.3 V is applied to the setting thyristor S1.

As described above, in the case where the threshold voltage of the setting thyristor S1 in the OFF state is equal to or lower than −3.3 V (i.e. the threshold voltage is a negative value whose absolute value is equal to or larger than the absolute value of −3.3 V), the setting thyristor S1 is turned on. Then, current flows in the laser diode LD1 and the setting thyristor S1 connected in series, whereby the laser diode LD1 is turned on (i.e. the laser diode emits light). Meanwhile, in the case where the threshold voltage of the setting thyristor S1 is larger than −3.3 V (i.e. the threshold voltage is a negative voltage whose absolute value is smaller than the absolute value of −3.3 V), the setting thyristor S1 maintains the OFF state without being turned on. Therefore, the laser diode LD1 also maintains the OFF state (the non-radiative state).

By the way, if the setting thyristor S1 is turned on, the absolute value of voltage which is applied to the laser diode LD1 and the setting thyristor S1 connected in series decreases. However, if the voltage which is applied to the setting thyristor S1 is a voltage enough to maintain the ON state of the setting thyristor S1, the setting thyristor S1 maintains the ON state. Therefore, the laser diode LD1 also maintains the ON state (i.e. the laser diode keeps emitting light)

The other laser diodes LD and the other setting thyristors S also operate in the same way.

According to the above-mentioned configuration, control on the laser diodes LD and the setting thyristors S for driving the laser diodes LD are performed by the lighting signal φI. Therefore, lighting control is easy.

By the way, the above-mentioned voltages are examples, and may be changed according to the characteristics of the setting thyristors S and the transfer thyristors T or/and the emission wavelength and light amount of each laser diode LD. On this occasion, "L" may be adjusted.

Since each of the thyristors (the setting thyristors S and the transfer thyristors T) is formed of a semiconductor such as GaAs, when a thyristor is in the ON state, it may emit light from between the n gate layer 86 and the p gate layer 87. By the way, the amount of light which a thyristor emits depends on the area of the cathode and current which flows between the cathode and the anode. Therefore, in the case where it is not required to use light emission of the thyristors, for example, the areas of the cathodes may be reduced, or light may be blocked by a material forming electrodes (the n ohmic electrode 321 for the setting thyristor S1 or the n ohmic electrode 323 for the transfer thyristor T1) or wires, and the like, such that unnecessary light is suppressed.

(Operations of Light Emitting Devices 65)

Now, the operations of the light emitting devices 65 will be described.

As described above, each light emitting device 65 includes the light emitting chips C1 to C40 (see FIG. 3 and FIG. 4).

Since the light emitting chips C1 to C40 are driven in parallel, it will be sufficient only to describe the operation of the light emitting chip C1.

<Timing Chart>

Figure 9:
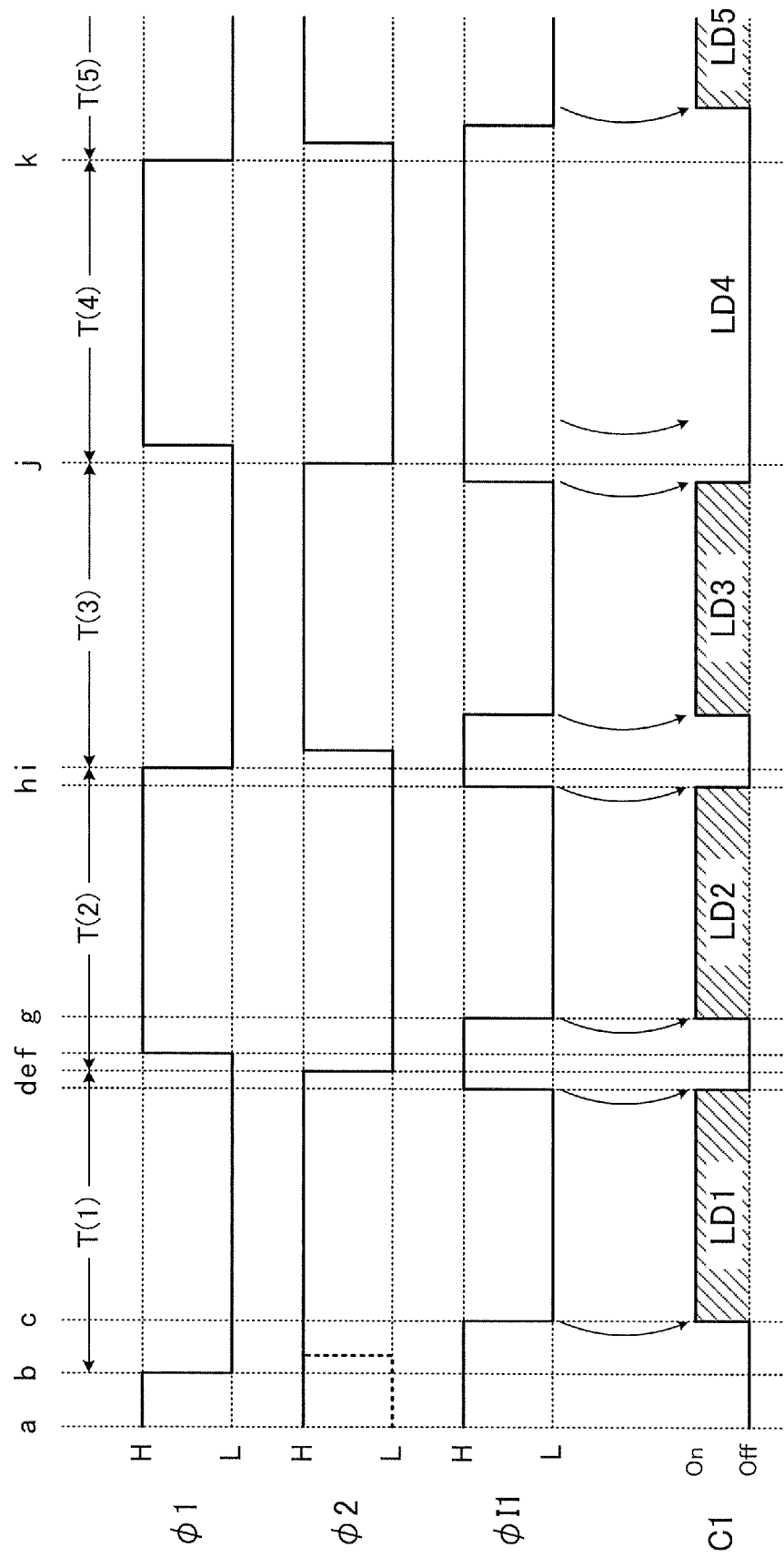
FIG. 9 is a timing chart for explaining operations of the light emitting device and the light emitting chip.

FIG. 9 is a timing chart for explaining the operations of a light emitting device 65 and a light emitting chip C.

FIG. 9 illustrates a timing chart a part of control (referred to as lighting control) which is performed to turn on or off five laser diodes LD in the light emitting chip C1, i.e. the laser diodes LD1 to LD5 such that each of the laser diodes emits light or does not emit light. In FIG. 9, the laser diodes LD1, LD2, LD3, and LD5 of the light emitting chip C1(C) is turned on, and the laser diode LD4 is turned off.

In FIG. 9, it is assumed that time passes in alphabetical order from a time point a to a time point k. ON/OFF control (lighting control) on the laser diode LD1 is performed in a period T(1), and ON/OFF control on the laser diode LD2 is performed in a period T(2), and ON/OFF control on the laser diode LD3 is performed in a period T(3), and ON/OFF control on the laser diode LD4 is performed in a period T(4). Thereafter, on the other laser diodes LD having numbers of 5 or greater, lighting control is performed in the same way.

Here, it is assumed that the periods T(1), T(2), T(3), etc. are periods having the same length, and they are referred to as the periods T unless they need to be distinguished from one another.

The first transfer signal φ1 which is transmitted to the φ1 terminal (see FIG. 5 and FIG. 6), and the second transfer signal φ2 which is transmitted to the φ2 terminal (see FIG. 5 and FIG. 6) are signals having two potentials, i.e. "H" (0 V) and "L" (−5 V). Moreover, in each of the first transfer signal φ1 and the second transfer signal φ2, a unit waveform corresponding to two consecutive periods T (for example, the period T(1) and the period T(2)) is repeated.

The first transfer signal φ1 transitions from "H" (0 V) to "L" (−5 V) at the start time point b of the period T(1), and transitions from "L" to "H" at a time point f. Then, at the end time point i of the period T(2), the first transfer signal φ1 transitions from "H" to "L".

The second transfer signal φ2 is at "H" (0 V) at the start time point b of the period T(1), and transitions from "H" (0 V) to "L" (−5 V) at a time point e. Then, at the end time point i of the period T(2), the second transfer signal φ2 transitions from "L" to "H".

When the first transfer signal φ1 and the second transfer signal φ2 are compared with each other, the second transfer signal φ2 is equivalent to a signal obtained by shifting the first transfer signal φ1 to the right side by a period T on the time axis. Meanwhile, in the second transfer signal φ2, a waveform shown by a broken line in the period T(1), and a waveform in the period T(2) are repeated in and after the period T(3). The reason why the waveform of the second transfer signal φ2 in the period T(1) is different from those in and after the period T(3) is that the period T(1) is a period in which the light emitting device 65 starts an operation.

As will be described below, the pair of transfer signals, i.e. the first transfer signal φ1 and the second transfer signal φ2 make the transfer thyristors T be sequentially turned on in numerical order in an ON-state transfer (propagation) manner. Meanwhile, when each transfer thyristor T is in the ON state, a laser diode LD having the same number as that of the corresponding transfer thyristor is designated as a target of the ON/OFF (radiative state/non-radiative state) control (the lighting control).

Now, the lighting signal φI1 which is transmitted to the φI terminal of the light emitting chip C1 will be described. To the other light emitting chips C2 to C40, the lighting signals φI2 to φI40 are transmitted, respectively. The lighting signal φI1 is a signal having two potentials, i.e. "H" (0 V) and "L" (−5 V).

Here, the lighting signal φI1 for lighting control on the laser diode LD1 of the light emitting chip C1 in the period T(1) will be described. The lighting signal φI1 is at "H" (0 V) at the start time point b of the period T(1), and transitions from "H" (0 V) to "L" (−5 V) at a time point c. Then, the lighting signal φI1 transitions from "L" to "H" at a time point d, and maintains "H" at the time point e.

The operations of the light emitting device 65 and the light emitting chip C1 will be described with reference to FIG. 4 and FIG. 5 and in accordance with the timing chart shown in FIG. 9. Hereinafter, the periods T(1) and T(2) when lighting control is performed on the laser diodes LD1 and LD2 will be described.

(1) Time Point a

<Light Emitting Device 65>

At the time point a, the reference potential supplying unit 160 of the signal generating circuit 110 of the light emitting device 65 sets the reference potential Vsub at "H" (0 V). The power supply potential supplying unit 170 sets the power supply potential Vga at "L" (−5 V). Then, the power supply line 200a on the circuit board 62 of the light emitting device 65 changes to "H" (0 V) which is the reference potential Vsub, and the Vsub terminals of the light emitting chips C1 to C40 change to "H". Similarly, the power supply line 200b changes to "L" (−5 V) which is the power supply potential Vga, and the Vga terminals of the light emitting chips C1 to C40 change to "L" (see FIG. 4). Therefore, the power supply lines 71 of the light emitting chips C1 to C40 change to "L" (see FIG. 5).

Moreover, the transfer signal generating unit 120 of the signal generating circuit 110 sets each of the first transfer signal φ1 and the second transfer signal φ2 at "H" (0 V). Then, the first transfer signal line 201 and the second transfer signal line 202 change to "H" (see FIG. 4). Therefore, the φ1 terminals and φ2 terminals of the light emitting chips C1 to C40 change to "H". The potential of the first transfer signal line 72 connected to the φ1 terminal through the current limiting resistor R1 also changes to "H", and the second transfer signal line 73 connected to the φ1 terminal through the current limiting resistor R2 also changes to "H" (see FIG. 5).

Further, the lighting-signal generating unit 140 of the signal generating circuit 110 sets each of the lighting signals φI1 to φI40 at "H" (0 V). Then, the lighting signal lines 204-1 to 204-40 change to "H" (see FIG. 4). Therefore, the φI terminals of the light emitting chips C1 to C40 change to "H" through the current limiting resistors RI, and the lighting signal lines 75 connected to the φI terminals also change to "H" (0 V) (see FIG. 5).

<Light Emitting Chip C1>

The anodes (the p anode layer 85) of the setting thyristors S are connected to the cathodes (the n cathode (clad) layer 83) of the laser diodes LD through the tunnel junction layer 84, and the anodes (the p anode (clad) layer 81) of the laser diodes LD are connected to the Vsub terminal set at "H".

The anodes (the p anode layer 85) of the transfer thyristors T are connected to the cathodes (the n cathode (clad) layer 83) of the under diodes UD through the tunnel junction layer 84, and the anodes (the p anode (clad) layer 81) of the under diodes UD are connected to the Vsub terminal set at "H".

The cathode of each of the odd-numbered transfer thyristors T1, T3, etc. is connected to the first transfer signal line 72, thereby being set at "H" (0 V). The cathode of each of the even-numbered transfer thyristors T2, T4, etc. is connected to the second transfer signal line 73, thereby being set at "H". Since both of the anode and cathode of each of the transfer thyristors T are "H", each transfer thyristor is in the OFF state. Also, since both of the anode and cathode of each of the under diodes UD are "H", each under diode is in the OFF state.

The cathode terminal of each setting thyristor S is connected to the lighting signal line 75 having "H" (0 V). Since both of the anode and cathode of each setting thyristor S are "H", each setting thyristor is in the OFF state. Also, since both of the anode and cathode of each of the laser diodes LD are "H", each laser diode is in the OFF state.

As described above, the gate Gt1 is connected to the cathode of the start diode SD. The gate Gt1 is connected to the power supply line 71 having the power supply potential Vga ("L" (−5 V)) through the power-supply-line resistor Rg1. Moreover, the anode terminal of the start diode SD is connected to the second transfer signal line 73, and is connected to the φ2 terminal having "H" (0 V) through the current limiting resistor R2. Therefore, the start diode SD is forward-biased, and the cathode (the gate Gt1) of the start diode SD changes to a value (−1.5 V) which is obtained by subtracting the forward potential Vd (1.5 V) of the p-n junction from the potential ("H" (0 V)) of the anode of the start diode SD. Also, if the gate Gt1 changes to −1.5 V, the coupling diode D1 is forward-biased since the anode (the gate Gt1) is −1.5 V and the cathode is connected to the power supply line 71 ("L" (−5 V)) through the power-supply-line resistor Rg1. Therefore, the potential of the gate Gt2 changes to −3 V which is obtained by subtracting the forward potential Vd (1.5 V) of the p-n junction from the potential (−1.5 V) of the gate Gt1. In addition, the coupling diode D2 is forward-biased since the anode (the gate Gt1) is −3 V and the cathode is connected to the power supply line 71 ("L" (−5 V)) through the power-supply-line resistor Rg2. Therefore, the potential of the gate Gt3 changes to −4.5 V which is obtained by subtracting the forward potential Vd (1.5 V) of the p-n junction from the potential (−3 V) of the gate Gt2. However, the gates Gt having numbers of 4 or greater are not influenced by the anode of the start diode SD having "H" (0 V). Therefore, these gates Gt have the potential "L" (−5 V) which is the potential of the power supply line 71.

Also, since the gates Gt are the gates Gs, the potentials of the gates Gs are equal to the potentials of the gates Gt. Therefore, the threshold voltage of each of the transfer thyristors T and the setting thyristors S is equal to a value which is obtained by subtracting the forward potential Vd (1.5 V) of the p-n junction from the potential of a corresponding gate Gt (gate Gs). In other words, the threshold voltages of the transfer thyristor T1 and the setting thyristor S1 are −3 V, and the threshold voltages of the transfer thyristor T2 and the setting thyristor S2 are −4.5 V, and the threshold voltages of the transfer thyristor T3 and the setting thyristor S3 are −6 V, and the threshold voltages of the transfer thyristors and the setting thyristors having numbers of 4 or greater are −6.5 V.

(2) Time Point b

At the time point b shown in FIG. 9, the first transfer signal φ1 transitions from "H" (0 V) to "L" (−5 V). Therefore, the light emitting device 65 starts to operate.

If the first transfer signal φ1 transitions from "H" to "L", and is transmitted through the φ1 terminal and the current limiting resistor R1, the potential of the first transfer signal line 72 transitions from "H" (0 V) to "L" (−5 V). Then, since the voltage of −5 V is being applied to the transfer thyristor T1, the transfer thyristor T1 having the threshold voltage of −3 V is turned on. On this occasion, current flows into the under diode UD1, which transitions from the OFF state to the ON state. Since the transfer thyristor T1 is turned on, the potential of the first transfer signal line 72 changes to a potential close to −3.2 V which is obtained by subtracting the forward potential Vd (1.5 V) of the p-n junction from the potential of the cathode of the transfer thyristor T1 (−1.7 V which is the potential applied to the under diode UD1) (i.e. to a negative potential whose absolute value is larger than 3.2 V). Here, it is assumed that the potential of the first transfer signal line 72 changes to −3.2 V.

By the way, the threshold voltage of the transfer thyristor T3 is −6 V, and the threshold voltages of the odd-numbered transfer thyristors T having numbers of 5 or greater are −6.5 V. Since the voltage which is applied to the transfer thyristor T3 and the odd-numbered transfer thyristors T having numbers of 5 or greater is −5 V, the transfer thyristor T3 and the odd-numbered transfer thyristors T having numbers of 5 or greater are not turned on.

Meanwhile, the even-numbered transfer thyristors T may not be turned on, since the second transfer signal φ2 is at "H" (0 V), and the second transfer signal line 73 is at "H" (0 V).

If the transfer thyristor T1 is turned on, the potential of the gate Gt1 (the gate Gs1) changes from "H" (0 V) which is the potential of the anode of the transfer thyristor T1 to −1.7 V which is the potential applied to the under diode UD1. Moreover, the potential of the gate Gt2 (the gate Gs2) changes to −3.2V, and the potential of the gate Gt3 (the gate Gs3) changes to −4.7 V, and the potentials of the gates Gt (the gates Gs) having numbers of 4 or greater change to "L".

Therefore, the threshold voltage of the setting thyristor S1 changes to −3.2 V, and the threshold voltages of the transfer thyristor T2 and the setting thyristor S2 change to −4.7 V, and the threshold voltages of the transfer thyristor T3 and the setting thyristor S3 change to −6.2 V, and the threshold voltages of the transfer thyristors T and the setting thyristors S having numbers of 4 or greater change to −6.5 V.

However, the first transfer signal line 72 changes to −3.2 V due to the transfer thyristor T1 which is the ON state. In other words, since the voltage which is applied to the transfer thyristors T which are in the OFF state is −3.2 V, the odd-numbered transfer thyristors T which are in the OFF state are not turned on. Since the second transfer signal line 73 is at "H" (0 V), the even-numbered transfer thyristors T are not turned on. Since the lighting signal line 75 is at "H" (0 V), none of the laser diodes LD is not turned on.

Immediately after the time point b (i.e. after the time point b when the thyristors and so on change due to the changes in the potentials of the signals, when they get into a steady state), the transfer thyristor T1 and the under diode UD1 are in the ON state, and the other transfer thyristors T, the other under diodes UD, and the setting thyristors S, and the laser diodes LD are in the OFF state.

(3) Time Point c

At the time point c, the lighting signal φI1 transitions from "H" (0 V) to "L" (−5 V).

If the lighting signal φI1 transitions from "H" to "L", and is transmitted through the current limiting resistor RI and the φI terminal, the lighting signal line 75 transitions from "H" (0 V) to "L" (−5 V). Then, −5 V is applied to the setting thyristor S1. Therefore, the setting thyristor S1 having the threshold voltage of −1.5 is turned on, and the laser diode LD1 is turned on (i.e. it emits light). Therefore, the potential of the lighting signal line 75 changes to a potential close to −3.2 V. Here, it is assumed that the potential of the lighting signal line 75 changes to −3.2 V. By the way, since the setting thyristor S2 has the threshold voltage of −4.7 V, and the voltage which is applied to the setting thyristor S2 changes to −3.2 V, the setting thyristor S2 is not turned on.

Immediately after the time point c, the transfer thyristor T1, the under diode UD1, and the setting thyristor S1 are in the ON state, and the laser diode LD1 is in the ON state (it emits light).

(4) Time Point d

At the time point d, the lighting signal φI1 transitions from "L" (−5 V) to "H" (0 V).

If the lighting signal φI1 transitions from "L" to "H", and is transmitted through the current limiting resistor RI and the φI terminal, the potential of the lighting signal line 75 transitions from −3.2 V to "H". Then, both of the cathode of the setting thyristor S1 and the anode of the laser diode LD1 change to "H". Therefore, the setting thyristor S1 is turned on, and the laser diode LD1 is turned off (i.e. it transitions to the OFF state (the non-radiative state)). A period when the laser diode LD1 is on (i.e. it emits light) is a period from the time point c when the lighting signal φI1 transitions from "H" to "L" to the time point d when the lighting signal φI1 transitions from "L" to "H", i.e. a period when the lighting signal φI1 is at "L".

Immediately after the time point d, the transfer thyristor T1 is in the ON state.

(5) Time Point e

At the time point e, the second transfer signal φ2 transitions from "H" (0 V) to "L" (−5 V). Here, the period T(1) when lighting control is performed on the laser diode LD1 ends, and the period T(2) when lighting control is performed on the laser diode LD2 starts.

If the second transfer signal φ2 transitions from "H" to "L", and is transmitted through the φ2 terminal, the potential of the second transfer signal line 73 transitions from "H" to "L". As described above, since the transfer thyristor T2 has the threshold voltage of −4.7 V, it is turned on. On this occasion, current also flows into the under diode UD2, whereby the under diode UD2 transitions from the OFF state to the ON state.

Therefore, the potential of the gate Gt2 (the gate Gs2) changes from "H" (0 V) to −1.7 V which is the potential applied to the under diode UD2, and the potential of the gate Gt3 (the gate Gs3) changes to −3.2 V, and the potential of the gate Gt4 (the gate Gs4) changes to −4.7 V. Meanwhile, the gates Gt (the gates Gs) having numbers of 5 or greater change to −5 V.

Immediately after the time point e, the transfer thyristors T1 and T2 and the under diodes UD1 and UD2 are in the ON state.

(6) Time Point f

At the time point f, the first transfer signal φ1 transitions from "L" (−5 V) to "H" (0 V).

If the first transfer signal φ1 transitions from "L" to "H", and is transmitted through the φ1 terminal, the potential of the first transfer signal line 72 transitions from "L" to "H". Then, both of the anode and cathode of the transfer thyristor T1 which is in the ON state change to "H", i.e. the transfer thyristor T1 is turned off. On this occasion, both of the anode and cathode of the under diode UD1 also change to "H", i.e. the under diode UD1 transitions from the ON state to the OFF state.

Then, the potential of the gate Gt1 (the gate Gs1) gets close to the power supply potential Vga ("L" (−5 V)) of the power supply line 71 through the power-supply-line resistor Rg1. Therefore, a potential is applied to the coupling diode D1 in such a direction that current does not flow therein (i.e. the coupling diode D1 is reverse-biased). Therefore, the potential of the gate Gt2 (the gate Gs2) which is −1.7 V does not influence the gate Gt1 (the gate Gs1). In other words, since the threshold voltage of a transfer thyristor T having a gate Gt connected by a reverse-biased coupling diode D is −6.5 V, even if the first transfer signal φ1 or the second transfer signal φ2 changes to "L" (−5 V), the corresponding transfer thyristor is not turned on.

Immediately after the time point f, the transfer thyristor T2 and the under diode UD2 are in the ON state.

(7) Others

If the lighting signal φI1 transitions from "H" (0 V) to "L" (−5 V) at a time point g, similarly to the laser diode LD1 and the setting thyristor S1 at the time point c, the setting thyristor S2 is turned on, and the laser diode LD2 is turned on (i.e. it emits light).

Then, if the lighting signal φI1 transitions from "L" (−5 V) to "H" (0 V) at a time point h, similarly to the laser diode LD1 and the setting thyristor S1 at the time point d, the setting thyristor S2 is turned off, and the laser diode LD2 is turned off. Further, if the first transfer signal φ1 transitions from "H" (0 V) to "L" (−5 V) at a time point i, similarly to the transfer thyristor T1 at the time point b, or the transfer thyristor T2 at the time point e, the transfer thyristor T3 having the threshold voltage of −3 V is turned on. At the time point i, the period T(2) when lighting control is performed on the laser diode LD2 ends, and the period T(3) when lighting control is performed on the laser diode LD3 starts.

Then, the above-described operations are repeated.

Meanwhile, in order to maintain the laser diodes LD in the OFF state (the non-radiative state) without turning on (lighting) the laser diodes LD, it is needed only to maintain the lighting signals φI at the "H" (0 V), like the lighting signal φI1 in a period from a time point j to the time point k which is a part of the period T(4) of FIG. 9 when lighting control is performed on the laser diode LD4. On this occasion, even when the threshold voltage of the setting thyristor S4 is −3.2 V, the setting thyristor S4 is not turned on. Therefore, the laser diode LD4 is maintained in the OFF state (the non-radiative state).

As described above, the gates Gt of the transfer thyristors T are connected to one another by the coupling diodes D. Therefore, if the potential of a gate Gt changes, the potentials of gates Gt connected thereto through forward-biased coupling diodes D change. Therefore, the threshold voltages of transfer thyristors T having the gates having the changed potentials change. When a transfer thyristor T has a threshold voltage higher than −1.5 V (i.e. a negative voltage whose absolute value is smaller than the absolute value of −1.5 V), at a timing when the first transfer signal φ1 or the second transfer signal φ2 transitions from "H" (0 V) to "L" (−5 V), the transfer thyristor is turned on.

Then, since the threshold voltage of a setting thyristor S having a gate Gs connected to the gate Gt of the transfer thyristor T which is in the ON state is −1.5 V, if the lighting signal φI transitions from "H" (0 V) to "L" (−5 V), the setting thyristor S is turned on. Therefore, a laser diode LD connected in series with the setting thyristor S is turned on (i.e. the laser diode LD emits light).

In other words, when a transfer thyristor T is turned on, a laser diode LD is designated as a target of lighting control. Then, the lighting signal φI at "L" (−5 V) turns on a setting thyristor S connected in series with the laser diode LD which is the target of lighting control, thereby turning on the laser diode LD.

By the way, the lighting signal φI at "H" (0 V) maintains the setting thyristor S in the OFF state, thereby maintaining the laser diode LD in the OFF state. In other words, the lighting signal φI sets the ON/OFF state of the laser diode LD.

As described above, a lighting signal φI is set according to image data, whereby the ON/OFF state of each of the laser diodes LD is controlled.

(Sequence of Connecting Laser Diodes LD and Setting Thyristors S in Series)

Now, a sequence of connecting the laser diodes LD and setting thyristors S in series will be described.

As described with reference to FIG. 5 and FIG. 6, in each light emitting chip C according to the first exemplary embodiment, the laser diodes LD are provided on the side to which the reference potential Vsub is supplied, and the setting thyristors S are provided on the side to which the lighting signal φI is supplied (applied) (i.e. on the side to which the lighting signal line 75 is connected). In other words, as described with reference to FIG. 6, on the p-type substrate 80, the p anode (clad) layer 81, the light emitting layer 82, and the n cathode (clad) layer 83 to constitute the laser diodes LD are stacked. Then, the tunnel junction layer 84 is stacked thereon, and the p anode layer 85, the n gate layer 86, the p gate layer 87, and the n cathode layer 88 to constitute the setting thyristors S are stacked thereon. As shown in FIG. 5, the reference potential Vsub is supplied from the back electrode 91 of the substrate 80, and the lighting signal φI (in the light emitting chip C1, the lighting signal φI1) which transitions between "H" (0 V) and "L" (−5 V) is applied to the n ohmic electrodes 321 provided on the n cathode layer 88.

Figure 10:
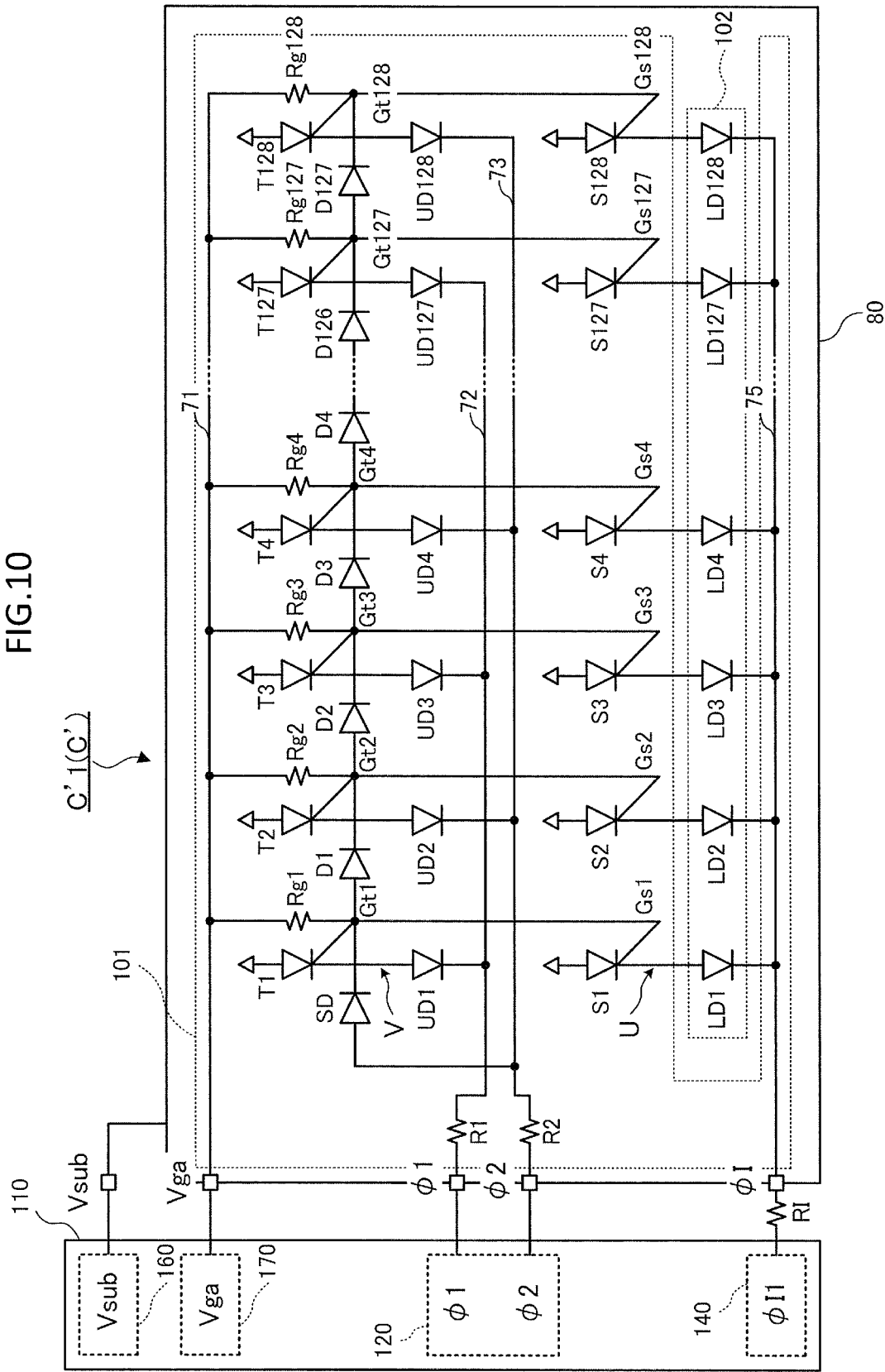
FIG. 10 is an equivalent circuit diagram illustrating the circuit configuration of a light emitting chip C' which is for comparison and may be mounted on a self-scanning type light emitting element array (SLED)

FIG. 10 is an equivalent circuit diagram illustrating the circuit configuration of a light emitting chip C' which is for comparison and may be mounted on a self-scanning type light emitting element array (SLED). Here, the light emitting chip C' is referred to as the light emitting chip C1'(C') so as to contrast with FIG. 5. In this light emitting chip C', on the side to which the reference potential Vsub is supplied, setting thyristors S are provided, and on the side to which the lighting signal φI is supplied (applied) (i.e. on the side to which the lighting signal line 75 is connected), laser diodes LD are provided. Further, on the side to which the reference potential Vsub is supplied, transfer thyristors T are provided, and on the side to which the lighting signal φI is supplied (i.e. on the side to which the lighting signal line 75 is connected), under diodes UD are provided. In short, in the light emitting chip C', the connection relations set between the reference potential Vsub and the lighting signal φI are reverse to those in the light emitting chip C.

Although not shown in FIG. 10, in the light emitting chip C', on a substrate 80, a p anode layer 85, an n gate layer 86, a p gate layer 87, and an n cathode layer 88 to constitute the setting thyristors S and the transfer thyristors T are stacked like those in the light emitting chip C shown in FIG. 6. Then, on regions 311, 313, and 314 configured in then cathode layer 88, a p anode (clad) layer 81, a light emitting layer 82, and an n cathode (clad) layer 83 to constitute the laser diodes LD and the under diodes UD are stacked with a tunnel junction layer interposed therebetween.

By the way, in the light emitting chip C', the under diodes UD are provided on the transfer thyristors T. However, considering the relation with the light emitting chip C, the term "under diodes UD" is used.

An operation of the light emitting chip C' will be described with reference to FIG. 10 and in accordance with the timing chart of FIG. 9.

In the timing chart shown in FIG. 9, before the time point c when the lighting signal φI1 transitions from "H" (0 V) to "L" (−5 V), the lighting signal φI1 is at "H" (0 V). In other words, both of a terminal of the setting thyristor S1 and a terminal of the laser diode LD1 connected in series are at "H" (0 V). In other words, the anode of the setting thyristor S1 is at the reference potential Vsub of the back electrode 91 of the substrate 80 ("H" (0 V)), and the cathode of the laser diode LD1 connected to the lighting signal line 75 is at the "H" (0 V) of the lighting signal φI1. Therefore, the connection point U' between the setting thyristor S1 and the laser diode LD1 is at "H" (0 V). The same is true of the serial connections between the other setting thyristors S and the other laser diodes LD.

If the lighting signal φI1 transitions from "H" (0 V) to "L" (−5 V) at the time point c, the lighting signal line 75 changes from "H" (0 V) to "L" (−5 V). This voltage has an absolute value larger than that of the forward potential (diffusion potential) (which is assumed as 1.5 V) of the laser diodes LD. Therefore, all the laser diodes LD are forward-biased, thereby being turned on. In other words, they emit light. This light emission stops if the voltage between the connection point U' and the lighting signal line 75 changes to the forward potential (diffusion potential) of the laser diodes LD (here, 1.5 V) when the setting thyristors S are in the OFF state. In this case, the potential of the connection point U' changes to −3.5 V (i.e. the connection point is charged).

By the way, if the setting thyristor S1 is turned on at the time point c as described above, the laser diode LD1 gets into the ON state, i.e. it starts to emit light, and the other laser diodes LD emit light at the same time for a short time (momentarily). The other laser diodes LD keep emitting light at the same time until the voltage between the lighting signal line 75 and the connection points between the other setting thyristors S and the other laser diodes LD (connection points similar to the connection point U' between the setting thyristor S1 and the laser diode LD1) change to the forward potentials (diffusion potentials) of the laser diodes LD.

Moreover, the potential of the connection point U' (−3.5 V) is maintained even if the lighting signal φI1 transitions from "L" (−5 V) to "H" (0 V). The reason is that since the laser diodes LD have the rectifying characteristic, if the lighting signal line 75 transitions to "H" (0 V), each laser diode LD is reverse-biased in which the anode is at −3.5 V and the cathode is at "H" (0 V). Therefore, the cathodes of the setting thyristors S are maintained at −3.5 V.

Here, if a transfer thyristor T transitions from the OFF state to the ON state, i.e. the gate Gt transitions to 0 V, the threshold voltage of a corresponding setting thyristor S changes to −1.5 V. Therefore, even through the lighting signal φI1 is "H" (0 V), the setting thyristor S transitions from the OFF state to the ON state. By the way, the same is true of the case where the threshold voltage of the setting thyristor S is equal to or lower than −3.5 V. In this case, since current flows in the setting thyristor S, the setting thyristor S emits light. If this state occurs, the potential of the connection point U' quickly returns to "H" (0 V).

The simultaneous light emission of the other laser diodes LD for a short time as described above, and light emission of the other laser diodes irrelevant to the level of the lighting signal φI ("H" (0 V)/"L" (−5 V)) are undesirable operations, and deteriorate the quality of an image required to be formed in the image forming apparatus. Herein, undesirable operations of the light emitting chips C, the print heads, and the image forming apparatus 1 are referred to as malfunctions (erroneous operations).

Meanwhile, in the light emitting chip C of the first exemplary embodiment shown in FIG. 5, the lighting signal line 75 is connected to the cathodes of the setting thyristors S. Even in this case, before the time point c, the connection point U between the setting thyristor S1 and the laser diode LD1 is at "H" (0 V). In the case where the lighting signal transitions from "H" (0 V) to "L" (−5 V), whereby the lighting signal line 75 transitions from "H" (0 V) to "L" (−5 V), if a setting thyristor S is in the OFF state, "L" (−5 V) on the lighting signal line 75 is applied to the setting thyristor S which is in the OFF state, so it is not applied to the laser diode LD. In other words, unlike in the light emitting chip C', the other laser diodes LD do not emit light at the same time for a short time (momentarily).

As described above, in the light emitting chip C according to the first exemplary embodiment, if the lighting signal line 75 transitions from "H" (0 V) to "L" (−5 V), "L" (−5 V) on the lighting signal line 75 is applied to the setting thyristors S. Therefore, the setting thyristors S may immediately start a transition from the OFF state to the ON state. In other words, it is easy to drive the light emitting chip C at high speed. The same is true of the transfer thyristors T.

In contrast with this, in the light emitting chip C' shown in FIG. 10, when the lighting signal φI transitions from "H" (0 V) to "L" at the time point c, the "L" potential is first applied to the laser diodes LD. Then, the applied potential is divided by the setting thyristors S and the laser diode LDs. Therefore, a time lag occurs when the setting thyristors S transition from the OFF state to the ON state. For this reason, it is difficult to drive the light emitting chip C' at high speed. The same is true of the transfer thyristors T.

Figure 16A:
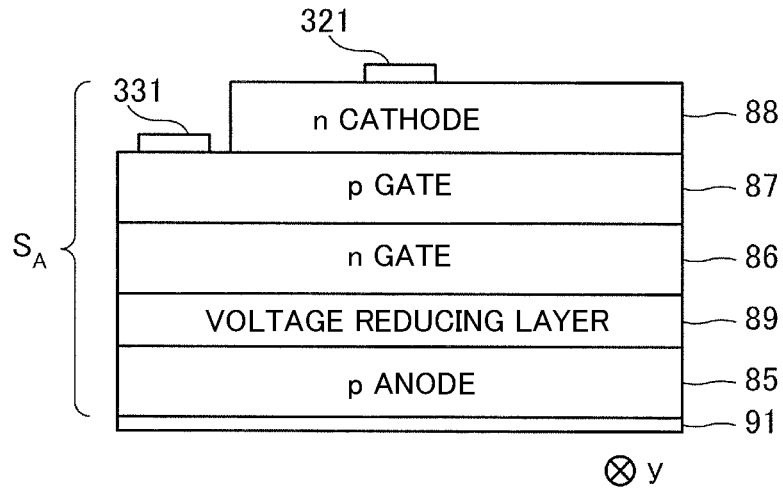
FIG. 16A is a cross-sectional view of a thyristor having a voltage reducing layer.

Also, although the "L" potential of the lighting signal φI has been described as being −5 V, in a light emitting chip C according to a fourth exemplary embodiment to be described below, the "L" potential is determined by voltage necessary to turn on setting thyristors S and voltage necessary to turn on (light) laser diodes LD. In other words, in a state where a setting thyristor S is in the ON state, the voltage between the anode and the cathode decreases. Particularly, in the case where a voltage reducing layer 89 (to be described below) is introduced between the n gate layer 86 and the p anode layer 85 as shown in FIG. 16A, a threshold voltage necessary to be turned on is −1.5 V between then cathode layer 88 and the p gate layer 87; whereas the voltage between the anode and cathode of the setting thyristor S in the ON state is 0.8 V. When it is assumed that voltage which is applied to the laser diode LD in the above-mentioned case is 1.7 V, in this case, as the voltage on the lighting signal line 75, 2.5 V is sufficient.

In other words, if the potential of the gate Gt of the transfer thyristor T which is in the ON state changes to 0 V, the threshold voltage of the setting thyristor S changes to −1.5 V. Before the time point c, the potential of the gate Gs of the transfer thyristor T is 0 V. Therefore, if a voltage equal to or lower than the threshold voltage of the setting thyristor S, i.e. −1.5 V (a negative voltage whose absolute value is equal to or larger than the absolute value of −1.5 V) is applied, the setting thyristor S is turned on. Immediately after that, the voltage between the anode and cathode of the setting thyristor S changes to −0.8 V, and this voltage difference, i.e. −0.7 V is applied to the laser diode LD, and if the lighting signal line 75 changes to −2.5 V, the voltage to be applied to the laser diode LD changes to −1.7 V, and current starts to flow.

In other words, if the "L" of the lighting signal φI is equal to or larger than −2.5 V (a negative voltage whose absolute value is equal to or larger than the absolute value of −2.5 V), the setting thyristor S is turned on, and the ON state (light emission) of the laser diode LD is maintained.

The same is true of the transfer thyristors T. If the first transfer signal φ1 or the second transfer signal φ2 transitions to "L", first, each transfer thyristor T is turned on, and the difference between the threshold voltage and the voltage between the anode and the cathode is applied to a corresponding under diode UD. Therefore, the lowest voltage necessary for the first transfer signal φ1 and the second transfer signal φ2 is the sum of the voltage between the anode and the cathode and the voltage for making current flow in the under diode UD.

In contrast with this, in the light emitting chip C' shown in FIG. 10, the lighting signal φI should be the sum of the forward voltage of the laser diodes LD (here, 1.7 V) and the voltage for turning on the setting thyristors S (−1.5 V). The same is true of the transfer thyristors T, and the lowest voltage necessary for the first transfer signal φ1 or the second transfer signal φ2 is the sum of the threshold voltage for turning on the transfer thyristors T and the voltage for making current flow in the under diodes UD. For this reason, in the light emitting chip C' shown in FIG. 10, a signal generating circuit 110 for generating high voltage is required. Therefore, power consumption increases, and high-speed driving becomes difficult.

Figure 29:
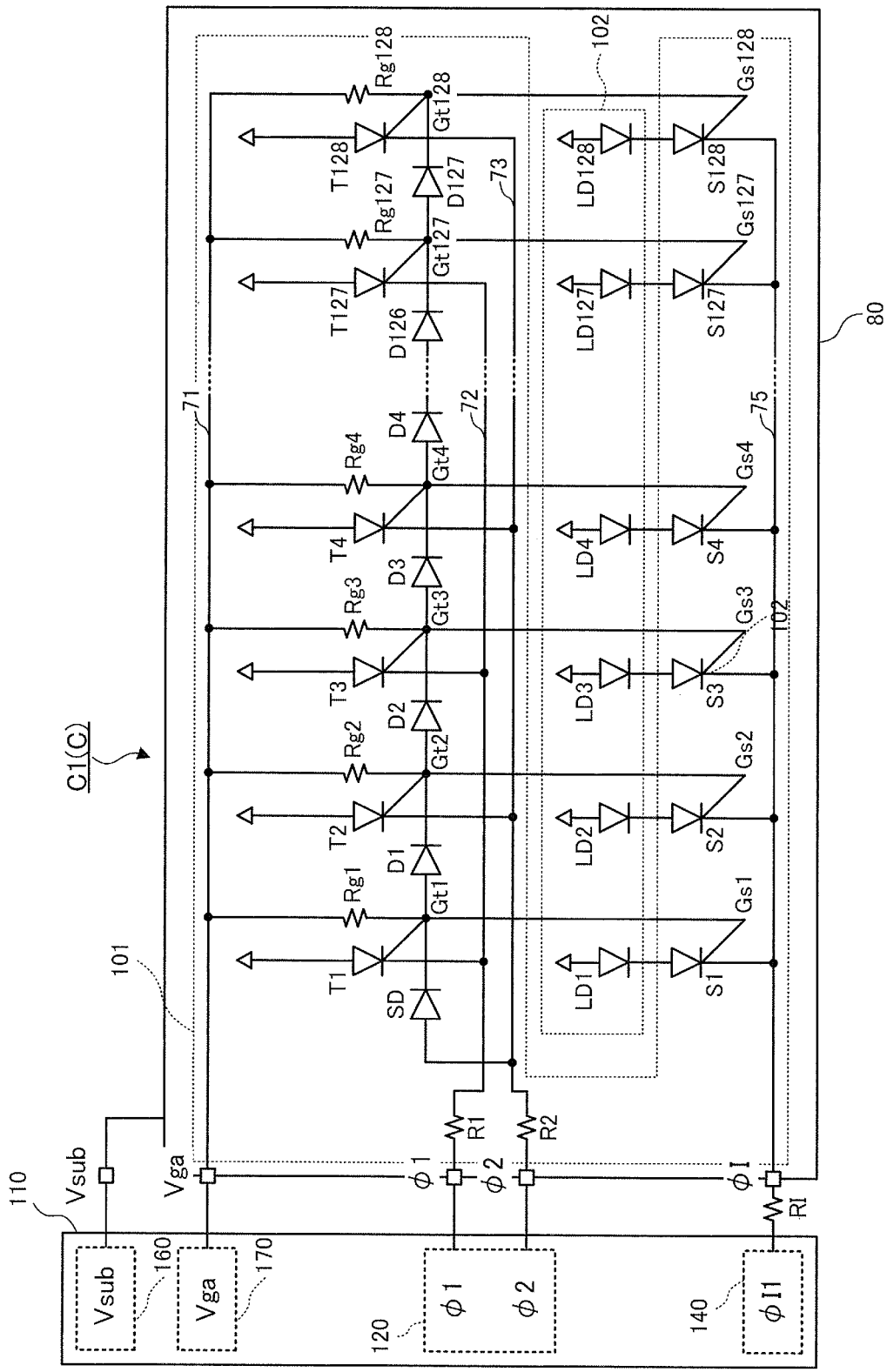
FIG. 29 is an equivalent circuit diagram for explaining the circuit configuration of a light emitting chip equipped with a self-scanning type light emitting element array (SLED) according to a fourth embodiment.

For the above-described reason, like in the light emitting chips C shown in FIG. 5 and FIG. 29, on the side to which the reference potential Vsub is supplied, the laser diodes LD are provided, and on the side to which the lighting signal φI is supplied (i.e. on the side to which the lighting signal line 75 is connected), the setting thyristors S are provided. Therefore, a malfunction (an erroneous operation) in which laser diodes LD other than laser diodes LD which are turned on (laser diodes which are lit) emit light for a short time is suppressed, and the voltages of the lighting signals φI which are applied to the serial connections between the laser diodes LD and the setting thyristors S may decrease, and power consumption may decrease.

(Influence of Under Diodes UD on Operations of Transfer Thyristors T)

Now, the influence of the under diodes UD on the operations of the transfer thyristors T will be described.

In the light emitting chip C of the first exemplary embodiment shown in FIG. 5 and FIG. 6, the under diodes UD are provided on the side to which the reference potential Vsub is supplied, and the transfer thyristors T are provided on the side to which the first transfer signal φ1 or the second transfer signal φ2 is applied (the side to which the first transfer signal line 72 or the second transfer signal line 73 is connected).

Meanwhile, in the light emitting chip C' for comparison shown in FIG. 10, the transfer thyristors T are provided on the side to which the reference potential Vsub is supplied, and the under diodes UD are provided on the side to which the first transfer signal φ1 or the second transfer signal φ2 is applied (the side to which the first transfer signal line 72 or the second transfer signal line 73 is connected).

The operation of the light emitting chip C' will be described with reference to FIG. 10 and in accordance with the timing chart of FIG. 9.

In the timing chart shown in FIG. 9, at the time point b, the first transfer signal φ1 transitions from "H" (0 V) to "L" (−5 V), whereby the first transfer signal line 72 transitions from "H" (0 V) to "L" (−5 V). As a result, similarly to the above-described laser diodes LD, the odd-numbered under diodes UD are forward-biased, i.e. current flows therein. Then, in the connection points between the under diodes UD and the transfer thyristors T (the connection points like the connection point V between the under diode UD1 and the transfer thyristor T1), charge is accumulated.

Next, at the time point e, the second transfer signal φ2 transitions from "L" (−5 V) to "H" (0 V), whereby the second transfer signal line 73 transitions from "L" (−5 V) to "H" (0 V). As a result, the transfer thyristor T2 is turned on. Then, the gate Gt2 transitions to 0 V, and the gate Gt3 changes to −1.5 V. As a result, the threshold voltage of the transfer thyristor T3 changes to −3 V. On this occasion, if the connection point between the transfer thyristor T3 and the under diode UD3 (the connection point like the connection point V between the under diode UD1 and the transfer thyristor T1) is charged with a voltage equal to or lower than −3 V (a negative voltage whose absolute value is equal to or larger than the absolute value of −3 V), the transfer thyristor T3 is turned on.

If the transfer thyristor T3 is turned on, like when the transfer thyristor T2 was turned on, the transfer thyristor T4 is turned on. In this way, all the transfer thyristors T are turned on, and a malfunction that ON-state transfer (propagation) by the transfer thyristors T is not performed occurs.

Thereafter, at the time point f, the first transfer signal φ1 transitions from "L" (−5 V) to "H" (0 V), whereby the first transfer signal line 72 transitions from "L" (−5 V) to "H" (0 V). Therefore, the charge accumulated in the connection points between the odd-numbered under diodes UD and the odd-numbered transfer thyristors T (the connection points like the connection point V' between the under diode UD1 and the transfer thyristor T1) are maintained without being discharged, since the under diodes UD are reverse-biased.

Meanwhile, in the light emitting chip C of the first exemplary embodiment shown in FIG. 5, the first transfer signal line 72 or the second transfer signal line 73 is connected to the cathode of each of the transfer thyristors T, and the anodes of the transfer thyristors T are connected to the reference potential Vsub ("H" (0 V)) through the back electrode 91 of the substrate 80.

At the time point b, the first transfer signal φ1 transitions from "H" (0 V) to "L" (−5 V), whereby the first transfer signal line 72 transitions from "H" (0 V) to "L" (−5 V). As a result, the transfer thyristor T1 is turned on, and current flows in the transfer thyristor T1 and the under diode UD1. At this time, the other odd-numbered under diodes UD are connected to the first transfer signal line 72 through the transfer thyristors T which are in the OFF state. Therefore, in the connection points between the under diodes UD and the transfer thyristors T (the connection points similar to the connection point V between the under diode UD1 and the transfer thyristor T1), charge is not accumulated.

Thereafter, at the time point e, the second transfer signal φ2 transitions from "L" (−5 V) to "H" (0 V), whereby the second transfer signal line 73 transitions from "L" (−5 V) to "H" (0 V). As a result, the transfer thyristor T2 is turned on. Then, the gate Gt2 transitions to 0 V, and the gate Gt3 changes to −1.5 V. As a result, the threshold voltage of the transfer thyristor T3 changes to −3 V. However, since charge has not been accumulated in the connection point between the under diode UD3 and the transfer thyristor T3 (the connection point similar to the connection point V between the under diode UD1 and the transfer thyristor T1), the voltage between the anode and cathode of the transfer thyristor T3 does not become equal to or lower than −3 V (a negative voltage whose absolute value is equal to or larger than the absolute value of −3 V). Therefore, the transfer thyristor T3 is not turned on.

For the above-described reason, like in the light emitting chip C shown in FIG. 5, the under diodes UD are provided on the side to which the reference potential Vsub is supplied, and the transfer thyristors T are provided on the side to which the first transfer signal φ1 or the second transfer signal φ2 is supplied (the side to which the first transfer signal line 72 or the second transfer signal line 73 is connected). Therefore, a malfunction that ON-state transfer (propagation) by the transfer thyristors T is not performed is restrained from occurring.

(Method of Manufacturing Light Emitting Chips C)

A method of manufacturing the light emitting chips C according to the first exemplary embodiment will be described.

Figure 11A:
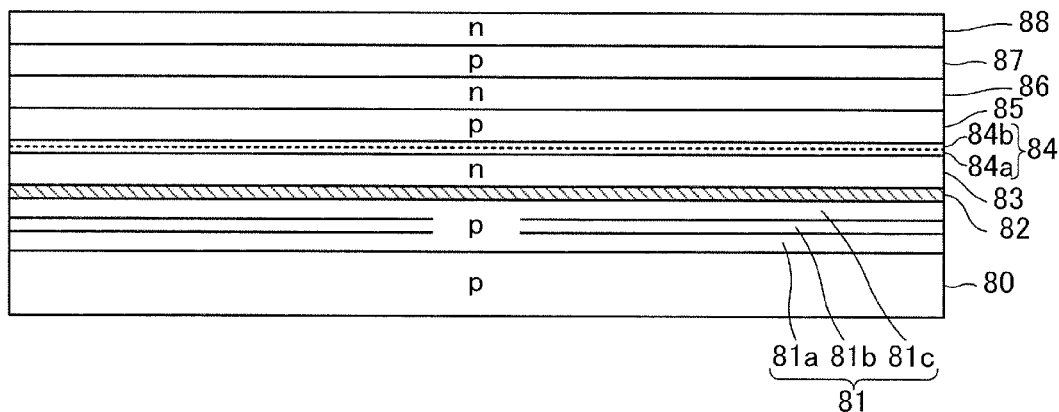
FIG. 11A illustrates a semiconductor layer laminate forming process.
Figure 11B:
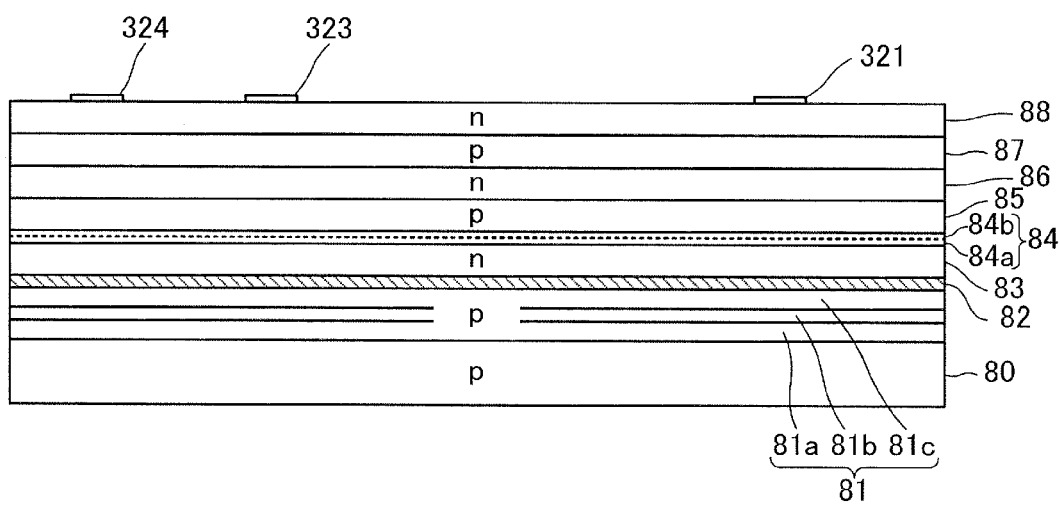
FIG. 11B illustrates an n-type ohmic electrode forming process.
Figure 11C:
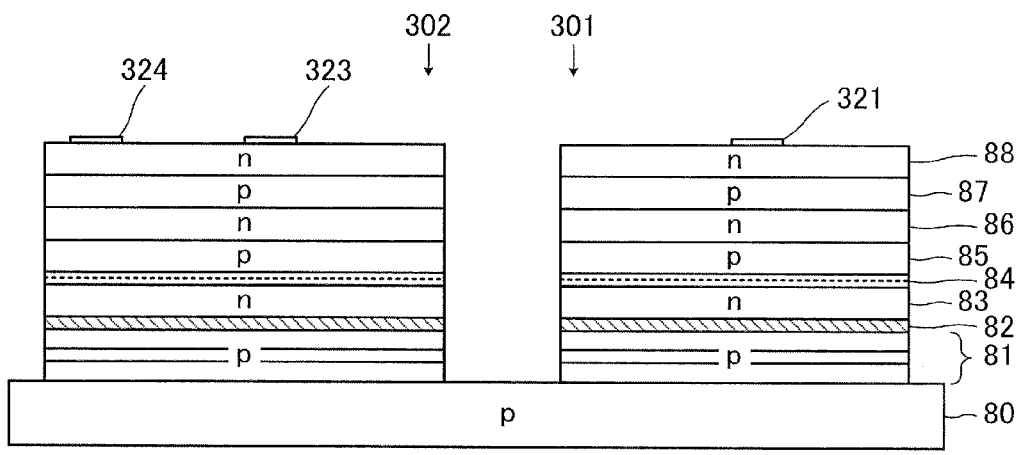
FIG. 11C illustrates a semiconductor layer laminate separating process.
Figure 12D:
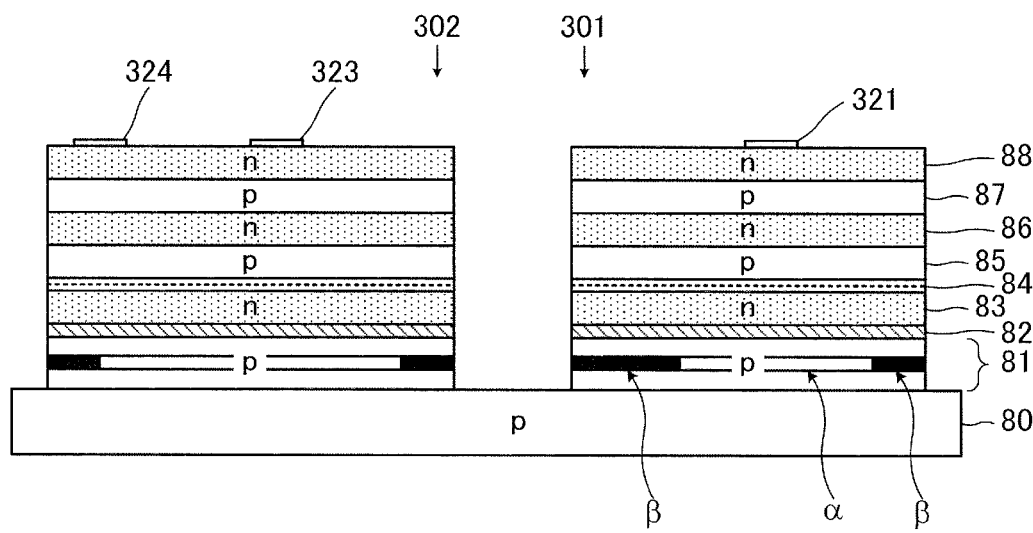
FIG. 12D illustrates a current-blocking-part forming process.
Figure 12E:
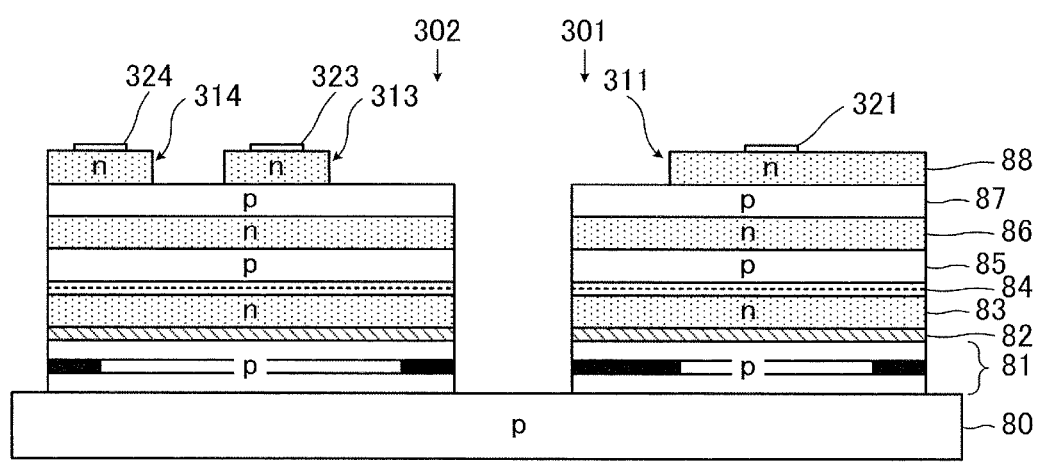
FIG. 12E illustrates a p-type gate layer exposure etching process.
Figure 12F:
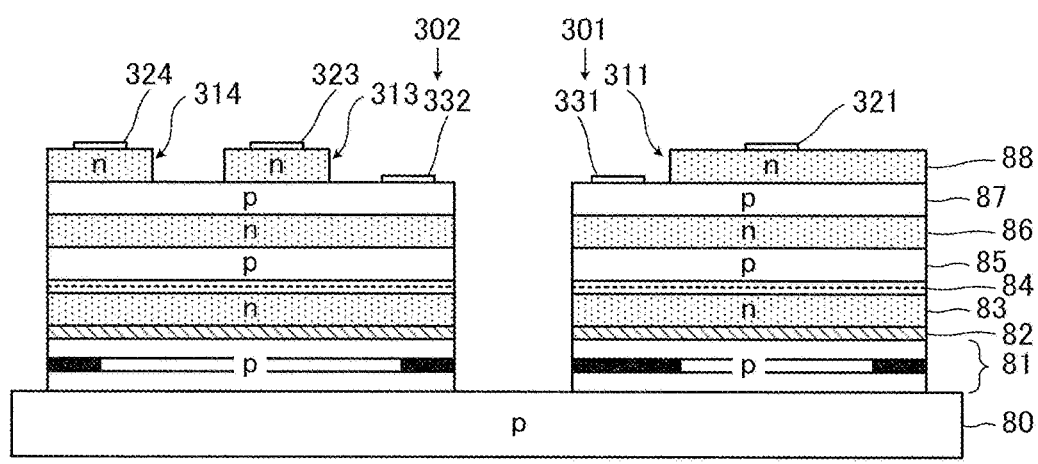
FIG. 12F illustrates a p-type ohmic electrode forming process.
Figure 13G:
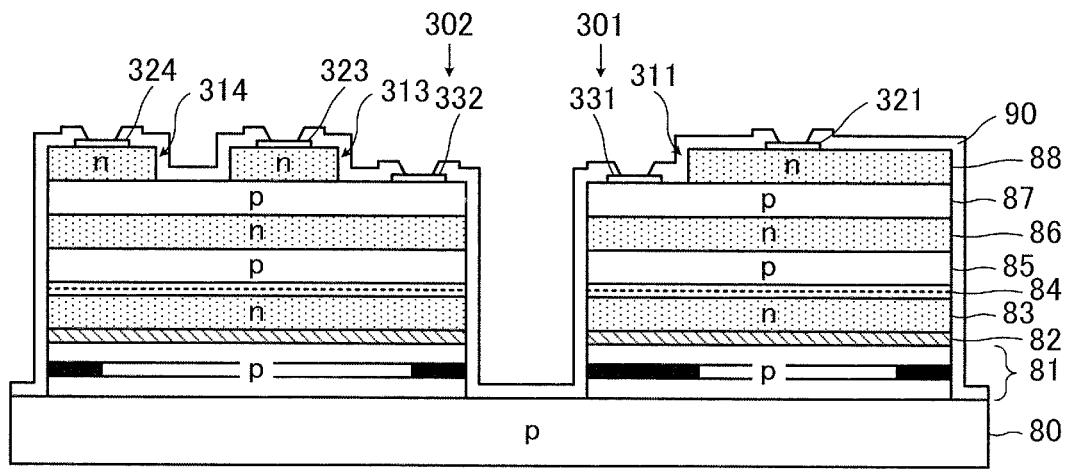
FIG. 13G illustrates a protective layer forming process.
Figure 13H:
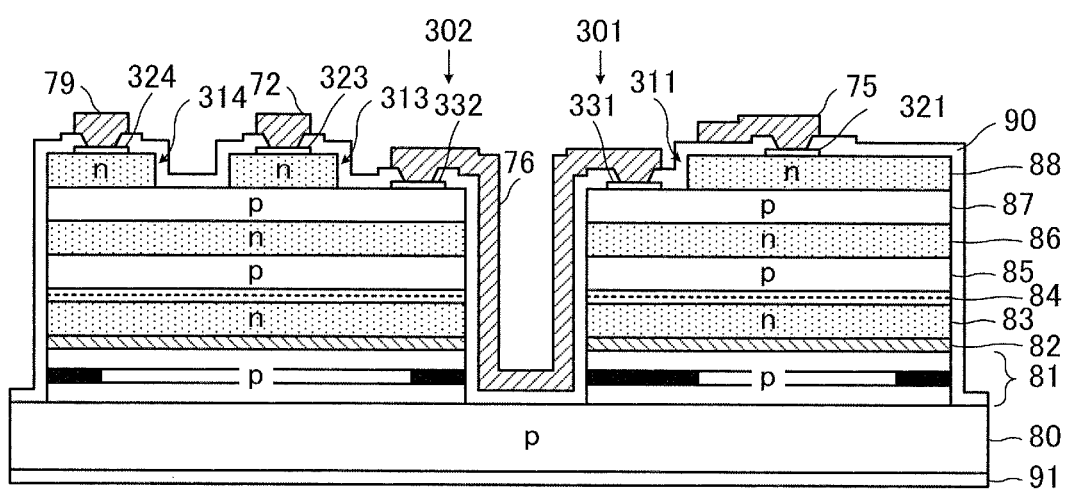
FIG. 13H illustrates a wire/back-electrode forming process.
Figure 13I:
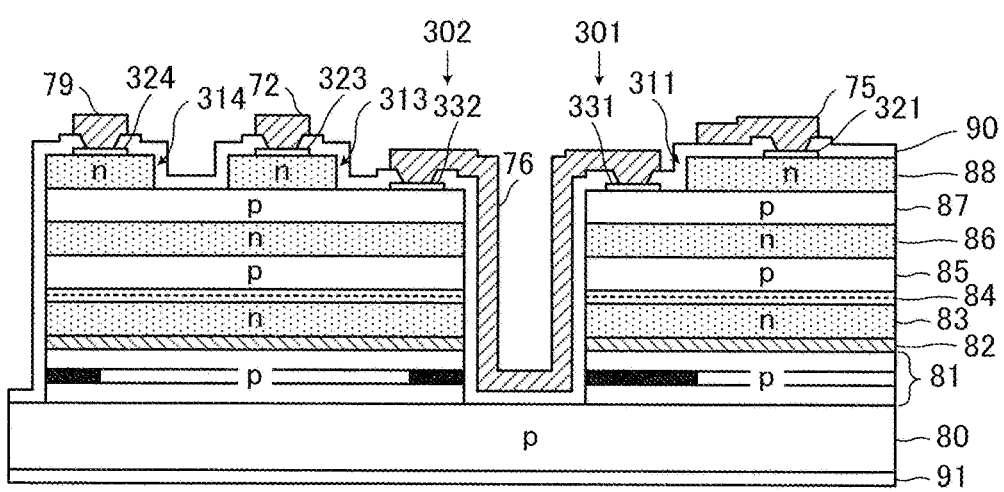
FIG. 13I illustrates a light emission surface forming process.

FIGS. 11A to 11C, FIGS. 12D to 12F, and FIGS. 13G to 13I are views for explaining the method of manufacturing the light emitting chips C. FIG. 11A illustrates a semiconductor layer laminate forming process, and FIG. 11B illustrates an n-type ohmic electrode forming process, and FIG. 11C illustrates a semiconductor layer laminate separating process, and FIG. 12D illustrates a current-blocking-part forming process, and FIG. 12E illustrates a p-type gate layer exposure etching process, and FIG. 12F illustrates a p-type ohmic electrode forming process, and FIG. 13G illustrates a process of forming the protective layer 90, and FIG. 13H illustrates a wire/back-electrode forming process, and FIG. 13I illustrates a light emission surface forming process.

Here, a description will be made with reference to the cross-sectional view of the islands 301 and 302 shown in FIG. 7. This cross-sectional view illustrating those islands is a cross-sectional view taken along the line VIB-VIB of FIG. 6A, but is a cross-sectional view illustrating the opposite side to the side illustrated in FIG. 6B as seen from the negative x direction. By the way, the island 303 is omitted since it is identical to the island 302. Also, the conductivities of impurities are denoted by p and n.

Hereinafter, the processes will be sequentially described.

In the semiconductor layer laminate forming process illustrated in FIG. 11A, a semiconductor layer laminate is formed by epitaxially growing the p anode (clad) layer 81, the light emitting layer 82, the n cathode (clad) layer 83, the tunnel junction layer 84, the p anode layer 85, the n gate layer 86, the p gate layer 87, and the n cathode layer 88, on the p-type substrate 80, in the order. By the way, in the drawings for explaining the manufacturing method, the p anode (clad) layer 81 and the n cathode (clad) layer 83 are denoted by p and n, respectively. Here, the p anode (clad) layer 81, the light emitting layer 82, the n cathode (clad) layer 83 are examples of another semiconductor layer laminate which constitutes the light emitting elements. Also, the p anode layer 85, the n gate layer 86, the p gate layer 87, and the n cathode layer 88 provided on the tunnel junction layer 84 is an example of a semiconductor layer laminate which constitutes the driving units 101 including the thyristors (the setting thyristors S and the transfer thyristors T).

Here, as an example of the substrate 80, a p-type GaAs substrate will be described; however, an n-type GaAs substrate, or an intrinsic I GaAs substrate containing no impurities may be used. Also, a semiconductor substrate made of InP, GaN, InAs, any other III-IV material, or a II-VI material, or a substrate made of sapphire, Si, Ge, or the like may be used. In the case of using any other substrate, as materials which are monolithically stacked on the substrate, materials substantially matching the lattice constant of the substrate (from various perspectives including strain structures, strain relaxation layers, and metamorphic growth) are used. For example, on an InAs substrate, InAs, InAsSb, GaInAsSb, or the like may be used, and on an InP substrate, InP, InGaAsP, or the like may be used, and on a GaN substrate or a sapphire substrate, GaN, AlGaN, or InGaN may be used, and on a Si substrate, Si, SiGe, GaP, or the like may be used. However, in the case of forming a structure of semiconductor materials by crystal growth and pasting the semiconductor structure to another supporting substrate, the semiconductor materials do not need to be substantially lattice-matched with the supporting substrate.

The p anode (clad) layer 81 is configured by stacking the lower p anode (clad) layer 81a, the current constriction layer 81b, and the upper p anode (clad) layer 81c in the order.

The lower p (clad) layer 81a and the upper p (clad) layer 81c constituting the p anode (clad) layer 81 are, for example, p-type $Al_{0.9}GaAs$ with an impurity concentration of $5 \times 10^{17}/cm^3$. The Al composition may be changed in a range between 0 and 1. Alternatively, GaInP or the like may be used.

The current constriction layer 81b is, for example, p-type AlGaAs with a high impurity concentration of AlAs or Al. Any material may be used as long as the material contains Al that may be oxidized to form $Al_2O_3$, thereby increasing electric resistance and constricting the current path.

The light emitting layer 82 has a quantum well structure having well layers and barrier layers alternately stacked. The well layers are, for example, GaAs, AlGaAs, InGaAs, GaAsP, AlGaInP, GaInAsP, GaInP, or the like, and the barrier layers are AlGaAs, GaAs, GaInP, GaInAsP, or the like. However, the light emitting layer 82 may be, for example, a quantum line (quantum wire) or a quantum box (quantum dot).

The n cathode (clad) layer 83 is, for example, n-type $Al_{0.9}GaAs$ with an impurity concentration of $5 \times 10^{17}/cm^3$. The Al composition may be changed in a range between 0 and 1. Alternatively, GaInP or the like may be used.

The tunnel junction layer 84 is configured by the junction between the $n^{++}$ layer 84a containing a high concentration of n-type impurities and a $p^{++}$ layer 84b containing a high concentration of p-type impurities. Each of the $n^{++}$ layer 84a and the $p^{++}$ layer 84b has, for example, an impurity concentration as high as $1 \times 10^{20}/cm^3$. By the way, the impurity concentration of an ordinary junction ranges from the order of $10^{17}/cm^3$ to the order of $10^{18}/cm^3$. Examples of the combination of the $n^{++}$ layer 84a and the $p^{++}$ layer 84b (hereinafter, denoted as $n^{++}$ layer 84a/$p^{++}$ layer 84b) include $n^{++}$ GaInP/$p^{++}$ GaAs, $n^{++}$ GaInP/$p^{++}$ AlGaAs, $n^{++}$ GaAs/$p^{++}$ GaAs, $n^{++}$ AlGaAs/$p^{++}$ AlGaAs, $n^{++}$ InGaAs/$p^{++}$ InGaAs, $n^{++}$ GaInAsP/$p^{++}$ GaInAsP, and $n^{++}$ GaAsSb/$p^{++}$ GaAsSb. By the way, combinations which are obtained by exchange between the combinations may be used.

The p anode layer 85 is, for example, p-type $Al_{0.9}GaAs$ with an impurity concentration of $1 \times 10^{18}/cm^3$. The Al composition may be changed in a range between 0 and 1. Alternatively, GaInP or the like may be used.

The n gate layer 86 is, for example, n-type $Al_{0.9}GaAs$ with an impurity concentration of $1 \times 10^{17}/cm^3$. The Al composition may be changed in a range between 0 and 1. Alternatively, GaInP or the like may be used.

The p gate layer 87 is, for example, p-type $Al_{0.9}GaAs$ with an impurity concentration of $1 \times 10^{17}/cm^3$. The Al composition may be changed in a range between 0 and 1. Alternatively, GaInP or the like may be used.

The n cathode layer 88 is, for example, n-type $Al_{0.9}GaAs$ with an impurity concentration of $1 \times 10^{18}/cm^3$. The Al composition may be changed in a range between 0 and 1. Alternatively, GaInP or the like may be used.

These semiconductor layers are stacked by, for example, MOCVD (Metal Organic Chemical Vapor Deposition), MBE (Molecular Beam Epitaxy), or the like, whereby the semiconductor layer laminate is formed.

In the n-type ohmic electrode forming process shown in FIG. 11B, on the n cathode layer 83, the n ohmic electrodes (such as the n ohmic electrodes 321, 323, 324, etc.) are formed.

The n ohmic electrodes are, for example, Au(AuGe) or the like containing Ge which may easily make ohmic contacts with n-type semiconductor layers such as the n cathode layer 88.

The n ohmic electrodes are formed, for example, by a lift-off method or the like.

In the semiconductor layer laminate separating process shown in FIG. 11C, the n cathode layer 88, the p gate layer 87, the n gate layer 86, the p anode layer 85, the tunnel junction layer 84, the n cathode layer 83, the light emitting layer 82, and the p anode layer 81 are etched in the order, thereby being separated into the islands (such as the islands 301, 302, etc. shown in FIG. 6A). This etching may be performed by wet etching using a sulfuric acid-based etching solution (containing a sulfuric acid, a hydrogen peroxide solution, and water in a weight ratio of 1:10:300), or the like, or may be performed by anisotropic dry etching (RIE) using, for example, boron chloride, or the like. This etching in the semiconductor layer laminate separating process is also referred to as mesa etching or post etching.

Next, in the current-blocking-part forming process shown in FIG. 12D, the current constriction layer 81b whose side surfaces have been exposed by the semiconductor layer laminate separating process is oxidized from the side surfaces, so as to form the current blocking parts β which block current. The unoxidized other parts serve as the current passing parts α.

The oxidation of the current constriction layer 81b is performed by oxidizing Al contained the current constriction layer 81b made of AlAs, AlGaAs, or the like, for example, by steam oxidation at 300° C. to 400° C. At this time, oxidation progresses from the exposed side surfaces, whereby the current blocking parts β are formed of $Al_2O_3$ which is an oxide of Al, at the peripheries of the islands such as the islands 301, 302, etc. The unoxidized parts of the current constriction layer 81b serve as the current passing parts α. By the way, in FIG. 12D to FIG. 13I, the current blocking parts β are illustrated as not being equidistant from the side surfaces of the islands. However, this is for convenience of illustration. Since oxidation progresses the same distance from the side surfaces of the islands such as the islands 301, 302, etc., the current blocking parts β are formed up to the same distance from the side surfaces of the islands.

By the way, the current blocking parts β may be formed by implanting hydrogen ions ($H^+$) into a semiconductor layer formed of GaAs, AlGaAs, or the like ($H^+$ ion implantation), instead of using a semiconductor layer formed of a material having a large composition ratio of Al, such as AlAs. In other words, the current blocking parts β may be formed so as to contain inactive impurities and have high electric resistance by forming a single p anode (clad) layer 81 and implanting $H^+$ ions into parts required to be the current blocking parts β, without separately forming the lower p anode (clad) layer 81a and the upper p anode (clad) layer 81c and using the current constriction layer 81b.

In the p-type gate layer exposure etching process shown in FIG. 12E, the n cathode layer 88 is etched to expose the p gate layer 87.

This etching may be performed by wet etching using a sulfuric acid-based etching solution (containing a sulfuric acid, a hydrogen peroxide solution, and water in a weight ratio of 1:10:300), or may be performed by anisotropic dry etching using, for example, boron chloride.

In the p-type ohmic electrode forming process shown in FIG. 12F, on the p gate layer 87, the p ohmic electrodes (the p ohmic electrodes 331, 332, etc.) are formed.

The p ohmic electrodes are, for example, Au(AuZn) or the like containing Zn which may easily make ohmic contacts with p-type semiconductor layers such as the p gate layer 87.

The p ohmic electrodes are formed, for example, by a lift-off method or the like.

In the process of forming the protective layer 90, shown in FIG. 13G, the protective layer 90 is formed of an insulating material such as $SiO_2$, SiON, or SiN so as to cover the front surfaces of the islands 301, 302, etc.

Then, through-holes (openings) are formed in parts of the protective layer 90 positioned on then ohmic electrodes 321, 323, 324, etc. and the p ohmic electrodes 331, 332, etc.

In the wire/back-electrode forming process shown in FIG. 13H, wires (the power supply lines 71, the first transfer signal lines 72, the second transfer signal lines 73, the lighting signal lines 75, etc.) are formed to be connected to the n ohmic electrodes (the n ohmic electrodes 321, 323, 324, etc.) and the p ohmic electrodes (the p ohmic electrodes 331, 332, etc.) through the through-holes formed in the protective layer 90.

The wires are formed of Al, Au, or the like.

In the light emission surface forming process shown in FIG. 13I, parts of the substrate 80 and the semiconductor layer laminate are cleaved at the parts where the islands 301 have been formed such that light emission surfaces for emitting light from the laser diodes LD is formed.

At this time, the cleaving is performed such that the current blocking parts β positioned on the light emission sides of the laser diodes LD are removed.

Alternatively, as described above, the light emission surfaces may be formed by etching. Also, the semiconductor layer laminate forming process may not be performed. In this case, side surfaces (end surfaces) of the light emitting layer 82 may be configured to serve as light emission surfaces.

As described above, in the light emitting chips C according to the first exemplary embodiment, the laser diodes LD and the setting thyristors S are stacked. In this way, the light emitting chips C are configured as such a self-scanning type that the laser diodes LD are sequentially turned on by the transfer thyristors T and the setting thyristors S. Therefore, the number of terminals which are provided on the light emitting chips C decreases, and the sizes of the light emitting chips C and the light emitting devices 65 decrease.

Instead of providing the setting thyristors S on the laser diodes LD, the setting thyristors S may be used as laser thyristors (light emitting elements). In other words, the p anode (clad) layer 81, the light emitting layer 82, and the n cathode (clad) layer 83 required to configure the laser diodes LD and the under diodes UD may not be provided.

In this case, the driving characteristics and the light emission characteristics may not be individually (independently) set. For this reason, it is difficult to achieve an increase in driving speed, an increase in the intensity of light output, an improvement in efficiency, a reduction in power consumption, a reduction in cost, etc.

In contrast with this, in the first exemplary embodiment, light emission is performed by the laser diodes LD, and transfer is performed by the transfer thyristors T and the setting thyristors S. In other words, light emission and transfer are separately performed. The setting thyristors S do not need to emit light. Therefore, it is possible to improve the driving characteristics and so on using the transfer thyristors T and the setting thyristors S while improving the light emission characteristics and so on by configuring the laser diodes LD in the quantum well structure. In other words, the laser diodes LD of the light emitting parts 102, and the transfer thyristors T and the setting thyristors S constituting the driving units 101 may be set individually (independently). For this reason, it is easy to achieve an increase in driving speed, an increase in the intensity of light output, an improvement in efficiency, a reduction in power consumption, a reduction in cost, etc.

Also, in the first exemplary embodiment, the laser diodes LD and the setting thyristors S are stacked with the tunnel junction layer 84 interposed therebetween. In this case, each laser diode LD is reverse-biased at the tunnel junction layer 84. However, the tunnel junction layer 84 has such a characteristic that current flows therein even in the reverse-biased state.

By the way, when the tunnel junction layer 84 is not provided, the junctions between the laser diodes LD and the setting thyristors S are reverse-biased. For this reason, in order to make current flow in the laser diodes LD and the setting thyristors S, it is required to apply a voltage for causing an electrical breakdown in the reverse-biased junction. In other words, the driving voltage is higher.

In short, since the laser diodes LD and the setting thyristors S are stacked with the tunnel junction layer 84 interposed therebetween, the voltages of the lighting signals φI are suppressed to be lower as compared to the case where the tunnel junction layer 84 is not interposed therebetween.

Further, the tunnel junction layer 84 has a high impurity concentration as described above. For example, the impurity concentration in the tunnel junction layer 84 is $10^{19}/cm^3$ which is higher than the impurity concentrations in the other layers, i.e. $10^{17}/cm^3$ to $10^{18}/cm^3$. Si which is used as impurities is different from GaAs which is an example of the base semiconductor material in the lattice constant, the coupling strength, the number of outermost electrons, etc. For this reason, when a semiconductor layer of, for example, GaAs or the like is grown on the tunnel junction layer 84, defects are likely to occur. Defects are more likely to occur as the impurity concentration increases. Moreover, such defects spread into the semiconductor layer formed thereon.

In addition, a layer which is required to have an impurity concentration higher than those of other layers, like the tunnel junction layer 84, should be grown at low temperature. In other words, some growth conditions (such as temperature, growth speed, and ratio) are required to be changed. For this reason, the growth conditions for a semiconductor layer to be formed on the tunnel junction layer 84 diverge from the optimal growth conditions.

As a result, the semiconductor layer formed on the tunnel junction layer 84 has lots of defects.

Particularly, the light emission characteristics of the light emitting elements such as the laser diodes LD are likely to be influenced by the defects included in the semiconductor layer. On the other hand, the thyristors (the setting thyristors S and the transfer thyristors T) need only to be able to turn on such that current is supplied to the laser diodes LD and the under diodes. In other words, the thyristors (the setting thyristors S and the transfer thyristors T) are unlikely to be influenced by the defects.

For this reason, in each light emitting chip C according to the first exemplary embodiment, on the substrate 80, the laser diodes LD and the under diodes UD are provided, and the setting thyristors S and the transfer thyristors T are provided thereon with the tunnel junction layer 84 interposed therebetween. Therefore, occurrence of defects in the laser diodes LD and the under diodes UD, particularly, in the laser diodes LD is suppressed, such that it becomes difficult for the light emission characteristics to be influenced by the defects. Further, the setting thyristors S and the transfer thyristors T are epitaxially grown to be stacked monolithically.

<Metallic Conductive III-V Compound Layer>

In each light emitting chip C described above, the setting thyristors S and the transfer thyristors T are stacked on the laser diodes LD and the under diodes UD with the tunnel junction layer 84 interposed therebetween.

In place of the tunnel junction layer 84, a metallic conductive III-V compound layer which is epitaxially grown on a III-V compound semiconductor layer may be used. In this case, the term "tunnel junction layer 84" in the above description may be replaced with the term "metallic conductive III-V compound layer 84".

Figure 14A:
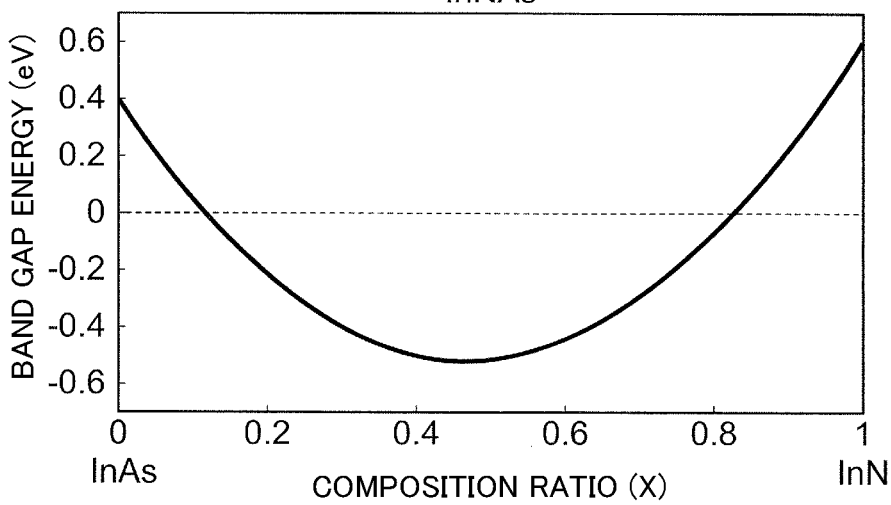
FIG. 14A illustrates the band gap of InNAs with respect to the composition ratio x of InN.
Figure 14B:
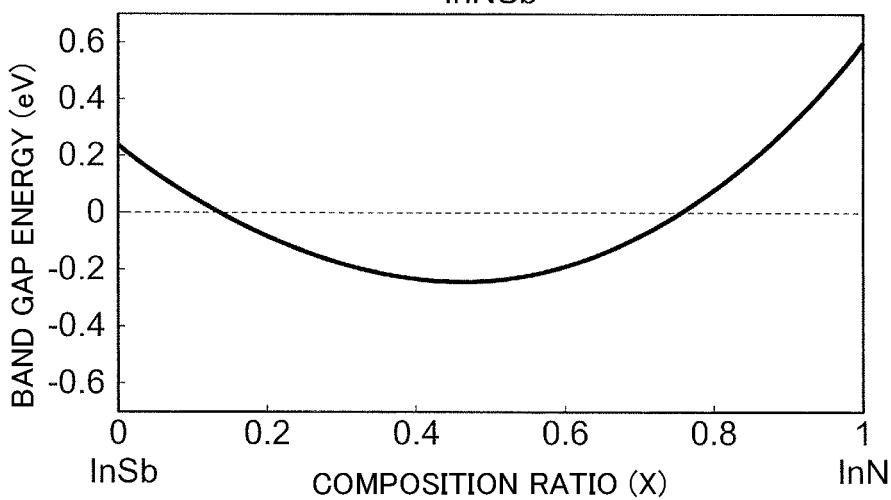
FIG. 14B illustrates the band gap of InNSb with respect to the composition ratio x of InN.
Figure 14C:
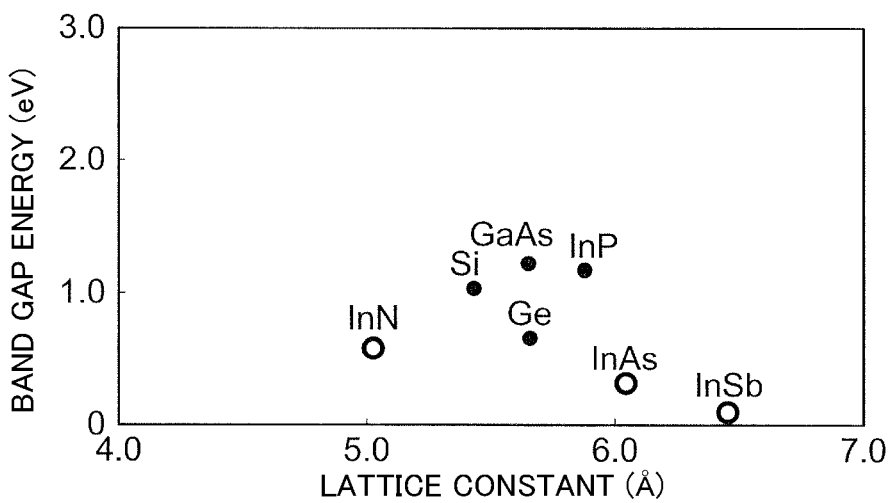
FIG. 14C is a view illustrating the lattice constants of VI elements and III-V compounds with respect to their band gaps.

FIGS. 14A to 14C are for explaining materials for the metallic conductive III-V compound layer. FIG. 14A is a view illustrating the band gap of InNAs with respect to the composition ratio x of InN, and FIG. 14 is a view illustrating the band gap of InNSb with respect to the composition ratio x of InN, and FIG. 14C is a view illustrating the lattice constants of VI elements and III-V compounds with respect to their band gaps.

FIG. 14A illustrates the band gap energy (eV) of InNAs which is a compound consisting of a composition ratio x of InN (wherein x is a value between 0 and 1) and a composition ratio (1-x) of InAs.

FIG. 14B illustrates the band gap energy (eV) of InNSb which is a compound consisting of a composition ratio x of InN (wherein x is a value between 0 and 1) and a composition ratio (1-x) of InSb.

It is known that each of InNAs and InNSb to be described as examples of materials for metallic conductive III-V compound layer has negative band gap energy in a certain composition ratio (x) range as shown in FIG. 14A and FIG. 14B. Having negative band gap energy means having no band gap. Therefore, InNAs and InNSb exhibit metallic conductivity (electrical conductivity). In other words, metallic conductivity (electrical conductivity) means a characteristic in which current flows when there is a gradient in the potential, like in metals.

As shown in FIG. 14A, InNAs has negative band gap energy, for example, in a range in which the composition ratio x of InN is between about 0.1 and about 0.8.

As shown in FIG. 14B, InNSb has negative band gap energy, for example, in a range in which the composition ratio x of InN is between about 0.2 and about 0.75.

In other words, InNAs and InNSb exhibit the metallic conductivity (electrical conductivity) in the above-mentioned ranges.

By the way, in each range in which the band gap energy is small, other than the above-mentioned ranges, electrons have energy due to thermal energy, and may migrate across the band gap. Therefore, each of InNAs and InNSb has such a characteristic that current may easily flow therein when the band gap energy is negative or when there is a gradient in the potential, like in metals.

Therefore, even if Al, Ga, Ag, P, or the like is added to InNAs or InNSb, the band gap energy may be maintained in the vicinity of 0 or to be negative, depending on the composition. Therefore, when there is a gradient in the potential, current flows.

Further, as shown in FIG. 14C, the lattice constants of III-V compounds (semiconductors) such as GaAs, InP, etc. are in a range between 5.6 Å and 5.9 Å. Moreover, these lattice constants are close to the lattice constant of Si, i.e. about 5.43 Å, and the lattice constant of Ge, i.e. about 5.66 Å.

In contrast, the lattice constant of InN, which also is a III-V compound, in a zincblende structure is about 5.0 Å, and the lattice constant of InAs is about 6.06 Å. Therefore, the lattice constant of InNAs which is a compound consisting of InN and InAs may become a value close to 5.6 Å to 5.9 Å of GaAs and the like.

In addition, the lattice constant of InSb which is a III-V compound is about 6.48 Å. Therefore, since the lattice constant of InN is about 5.0 Å, the lattice constant of InNSb which is a compound consisting of InSb and InN may become a value close to 5.6 Å to 5.9 Å of GaAs and the like.

In other words, InNAs and InNSb may be epitaxially and monolithically grown on III-V compound (semiconductor) layers of GaAs and the like. Also, on the InNAs or InNSb layer, a III-V compound (semiconductor) layer of GaAs or the like may be monolithically stacked by epitaxial growth.

Therefore, if the laser diodes LD and the setting thyristors S are stacked to be connected in series, with a metallic conductive III-V compound layer replaced for the tunnel junction layer 84 interposed therebetween, a reverse bias is restrained from being applied between the n cathode (clad) layer 83 of a laser diode LD and the p anode layer 85 of a corresponding setting thyristor S.

By the way, theoretically, metallic conductive III-V compound layers which are formed of InNAs, InNSb, or the like have negative band gaps, and are more difficult to be grown and are inferior as compared to GaAs, InP, and the like. Particularly, as the N composition increases, the difficulty of growth increases remarkably. Therefore, when a semiconductor layer of, for example, GaAs or the like is grown on a metallic conductive III-V compound layer, defects are likely to occur.

As described above, the light emission characteristics of the light emitting elements such as the laser diodes LD are likely to be influenced by the defects included in the semiconductor layer. On the other hand, the thyristors (the setting thyristors S and the transfer thyristors T) need only to be able to turned on such that current is supplied to the laser diodes LD and the under diodes. In other words, the thyristors (the setting thyristors S and the transfer thyristors T) are unlikely to be influenced by the defects.

For this reason, on the substrate 80, the laser diodes LD and the under diodes UD may be provided, and the setting thyristors S and the transfer thyristors T may be provided thereon, with a metallic conductive III-V compound layer interposed therebetween, like the tunnel junction layer 84. According to this configuration, occurrence of defects in the laser diodes LD and the under diodes UD, particularly, in the laser diodes LD is suppressed, such that it becomes difficult for the light emission characteristics to be influenced by the defects. Further, the setting thyristors S and the transfer thyristors T may be monolithically stacked.

<Voltage Reducing Layer 89>

Also, in each light emitting chip C described above, the setting thyristors S and the transfer thyristors T are stacked on the laser diodes LD and the under diodes UD, with the tunnel junction layer 84. Therefore, the absolute value of the voltage which is used for the power supply potential Vga, the first transfer signal φ1, the second transfer signal φ2, and the lighting signals φI are large. As described above, "L" (−5 V) is used.

For this reason, in order to reduce the absolute value of the voltage which is used for the power supply potential Vga, the first transfer signal φ1, the second transfer signal φ2, and the lighting signals φI, the voltage reducing layer 89 for reducing the voltage to be applied to the thyristors (the setting thyristors S and the transfer thyristors T) may be used.

Figure 15:
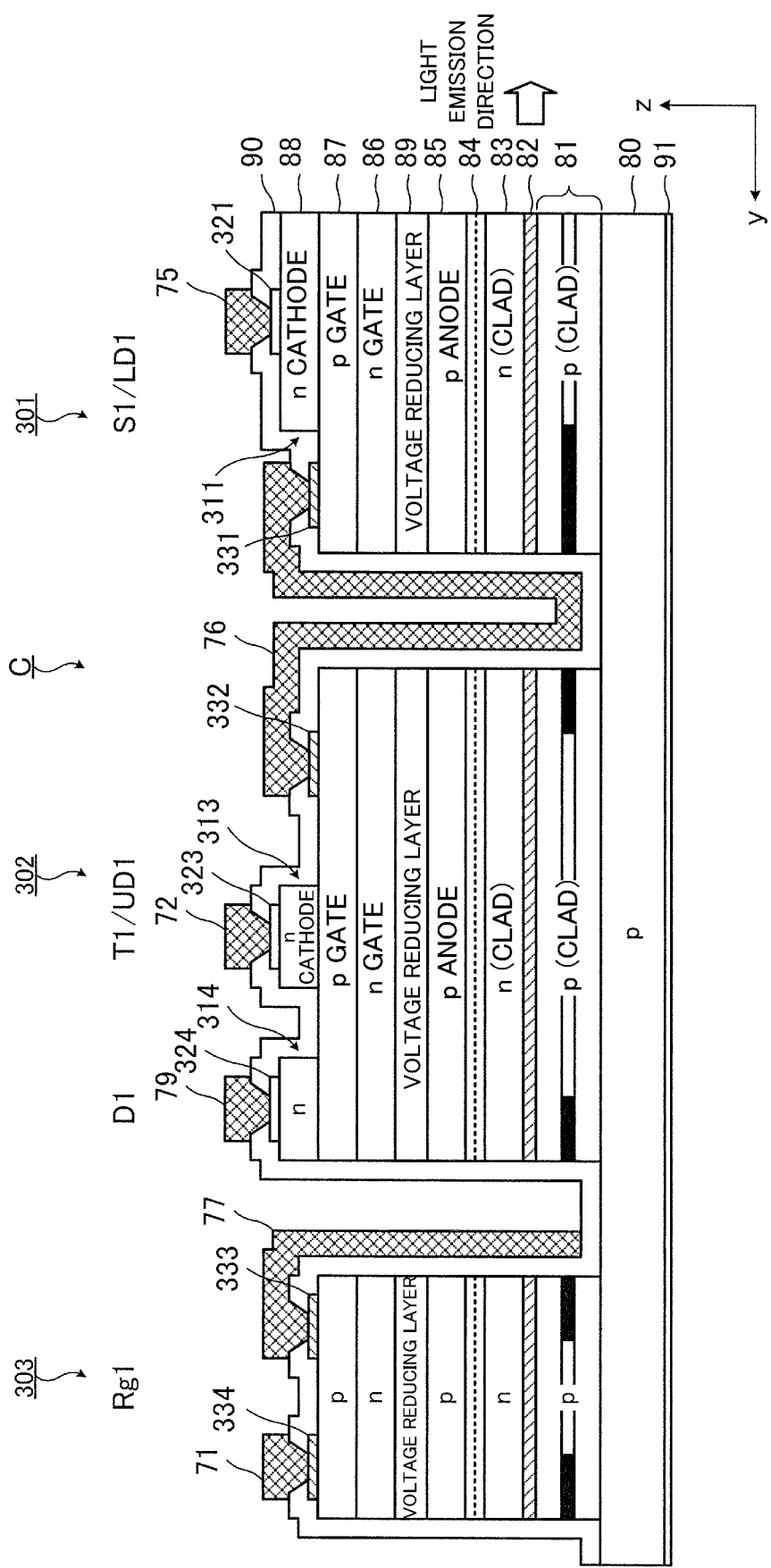
FIG. 15 is an enlarged cross-sectional view illustrating an island having a laminate of a light emitting diode and a setting thyristor having a voltage reducing layer.

FIG. 15 is an enlarged cross-sectional view of the island 301 having a laminate of a laser diode LD and a setting thyristor S having the voltage reducing layer 89. FIG. 15 is the same as FIG. 7 except that FIG. 15 further includes the voltage reducing layer 89. Therefore, parts identical to those in FIG. 7 are denoted by the same reference symbols, and a description thereof will not be made, and different parts will be described.

The voltage reducing layer 89 is provided between the p anode layer 85 and the n gate layer 86 constituting the setting thyristor S. The same is true of the transfer thyristor T.

The voltage reducing layer 89 may be a part of the p anode layer 85 and be of the p-type with the same impurity concentration as that of the p anode layer 85, or may be a part of the n gate layer 86 and be of the n-type with the same impurity concentration as that of the n gate layer 86. Alternatively, the voltage reducing layer 89 may be an i layer.

The role of the voltage reducing layer 89 for the setting thyristor S and the transfer thyristor T will be described using generalized thyristors.

Figure 16B:
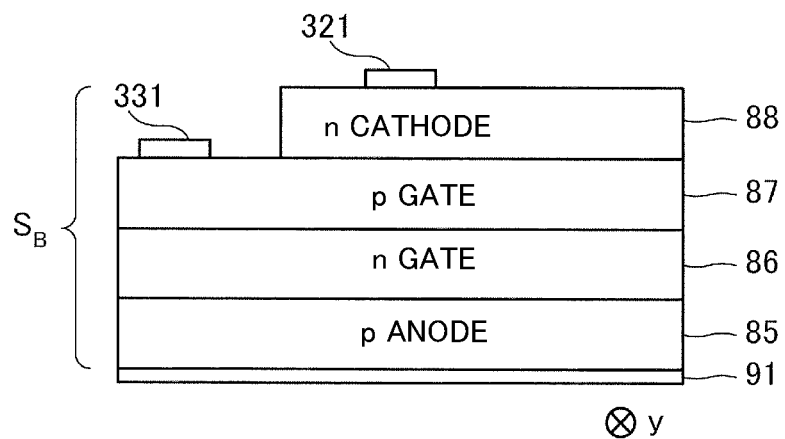
FIG. 16B is a cross-sectional view of a thyristor having no voltage reducing layer.
Figure 16C:
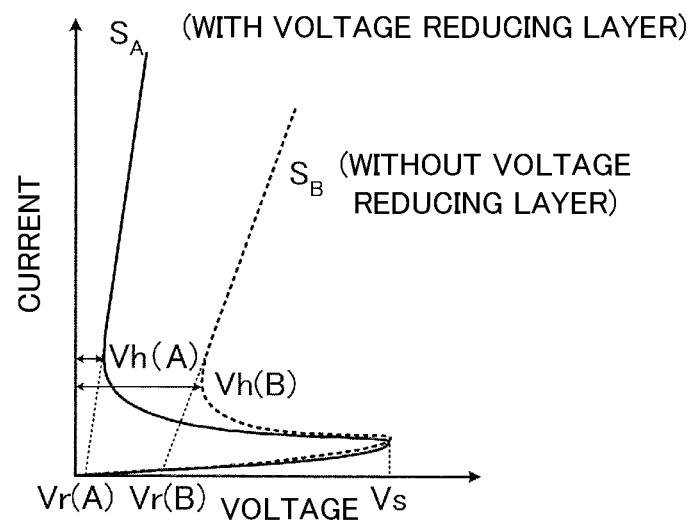
FIG. 16C illustrates the characteristics of the thyristors.

FIGS. 16A to 16C are views for explaining the structures of thyristors and the characteristics of the thyristors. FIG. 16A is a cross-sectional view of a thyristor $S_A$ having a voltage reducing layer 89, and FIG. 16B is a cross-sectional view of a thyristor $S_B$ having no voltage reducing layer 89, and FIG. 16C illustrates the characteristics of the thyristors. FIG. 16A and FIG. 16B correspond to, for example, cross sections of setting thyristors S without laser diodes LD under them. Therefore, the back electrode 91 is provided on the back surface of the p anode layer 85.

As shown in FIG. 16A, the thyristor $S_A$ has the voltage reducing layer 89 between the p anode layer 85 and the n gate layer 86. The voltage reducing layer 89 serves as a part of the p anode layer 85 when the voltage reducing layer is of the p-type having the same impurity concentration as that of the p anode layer 85, and serves as a part of the n gate layer 86 when the voltage reducing layer is of the n-type having the same impurity concentration as that of the n gate layer 86. The voltage reducing layer 89 may be an i layer.

The thyristor $S_B$ shown in FIG. 16B does not have the voltage reducing layer 89.

A rising voltage Vr of a thyristor (see FIG. 16C) depends on the energy (band gap energy) of the smallest band gap in the semiconductor layers constituting the thyristor. By the way, the rising voltage Vr of the thyristor is a voltage which is obtained by extrapolating a current in the ON state of the thyristor onto the voltage axis.

As shown in FIG. 16C, the thyristor $S_A$ has the voltage reducing layer 89 which is a layer having a smaller band gap energy as compared to the p anode layer 85, the n gate layer 86, the p gate layer 87, and the n cathode layer 88. Therefore, a rising voltage Vr(A) of the thyristor $S_A$ is lower than a rising voltage Vr(B) of the thyristor $S_B$ having no voltage reducing layer 89. In addition, the voltage reducing layer 89 is a layer having, for example, a band gap smaller than the band gap of the light emitting layer 82.

The thyristors (the setting thyristors S and the transfer thyristors T) just serve as parts of the driving units 101 for driving the light emitting elements such as the laser diodes LD, and are not used as light emitting elements. Therefore, their band gaps are determined regardless of the light emission wavelengths of the light emitting elements which actually emit light. For this reason, the voltage reducing layer 89 having a band gap smaller than the band gap of the light emitting layer 82 is provided, whereby the rising voltages Vr of the thyristors are reduced.

Therefore, when the thyristors and the light emitting elements are in the ON state, the voltage to be applied to the thyristors and the light emitting elements decreases.

Figure 17:
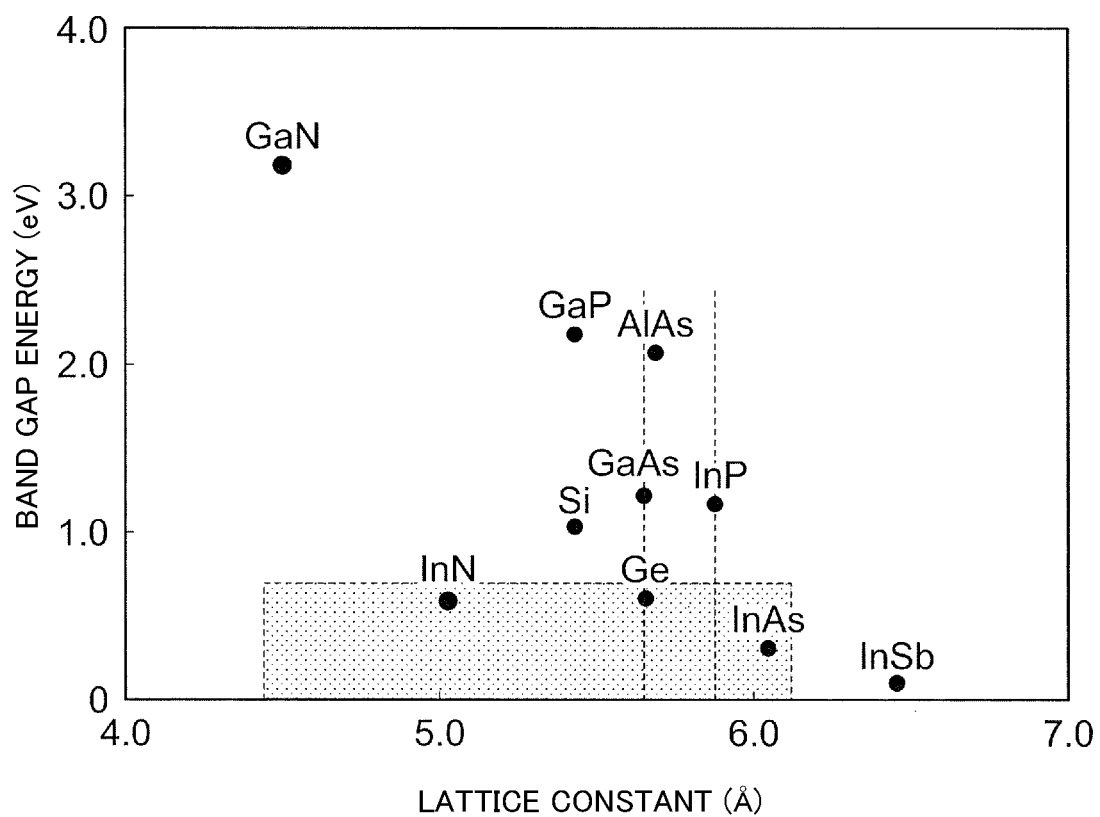
FIG. 17 is a view for explaining the band gap energies of materials which constitute semiconductor layers.

FIG. 17 is a view for explaining the band gap energies of materials for semiconductor layers.

The lattice constant of GaAs is about 5.65 Å. The lattice constant of AlAs is about 5.66 Å. Therefore, materials having lattice constants close to the above-mentioned lattice constants may be epitaxially grown on GaAs substrates. For example, AlGaAs which is a compound consisting of GaAs and AlAs, or Ge may be epitaxially grown on a GaAs substrate.

In addition, the lattice constant of InP is about 5.87 Å. Materials having lattice constants close to the lattice constant of InP may be epitaxially grown on InP substrates.

In addition, GaN has different lattice constants depending on growth planes, and the lattice constant of the a-plane is 3.19 Å, and the lattice constant of the c-plane is 5.17 Å. Materials having lattice constants close to the lattice constants of GaN may be epitaxially grown on GaN substrates.

In addition, materials in a dotted region shown in FIG. 17 have such band gap energies that rising voltages of thyristors decrease, with respect to GaAs, InP, and GaN. In other words, if a material in the dotted region is used for a layer which constitutes the thyristors, the rising voltage Vr of the thyristors corresponds to the band gap energy of the material included in the dotted region.

For example, the band gap energy of GaAs is about 1.43 eV. Therefore, when the voltage reducing layer 89 is not used, the rising voltage Vr of the thyristors is about 1.43 V. However, if a layer to constitute the thyristors is formed of or contains a material in the dotted region, the rising voltage Vr of the thyristors may be made larger than 0 V and smaller than 1.43 V (0 V<Vr<1.43 V).

Therefore, power consumption when the thyristors are in the ON state decreases.

In the materials in the dotted region, there is Ge having the band gap energy of about 0.67 eV with respect to GaAs. Also, there is InAs having the band gap energy of about 0.36 eV with respect to InP. In addition, with respect to GaAs substrates or InP substrates, a compound consisting of GaAs and InP, a compound consisting of InN and InSb, a compound consisting of InN and InAs, and so on having small band gap energies may be used. Particularly, mixed compounds using GaInNAs as the base are suitable. In them, Al, Ga, As, P, Sb, etc. may be contained. In addition, with respect to GaN, GaNP may be used for the voltage reducing layer 89. Moreover, (1) an InN layer or an InGaN layer which may be formed by metamorphic growth or the like, (2) a quantum dot which may be formed of InN, InGaN, InNAs, or InNSb, (3) an InAsSb layer having a lattice constant which is twice the lattice constant of GaN (the a-plane), etc. may be introduced as the voltage reducing layer 89. In them, Al, Ga, N, As, P, Sb, etc. may be contained.

Although the rising voltages Vr of the thyristors have been described here, the same is true of a holding voltage Vh which is a minimum voltage for holding the thyristors in the ON state, and a voltage which is applied to the thyristors in the ON state (see FIG. 16C).

On the other hand, the switching voltage Vs (see FIG. 16C) of each of the thyristors depends on the depletion layer between the semiconductor layers reversely biased. Therefore, the voltage reducing layer 89 has less influence on the switching voltage Vs of the thyristors.

In other words, the voltage reducing layer 89 reduces the rising voltage Vr while maintaining the switching voltage Vs of the thyristors. Therefore, the voltage which is applied to the thyristors in the ON state decreases, and the power consumption decreases. The switching voltage Vs of the thyristors is set to an arbitrary value by adjusting the materials, impurity concentrations, and so on of the p anode layer 85, the n gate layer 86, the p gate layer 87, and the n cathode layer 88. By the way, the switching voltage Vs varies depending on the insertion position of the voltage reducing layer 89.

In addition, although an example having one voltage reducing layer 89 is illustrated in FIG. 15, a plurality of voltage reducing layers may be provided. For example, voltage reducing layers 89 may be provided between the p anode layer 85 and the n gate layer 86 and between the p gate layer 87 and the n cathode layer 88, respectively, or one voltage reducing layer may be provided in the n gate layer 86, and another voltage reducing layer may be provided in the p gate layer 87. Besides, two or three layers may be selected from the p anode layer 85, the n gate layer 86, the p gate layer 87, and the n cathode layer 88, and voltage reducing layers may be provided in the selected layers, respectively. The conductivity type of each of such voltage reducing layers may be the same as that of the anode layer, the cathode layer, or the gate layer where the voltage reducing layer is provided, or may be the i type.

The materials which may be used for the voltage reducing layer 89 are more difficult to be grown and are inferior, as compared to GaAs, InP, and the like. Therefore, inside the voltage reducing layer 89, defects are likely to occur, and the defects may extend into a semiconductor of, for example, GaAs or the like grown on the voltage reducing layer.

As described above, the light emission characteristics of the light emitting elements such as the laser diodes LD are likely to be influenced by the defects included in the semiconductor layers. On the other hand, the thyristors (the setting thyristors S and the transfer thyristors T) need only to be able to turned on such that current is supplied to the laser diodes LD and the under diodes UD. For this reason, as long as the thyristors including the voltage reducing layer 89 may be used for voltage reduction, without being used as light emitting layer, it does not matter that defects are included in the semiconductor layers constituting the thyristors.

Therefore, the laser diodes LD and the under diodes UD may provided on the substrate 80, and the setting thyristors S and the transfer thyristors T including the voltage reducing layer 89 may be provided thereon, like the tunnel junction layer 84 or a metallic conductive III-V compound layer. According to this configuration, occurrence of defects in the laser diodes LD and the under diodes UD, particularly, in the laser diodes LD is suppressed, such that it becomes difficult for the light emission characteristics to be influenced by the defects. Further, the setting thyristors S and the transfer thyristors T may be monolithically stacked.

Hereinafter, modifications of the light emitting chips C according to the first exemplary embodiment will be described. In each of the following modifications, a part of an island 301 of a light emitting chips C including a laminate of laser diodes LD and setting thyristors S will be described. The layer configurations of islands 302 and 303 are the same as the layer configuration of the island 301, so a description thereof will not be made. In addition, a description of parts identical to those in the islands 301 described above will not be made, and different parts will be described. The same is true of the other modifications and the other exemplary embodiments.

(Modification 1-1 of Light Emitting Chips C According to First Exemplary Embodiment)

Figure 18:
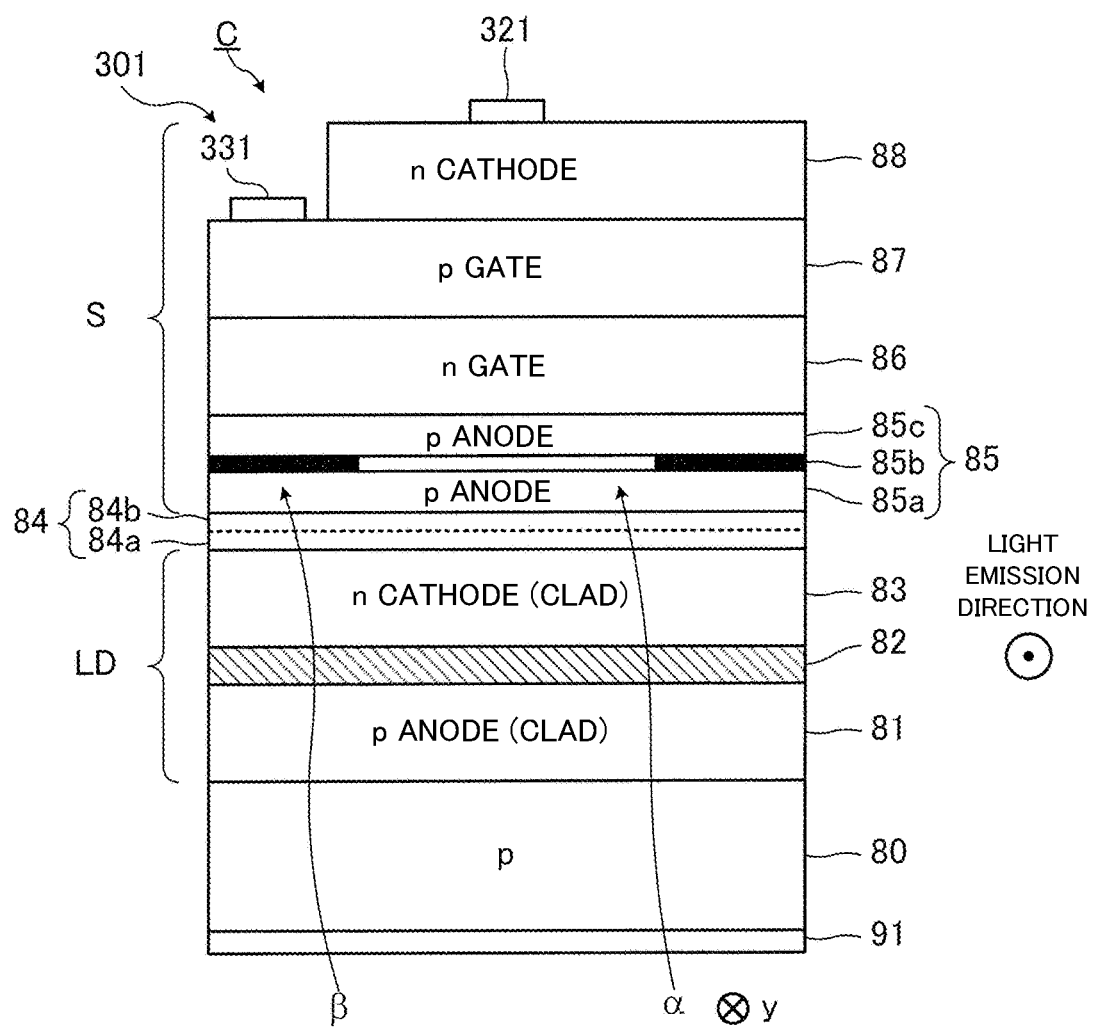
FIG. 18 is an enlarged cross-sectional view of an island which has a laminate of a laser diode and a setting thyristor and is for explaining a modification 1-1.

FIG. 18 is an enlarged cross-sectional view of an island 301 having a laminate of a laser diode LD and a setting thyristor S for explaining a modification 1-1.

In the modification 1-1, a current constriction layer (in the modification 1-1, a current constriction layer 85b) is provided in the p anode layer 85, in place of the p anode (clad) layer 81. In other words, the p anode layer 85 is composed of a lower p anode layer 85a, the current constriction layer 85b, and an upper p anode layer 85c. The other configuration is identical to those of the light emitting chips C according to the first exemplary embodiment.

In addition, the modification 1-1 may be manufactured by modifying the method of manufacturing the light emitting chips C according to the first exemplary embodiment, shown in FIGS. 11A to 11C, FIGS. 12D to 12F, and FIGS. 13G to 13I. In other words, it is needed only to modify the manufacturing method such that the lower p anode layer 85a, the current constriction layer 85b, and the upper p anode layer 85c are formed as the p anode layer 85, and the current constriction layer 85b is oxidized from the side surfaces. According to this structure, since it is not necessary to perform etching up to the laser diodes LD, the level difference decreases, and the process becomes easier, and heat dissipation improves. Therefore, there are advantages such as an improvement in laser characteristics.

Also, in the light emitting chip C of the modification 1-1, since a flow of current is limited to the current passing parts α in the central parts of the laser diodes LD. Therefore, power consumption for non-radiative recombination is suppressed. Therefore, power consumption decreases, and light extraction efficiency improves.

By the way, the current constriction layer may be provided in the n cathode (clad) layer 83 of the laser diodes LD, or may be provided in the n cathode layer 88 of the setting thyristors S.

(Modification 1-2 of Light Emitting Chips C According to First Exemplary Embodiment)

Figure 19:
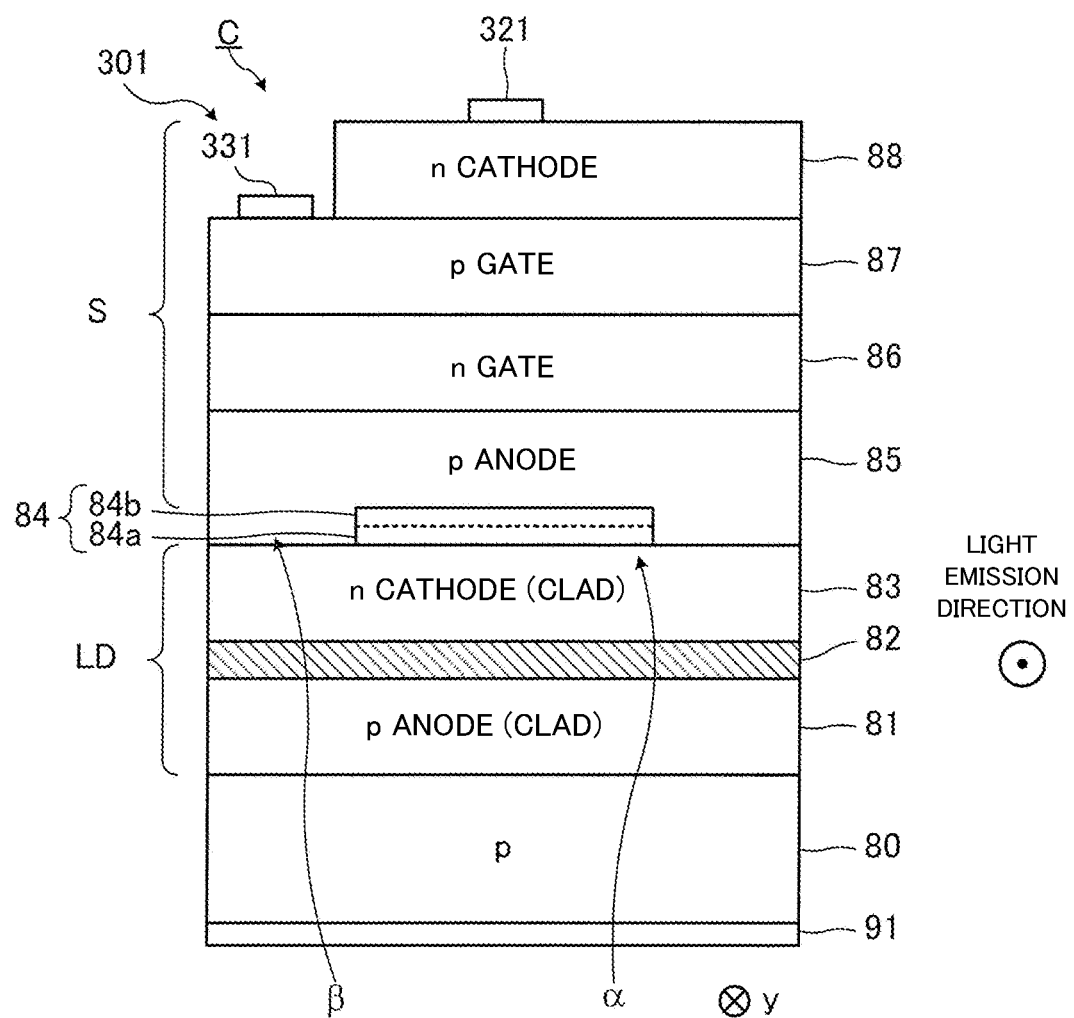
FIG. 19 is an enlarged cross-sectional view of an island which has a laminate of a laser diode and a setting thyristor and is for explaining a modification 1-2.

FIG. 19 is an enlarged cross-sectional view of an island 301 having a laminate of a laser diode LD and a setting thyristor S for explaining a modification 1-2.

In the modification 1-2, in place of the current constriction layer 81*b*, a tunnel junction layer 84 is provided in a part corresponding to the current passing part α. The other configuration is identical to those of the light emitting chips C according to the first exemplary embodiment.

As described above, when the tunnel junction layer 84 is reverse-biased, it is easy for current to flow therethrough. However, in the case of the junction between the n cathode (clad) layer 83 and the p anode layer 85 which is not a tunnel junction, it is difficult for current to flow in the reverse-biased state which does not cause a breakdown.

Therefore, if the tunnel junction layer 84 is provided in the part corresponding to the current passing part α, current which flows in the laser diode LD is limited to the central part.

In addition, the light emitting chip C of the modification 1-2 may be manufactured by modifying the method of manufacturing the light emitting chips C according to the first exemplary embodiment, shown in FIGS. 11A to 11C, FIGS. 12D to 12F, and FIGS. 13G to 13I. In other words, in FIG. 10A, on the substrate 80, the p anode (clad) layer 81, the light emitting layer 82, the n cathode (clad) layer 83, and the tunnel junction layer 84 are stacked in the order. Thereafter, parts of the tunnel junction layer 84 to be the current blocking parts f3 are removed, whereby parts of the tunnel junction layer 84 to be the current passing parts α remain. Thereafter, on and around the remaining parts of the tunnel junction layer 84, the p anode layer 85 is stacked. Then, the n gate layer 86, the p gate layer 87, and the n cathode layer 88 are stacked in the order. By the way, the remaining parts of the tunnel junction layer 84 may be covered with the n cathode (clad) layer 83, instead of the p anode layer 85.

The method of using the tunnel junction layer 84 for current constriction in the light emitting chip C of the modification 1-2 may be applied to the case of using a semiconductor material to which it is difficult to apply steam oxidation.

(Modification 1-3 of Light Emitting Chips C According to First Exemplary Embodiment)

Figure 20:
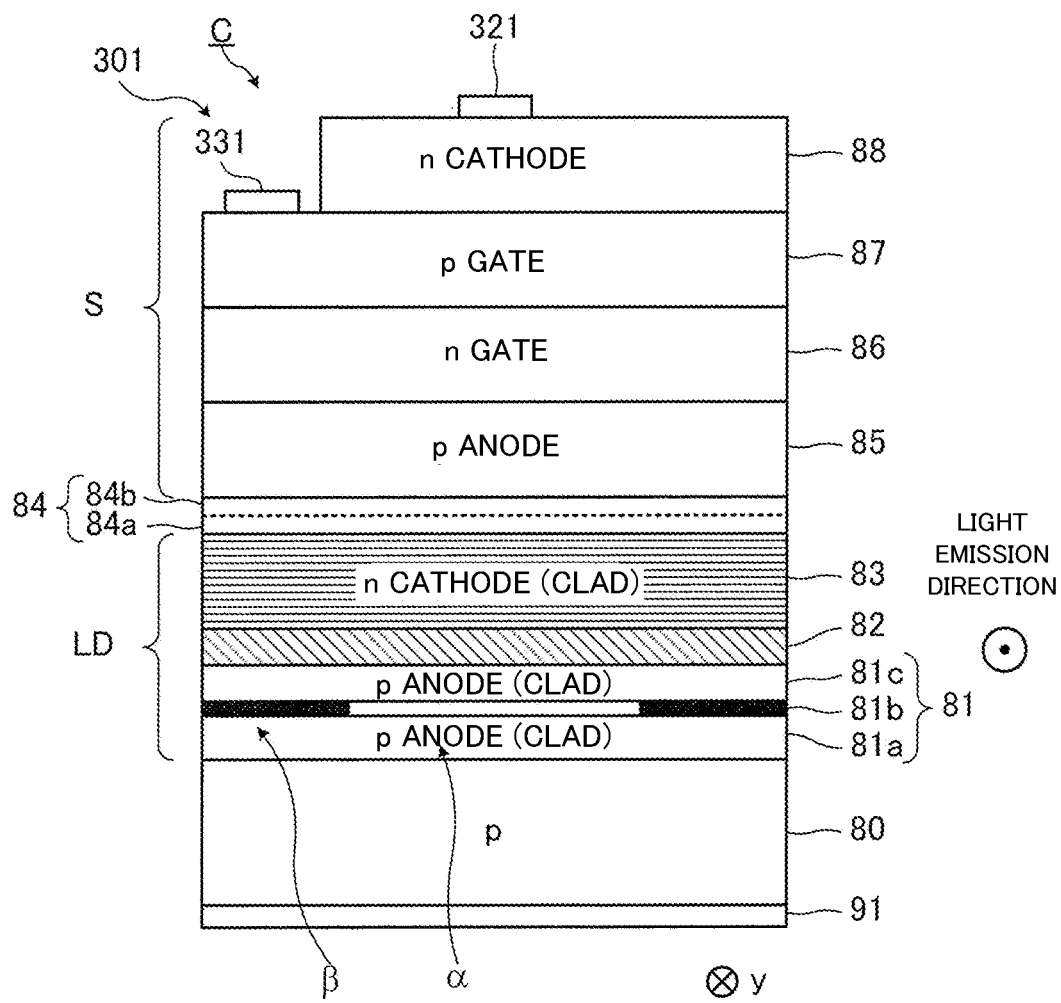
FIG. 20 is an enlarged cross-sectional view of an island which has a laminate of a laser diode and a setting thyristor and is for explaining a modification 1-3.

FIG. 20 is an enlarged cross-sectional view of an island 301 having a laminate of a laser diode LD and a setting thyristor S for explaining a modification 1-3.

In the modification 1-3, an n cathode (clad) layer 83 is used as a distributed Bragg reflector (DBR) (hereinafter, referred to as the DBR layer). The DBR layer is configured by staking a plurality of semiconductor layers having different refraction indexes. Further, the DBR layer is configured to reflect light which is emitted from the laser diodes LD. The other configuration is identical to those of the light emitting chips C according to the first exemplary embodiment.

When a semiconductor material having a band gap smaller than the light emission wavelength is used for the tunnel junction layer 84, light reaching the tunnel junction layer 84 is absorbed at the band ends, thereby being lost. For this reason, in the modification 1-3, the DBR layer is provided between the light emitting layer 82 and the tunnel junction layer 84, and the tunnel junction layer 84 is provided at the position corresponding to nodes of a standing wave which is generated in the DBR layer. According to this configuration, absorption at the band ends by the semiconductor material used for the tunnel junction layer 84 is suppressed greatly.

The DBR layer is composed of a low refraction index layer with a high Al composition, for example, $Al_{0.9}Ga_{0.1}As$ and a high refraction index layer with a low Al composition, for example, $Al_{0.2}Ga_{0.8}As$. The thicknesses (optical path lengths) of the low refraction index layer and the high refraction index layer are set to, for example, 0.25 (¼) times the center wavelength. By the way, the Al composition ratios of the low refraction index layer and the high refraction index layer may be changed in a range between 0 and 1.

Therefore, the light emitting chip C of the modification 1-3 may be manufactured by replacing the n cathode (clad) layer 83 with the DBR layer in the method of manufacturing the light emitting chips C according to the first exemplary embodiment, shown in FIGS. 11A to 11C, FIGS. 12D to 12F, and FIGS. 13G to 13I.

By the way, in the light emitting chips of the modifications 1-1 to 1-3, a metallic conductive III-V compound layer may be used in place of the tunnel junction layer 84, and a voltage reducing layer 89 may be added to the setting thyristors S and the transfer thyristors T.

Second Exemplary Embodiment

In the light emitting chips C according to the first exemplary embodiment, the laser diodes LD are used as light emitting elements. In light emitting chips C according to a second exemplary embodiment, light emitting diodes LED are used as light emitting elements.

The configurations of the light emitting chips C are the same as those of the first exemplary embodiment, except that they include laminates of the light emitting diodes LED (including under diodes UD) and setting thyristors S (including transfer thyristors T). Therefore, they may be obtained by only replacing the laser diodes LD with the light emitting diodes LED. Therefore, a description of the identical parts will not be made, and the different part will be described.

Figure 21:
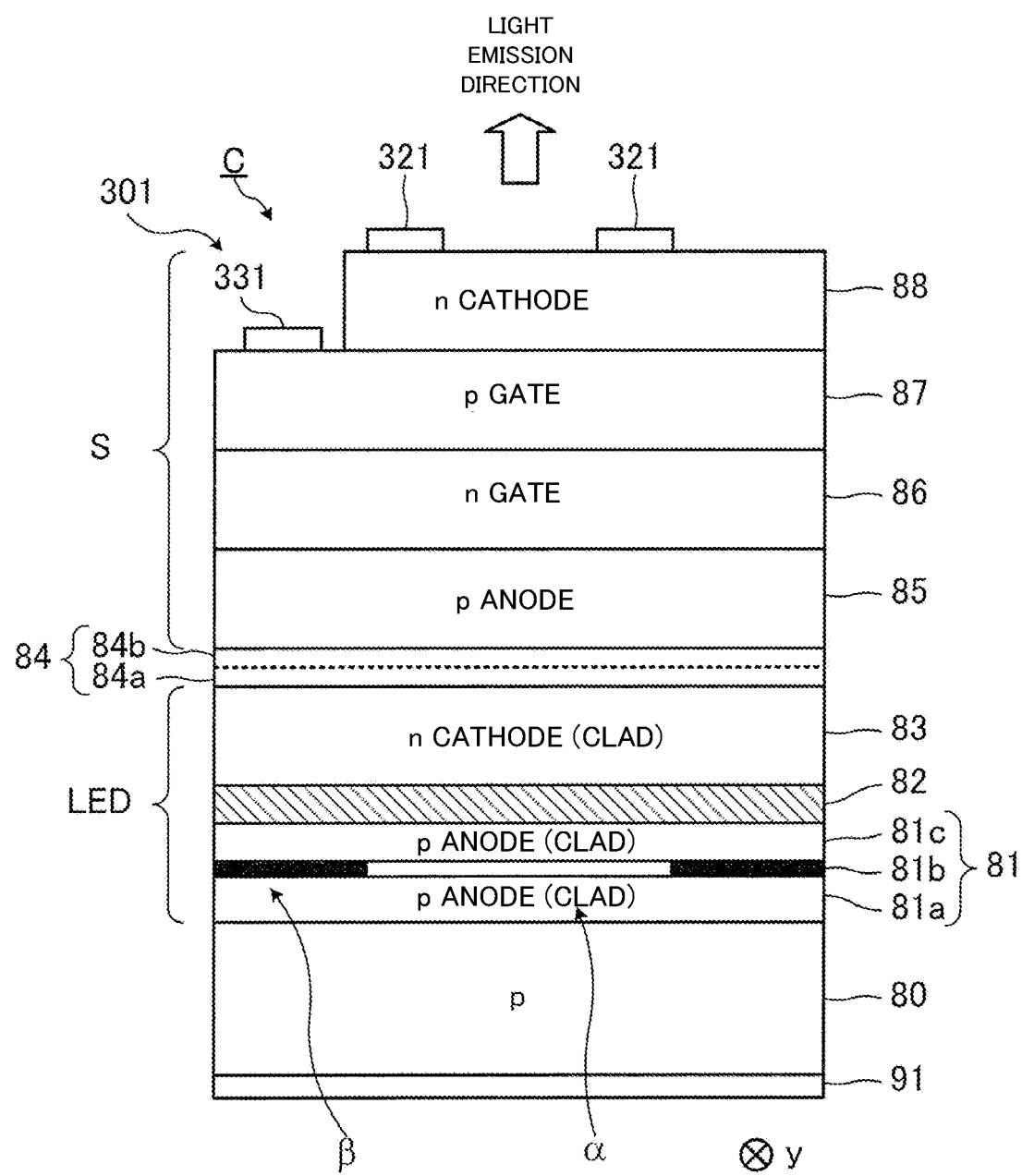
FIG. 21 is an enlarged cross-sectional view of an island configured in a light emitting chip according to a second embodiment so as to include a laminate of a light emitting diode and a setting thyristor.

FIG. 21 is an enlarged cross-sectional view of an island 301 configured in a light emitting chip C according to the second exemplary embodiment so as to include a laminate of a light emitting diode LED and a setting thyristor S.

In each light emitting chip C according to the second exemplary embodiment, on a p-type substrate 80, a p anode layer 81, a light emitting layer 82, and a n cathode layer 83 to constitute the light emitting diodes LED are stacked, and a p anode layer 85, an n gate layer 86, a p gate layer 87, and an n cathode layer 88 to constitute the setting thyristors S are stacked thereon with a tunnel junction layer 84 interposed therebetween. These layers are monolithically stacked.

Moreover, the p anode layer 81 is composed of a lower p anode layer 81*a*, a current constriction layer 81*b*, and an upper p anode layer 81*c*.

The lower p anode layer 81a and the upper p anode layer 81c are, for example, p-type $Al_{0.9}GaAs$ having an impurity concentration of $1 \times 10^{18}/cm^3$. The Al composition may be changed in a range between 0 and 1. Alternatively, GaInP or the like may be used.

The n cathode layer 83 is, for example, n-type $Al_{0.9}GaAs$ having an impurity concentration of $1 \times 10^{18}/cm^3$. The Al composition may be changed in a range between 0 and 1. Alternatively, GaInP or the like may be used.

The other configuration is the same as that of the first exemplary embodiment.

The light emitting diodes LED emit light in the direction perpendicular to the substrate 80, as indicated by an arrow. Therefore, the second exemplary embodiment may be used in the case of using light which is emitted in a direction perpendicular to a substrate 80. By the way, the n ohmic electrode 321 has an opening at the central part.

In this case, light is emitted through the tunnel junction layer 84. Since the tunnel junction layer 84 contains a high concentration of impurities, it is feared that the tunnel junction layer will absorb light. Even in this case, the second exemplary embodiment may be used in applications in which it does not matter that the amount of light is small. For example, the second exemplary embodiment may be used in an application in which it does not matter that the amount of light is in the order of nW, μW, or the like. The same is true of the other modifications and the other exemplary embodiments.

In addition, as described in the first exemplary embodiment, in place of the tunnel junction layer 84, a metallic conductive III-V compound layer may be used. Also, a voltage reducing layer 89 may be added to the setting thyristors S and the transfer thyristors T. Similarly to the tunnel junction layer 84, with respect to the metallic conductive III-V compound layer and the voltage reducing layer 89, it is feared that they will absorb light emitted from the light emitting diodes LED.

As a method of avoiding light absorption of the tunnel junction layer 84, the metallic conductive III-V compound layer, and the voltage reducing layer 89, over a part or the whole of the central opening of the n ohmic electrode 321, the n cathode layer 88, the p gate layer 87, the n gate layer 86, and the p anode layer 85 constituting the setting thyristor S, and the tunnel junction layer 84 may be removed partially or entirely in the thickness direction by etching. In the case of using a metallic conductive III-V compound layer in place of the tunnel junction layer 84, they may be removed partially or entirely in the thickness direction of the metallic conductive III-V compound layer by etching. In addition, in the case of using the voltage reducing layer 89, the voltage reducing layer also may be removed in the same way.

Also, similarly in the modification 1-1 of the first exemplary embodiment, a current constriction layer may be provided in the p anode layer 85 of the setting thyristors S. In addition, a current constriction layer may be provided in the n cathode layer 83 of the light emitting diodes LED or the n cathode layer 88 of the setting thyristor S.

Further, similarly in the modification 1-2 of the first exemplary embodiment, in place of the current constriction layer which is formed by steam oxidation, a tunnel junction layer 84 may be used as a current constriction layer.

Also, after the semiconductor layer laminate forming process of FIG. 11A according to the first exemplary embodiment, the n cathode layer (88) side may be pasted to another substrate (which is a substrate for transfer and will hereinafter be referred to as the transfer substrate 100), and the substrate 80 may be removed (peeled off). Then, the process of FIG. 11B and the subsequent processes may be performed to manufacture the light emitting chips C. Here, the substrate 80 is a substrate for growth (a growth substrate). The semiconductor layer laminate is turned upside down, and is stacked on the transfer substrate 100.

Figure 22:
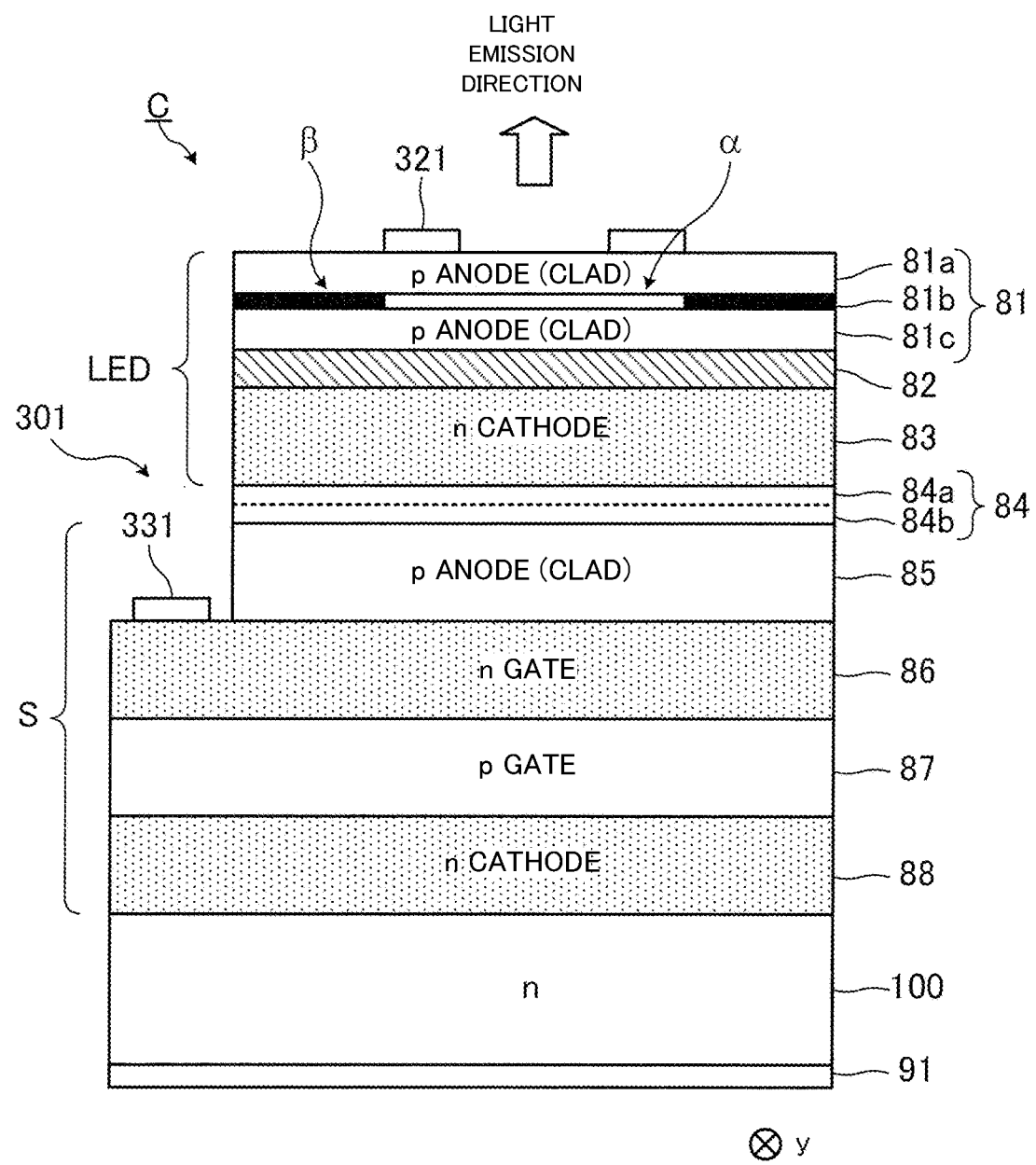
FIG. 22 is an enlarged cross-sectional view of an island configured in a light emitting chip formed on a transfer substrate and including a laminate of a light emitting diode and a setting thyristor.

FIG. 22 is an enlarged cross-sectional view of the island 301 formed in the light emitting chip C on the transfer substrate 100 and including the laminate of the light emitting diode LED and the setting thyristor S.

The semiconductor layer laminate shown in FIG. 21 is turned upside down, and is stacked on the transfer substrate 100. Therefore, when a back electrode 91 is provided on the back surface of the transfer substrate 100, the transfer substrate 100 is of an n-type. In other words, the light emitting chip has a cathode-common configuration and has reversed circuit polarities.

According to this configuration, light which is emitted from the light emitting diode LED is restrained from being absorbed by the tunnel junction layer 84. Also, in the case of using a metallic conductive III-V compound layer or a voltage reducing layer 89, light which is emitted from the light emitting diode LED is restrained from being absorbed by the metallic conductive III-V compound layer or the voltage reducing layer 89.

In addition, also in this structure, the position of the current constriction layer may be changed, or as the current constriction layer, a tunnel junction layer 84 or a metallic conductive III-V compound layer may be used, or a voltage reducing layer 89 may be provided.

Also, the structure which is obtained by pasting to the transfer substrate 100 may be applied to the other exemplary embodiments.

Hereinafter, modifications of the light emitting chips C according to the second exemplary embodiment will be described.

(Modification 2-1 of Light Emitting Chips C According to Second Exemplary Embodiment)

Figure 23:
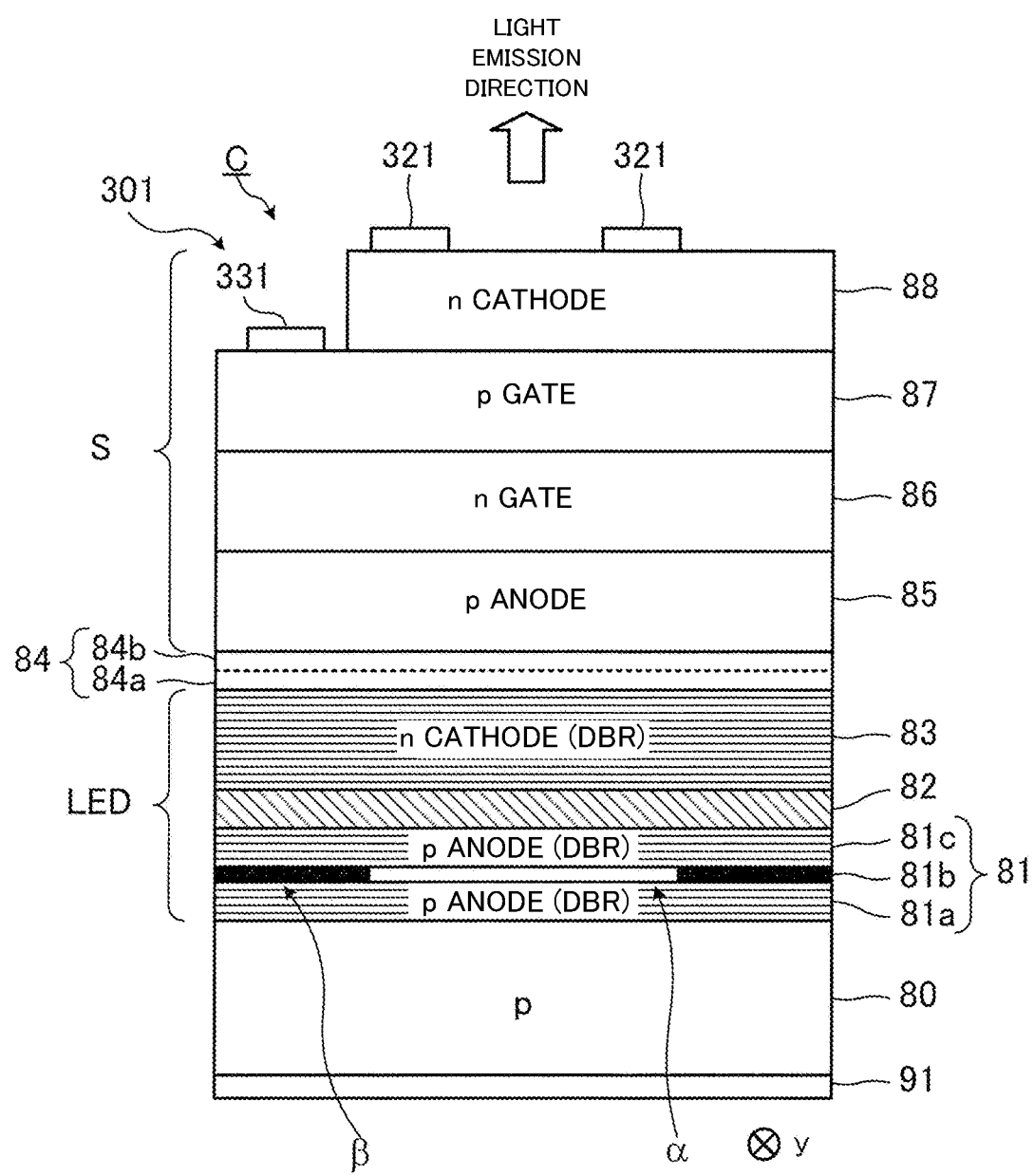
FIG. 23 is an enlarged cross-sectional view of an island which includes a laminate of a light emitting diode and a setting thyristor and is for explaining a modification 2-1.

FIG. 23 is an enlarged cross-sectional view of an island 301 including a laminate of a light emitting diode LED and a setting thyristor S, for explaining a modification 2-1.

In the modification 2-1, a light emitting layer 82 is interposed between two DBR layers. In other words, as a p anode layer 81 and an n cathode (clad) layer 83, DBR layers are formed. The p anode layer 81 includes a current constriction layer 81b. In other words, the p anode layer 81 is formed by stacking a lower p anode layer 81a, a current constriction layer 81b, and an upper p anode layer 81c in the order, and the lower p anode layer 81a and the upper p anode layer 81c are formed as DBR layers.

The lower p anode layer 81a, the upper p anode layer 81c, and the n cathode layer 83 will also be referred to as the lower p anode (DBR) layer 81a, the upper p anode (DBR) layer 81c, and the n cathode (DBR) layer 83.

The configuration of each DBR layer is the same as that in the modification 1-3 of the first exemplary embodiment. By the way, the film thickness (optical path length) of the current constriction layer 81b constituting the p anode (DBR) layer 81 depends on the structure to which the light emitting chip will be applied. In the case where extraction efficiency or process reproducibility is regarded as important, the film thickness of the current constriction layer may be set to a multiple of the film thickness (optical path length) of the low refraction index layer and the high refraction index layer constituting the DBR layer, for example, to 0.75 (¾) times the center wavelength. In the case where the film thickness of the current constriction layer 81b is set to an odd multiple, the current constriction layer may be interposed between a high refraction index layer and another high refraction index layer. In addition, in the case where the film thickness of the current constriction layer 81*b* is set to an even multiple, the current constriction layer may be interposed between a high refraction index layer and a low refraction index layer. In other words, the current constriction layer 81*b* needs only to be provided to suppress periodic disturbance in refraction index attributable to the DBR layer. In contrast, in the case where it is required to reduce the influence of oxidized parts (refraction index or strain), as the film thickness of the current constriction layer 81*b*, several tens of nm is preferable, and it is preferable that the current constriction layer is inserted in a part corresponding to a node of a standing wave which stands inside the DBR layer.

The p anode (DBR) layer 81 and the n cathode (DBR) layer 83 are configured to reflect light emitted from the light emitting layer 82 of the light emitting diode LED. In other words, the p anode (DBR) layer 81 and the n cathode (DBR) layer 83 constitute a resonator (a cavity), such that light emitted from the light emitting layer 82 is enhanced by resonation and is outputted. In other words, in the modification 2-1, the setting thyristors S are stacked on the resonance type light emitting diodes LED.

Moreover, since the current constriction layer 81*b* is provided, power consumption for non-radiative recombination is suppressed. Therefore, power consumption decreases, and light extraction efficiency improves.

The light emitting chips C of the modification 2-1 may be manufactured by partially modifying the manufacturing method of the first exemplary embodiment shown in FIGS. 11A to 11C, FIGS. 12D to 12F, and FIGS. 13G to 13I. In other words, it is needed only to modify the semiconductor layer laminate forming process of Fig. A such that the lower p anode layer 81*a* and the upper p anode layer 81*c* of the p anode layer 81 are formed and the n cathode layer 83 is formed as DBR layers.

The position of the current constriction layer may be changed, or as the current constriction layer, a tunnel junction layer 84 or a metallic conductive III-V compound layer may be used, or a voltage reducing layer 89 may be provided.

In addition, in the case where light from the light emitting diodes LED is absorbed by a tunnel junction layer 84, a metallic conductive III-V compound layer, a voltage reducing layer 89, or the like, whereby the amount of light to be emitted decreases, the semiconductor layer laminate may be turned upside down and be stacked on a transfer substrate 100. Also, as a method of avoiding light absorption of the tunnel junction layer 84, the metallic conductive III-V compound layer, or the voltage reducing layer 89, over a part or the whole of the central opening of the n ohmic electrode 321, the n cathode layer 88, the p gate layer 87, the n gate layer 86, and the p anode layer 85 constituting the setting thyristor S, and the tunnel junction layer 84 may be removed partially or entirely in the thickness direction by etching. In the case of using a metallic conductive III-V compound layer in place of the tunnel junction layer 84, the metallic conductive III-V compound layer may be removed partially or entirely in the thickness direction by etching. In addition, in the case of using the voltage reducing layer 89, the voltage reducing layer also may be removed in the same way.

According to this configuration, light which is emitted from the light emitting diode LED is restrained from being absorbed by the tunnel junction layer 84. Also, in the case of using a metallic conductive III-V compound layer or a voltage reducing layer 89, light which is emitted from the light emitting diode LED is restrained from being absorbed by the metallic conductive III-V compound layer or the voltage reducing layer 89.

(Modification 2-2 of Light Emitting Chips C According to Second Exemplary Embodiment)

Figure 24:
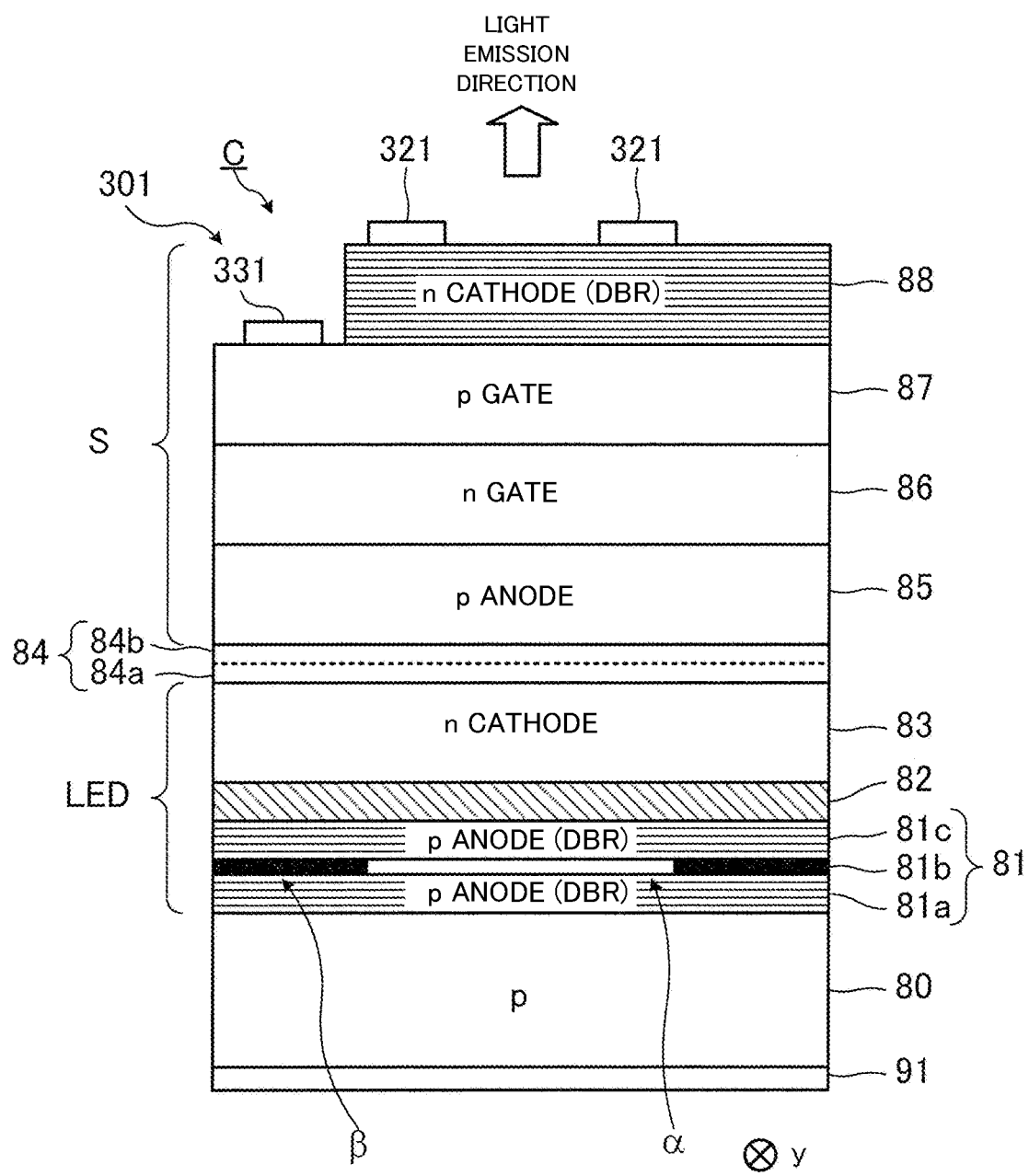
FIG. 24 is an enlarged cross-sectional view of an island which includes a laminate of a light emitting diode and a setting thyristor and is for explaining a modification 2-2.

FIG. 24 is an enlarged cross-sectional view of an island 301 including a laminate of a light emitting diode LED and a setting thyristor S for explaining a modification 2-2.

In the modification 2-2, in place of the n cathode (DBR) layer 83 of the light emitting chip C shown in FIG. 23, an n cathode layer 83 which is not a DBR layer is formed. Instead, an n cathode layer 88 is formed as a DBR layer. Therefore, the n cathode layer 88 will be referred to as the n cathode (DBR) layer 88. The other configuration is identical to those of the light emitting chips C according to the first exemplary embodiment.

In the modification 2-2, the n cathode layer (DBR) 88 and the p anode (DBR) layer 85 constitute a resonator (a cavity), such that light emitted from the light emitting layer 82 is enhanced by resonation and is outputted.

The light emitting chips C of the modification 2-2 may be manufactured by partially modifying the manufacturing method of the first exemplary embodiment shown in FIGS. 11A to 11C, FIGS. 12D to 12F, and FIGS. 13G to 13I. In other words, it is needed only to modify the semiconductor layer laminate forming process of FIG. 11A such that the lower p anode layer 81*a* and the upper p anode layer 81*c* of the p anode (DBR) layer 81 and the n cathode layer (DBR) 88 are formed as DBR layers.

Also, the position of the current constriction layer may be changed, or as the current constriction layer, a tunnel junction layer 84 or a metallic conductive III-V compound layer may be used, or a voltage reducing layer 89 may be provided.

By the way, light from the light emitting diodes LED may be absorbed by a tunnel junction layer 84, a metallic conductive III-V compound layer, a voltage reducing layer 89, or the like, whereby the amount of light to be emitted may decrease. Even in this case, the modification 2-2 may be used in applications in which it does not matter that the amount of light is small.

(Modification 2-3 of Light Emitting Chips C According to Second Exemplary Embodiment)

Figure 25:
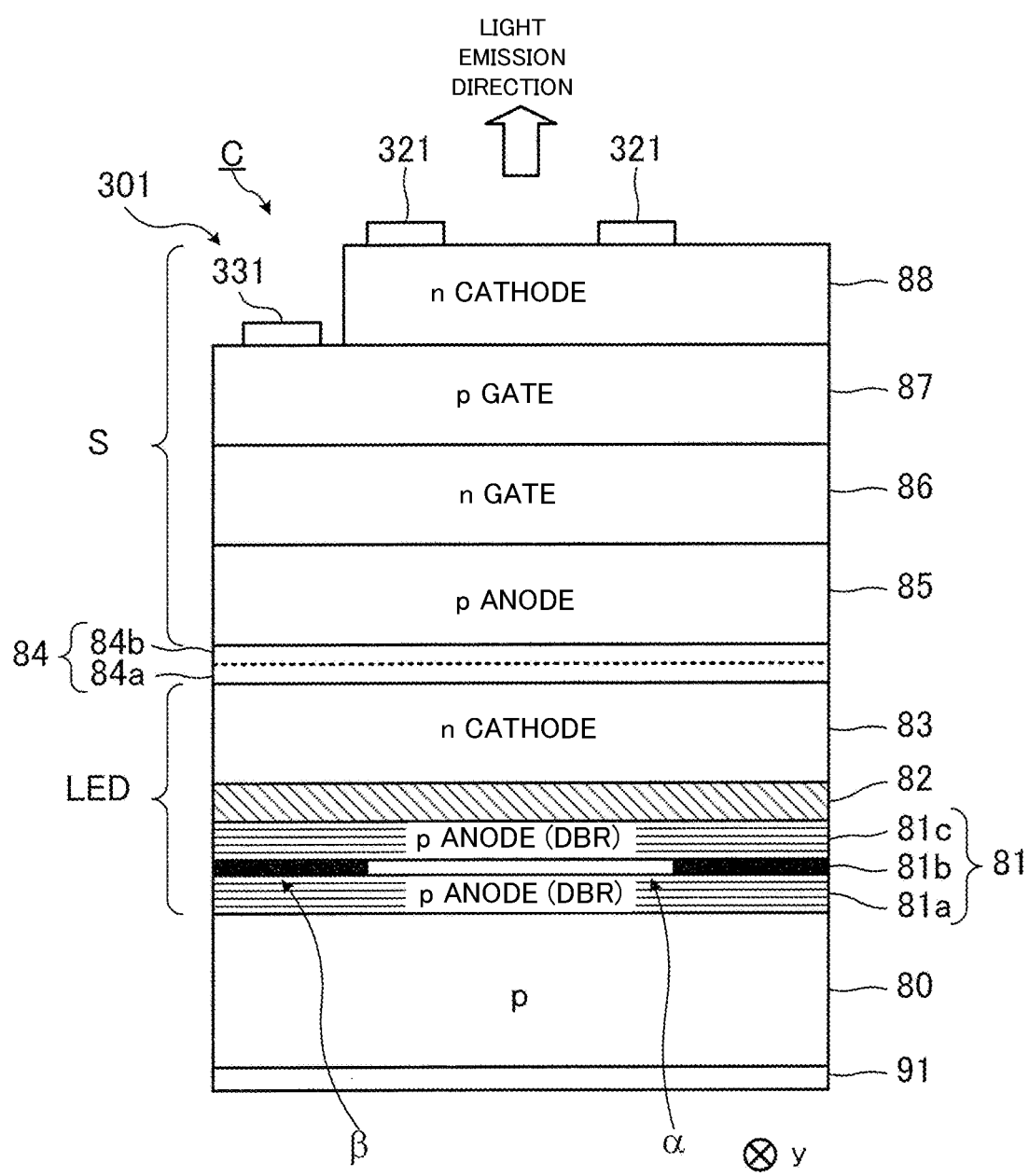
FIG. 25 is an enlarged cross-sectional view of an island which includes a laminate of a light emitting diode and a setting thyristor and is for explaining a modification 2-3.

FIG. 25 is an enlarged cross-sectional view of an island 301 including a laminate of a light emitting diode LED and a setting thyristor S for explaining a modification 2-3.

In the modification 2-3, in place of the n cathode (DBR) layer 83 of the light emitting chip C shown in FIG. 23, an n cathode layer 83 which is not a DBR layer is formed. The other configuration is the same as those of the light emitting chips C according to the first exemplary embodiment.

In the light emitting chip C of the modification 2-3, under the light emitting layer 82 (i.e. on the substrate (80) side), a p anode (DBR) layer 81 is provided. In this case, at the interface between the n cathode layer 88 and air, a reflectance of 30% is obtained. Therefore, light emitted from the light emitting layer 82 is enhanced by resonation and is outputted.

Also, of light emitted from the light emitting layer 82, light traveling toward the substrate 80 is reflected and travels toward an exit port. Therefore, light use efficiency improves as compared to the case where the p anode layer 81 is not a DBR layer.

The light emitting chips C of the modification 2-3 may be manufactured by partially modifying the manufacturing method of the first exemplary embodiment shown in FIGS. 11A to 11C, FIGS. 12D to 12F, and FIGS. 13G to 13I. In other words, it is needed only to modify the semiconductor layer laminate forming process of FIG. 11A such that the lower p anode layer 81a and the upper p anode layer 81c constituting the p anode layer 81 are formed as DBR layers.

The position of the current constriction layer may be changed, or as the current constriction layer, a tunnel junction layer 84 or a metallic conductive III-V compound layer may be used, or a voltage reducing layer 89 may be provided.

By the way, light from the light emitting diodes LED may be absorbed by a tunnel junction layer 84, a metallic conductive III-V compound layer, a voltage reducing layer 89, or the like, whereby the amount of light to be emitted may decrease. Therefore, the modification 2-3 may be used in applications in which it does not matter that the amount of light is small.

In addition, in the case where light from the light emitting diodes LED is absorbed by a tunnel junction layer 84, a metallic conductive III-V compound layer, a voltage reducing layer 89, or the like, whereby the amount of light to be emitted decreases, a light emitting chip may be manufactured by forming a DBR layer as the n cathode (DBR) layer 83, and forming a layer which is not a DBR layer as the p anode layer 81, and turning the semiconductor layer laminate upside down, and stacking the semiconductor layer laminate on a transfer substrate 100.

Third Exemplary Embodiment

In the light emitting chips C according to the first exemplary embodiment, the laser diodes LD are used as light emitting elements, and in the light emitting chips C according to the second exemplary embodiment, the light emitting diodes LED are used as light emitting elements. In light emitting chips C according to a third exemplary embodiment, as light emitting elements, vertical cavity surface emitting lasers VCSEL are used.

The light emitting chips C have the same configurations as those in the first exemplary embodiment, except that they include laminates of vertical cavity surface emitting lasers VCSEL (including under diodes UD) and setting thyristors S (including transfer thyristors T). Therefore, they may be obtained by only replacing the laser diodes LD with vertical cavity surface emitting lasers VCSEL. Therefore, a description of the identical parts will not be made, and the different part will be described.

Figure 26:
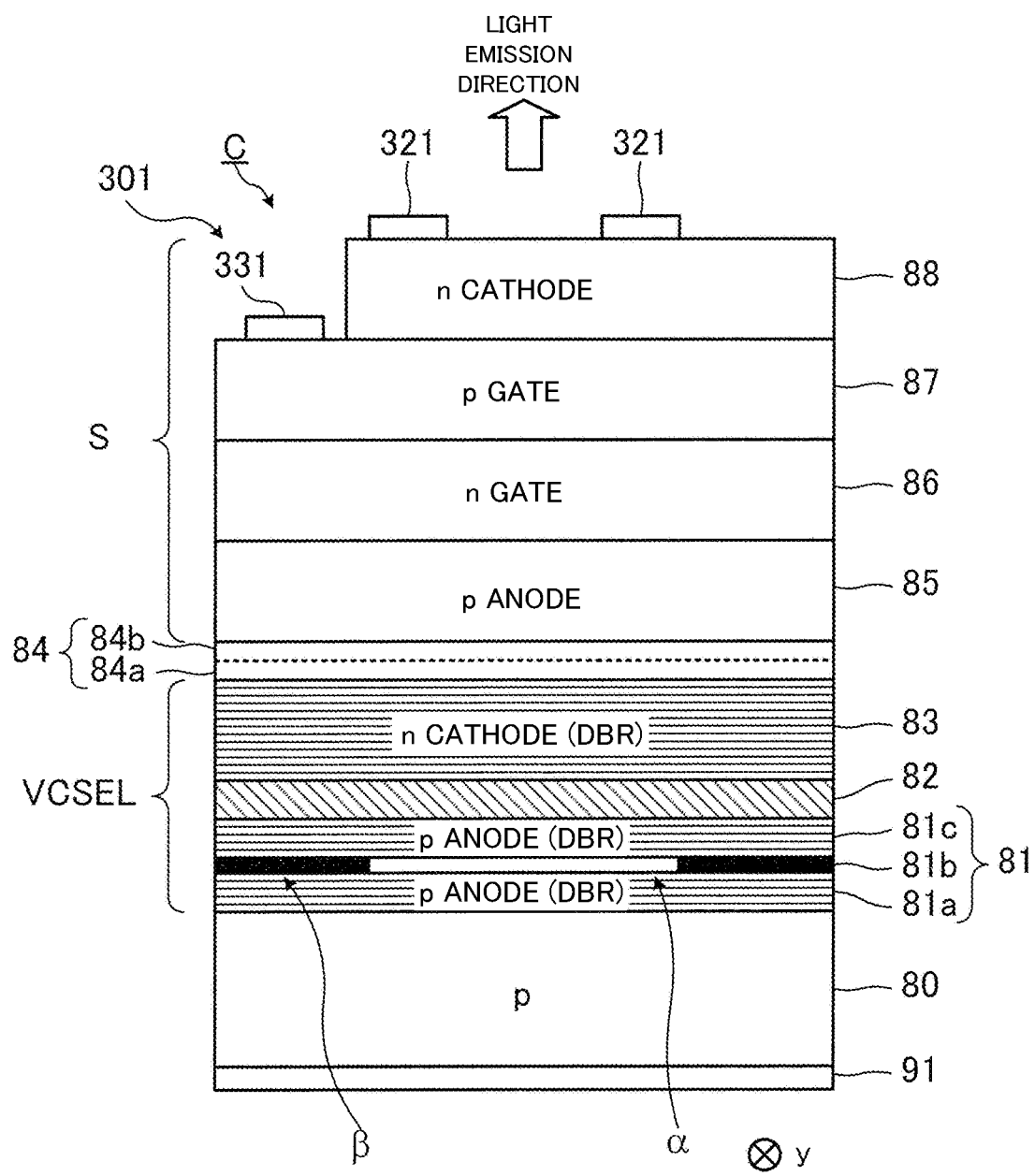
FIG. 26 is an enlarged cross-sectional view of an island configured in a light emitting chip according to a third embodiment so as to include a laminate of a vertical cavity surface emitting laser and a setting thyristor.

FIG. 26 is an enlarged cross-sectional view of an island 301 configured in a light emitting chip C according to the third exemplary embodiment so as to include a laminate of a vertical cavity surface emitting laser VCSEL and a setting thyristor S.

The vertical cavity surface emitting laser VCSEL and the setting thyristor S are stacked.

The basic configuration is the same as the light emitting chip C of the second exemplary embodiment shown in FIG. 22, and thus a description thereof will not be made.

The vertical cavity surface emitting laser VCSEL resonates light, i.e. oscillates a laser in a light emitting layer 82 interposed between two DBR layers (the p anode (DBR) layer 81 and the n cathode (DBR) layer 83). When the reflectance of the two DBR layers (the p anode (DBR) layer 81 and the n cathode (DBR) layer 83) is equal to or larger than, for example, 99%, laser oscillation occurs.

In addition, as described in the first exemplary embodiment, in place of the tunnel junction layer 84, a metallic conductive III-V compound layer may be used. Also, a voltage reducing layer 89 may be added to the setting thyristors S and the transfer thyristors T. Similarly to the tunnel junction layer 84, with respect to the metallic conductive III-V compound layer and the voltage reducing layer 89, it is feared that they will absorb light emitted from the vertical cavity surface emitting lasers VCSEL.

Also, similarly in the modification 1-1 of the first exemplary embodiment, a current constriction layer may be provided in the p anode layer 85 of the setting thyristor S. In addition, a current constriction layer may be provided in the n cathode layer 83 of the vertical cavity surface emitting lasers VCSEL or the n cathode layer 88 of the setting thyristor S.

Light from the vertical cavity surface emitting laser VCSEL may be absorbed by a tunnel junction layer 84, a metallic conductive III-V compound layer, a voltage reducing layer 89, or the like, whereby the amount of light to be emitted may decrease. Therefore, the third exemplary embodiment may be used in applications in which it does not matter that the amount of light is small.

In addition, in the case where light from the vertical cavity surface emitting laser VCSEL is absorbed by a tunnel junction layer 84, a metallic conductive III-V compound layer, a voltage reducing layer 89, or the like, whereby the amount of light to be emitted decreases, the third exemplary embodiment may be manufactured by turning the semiconductor layer laminate upside down using a transfer substrate 100.

As a method of avoiding light absorption of the tunnel junction layer 84, the metallic conductive III-V compound layer, or the voltage reducing layer 89, over a part or the whole of the central opening of the n ohmic electrode 321, the n cathode layer 88, the p gate layer 87, the n gate layer 86, and the p anode layer 85 constituting the setting thyristor S, and the tunnel junction layer 84 may be removed partially or entirely in the thickness direction by etching. In the case of using a metallic conductive III-V compound layer in place of the tunnel junction layer 84, the metallic conductive III-V compound layer by etching may be removed partially or entirely in the thickness direction. In addition, in the case of using the voltage reducing layer 89, the voltage reducing layer also may be removed in the same way.

Hereinafter, modifications of the light emitting chips C according to the third exemplary embodiment will be described. In each of the following modifications, a part of an island 301 of a light emitting chip C including a laminate of a vertical cavity surface emitting laser VCSEL and a setting thyristor S will be described; however, the same is true of the under diodes UD and the transfer thyristors T. The other configuration is the same as that in the light emitting chips C described above. Therefore, different parts will be described, and a description of identical parts will not be made.

(Modification 3-1 of Light Emitting Chips C According to Third Exemplary Embodiment)

Figure 27:
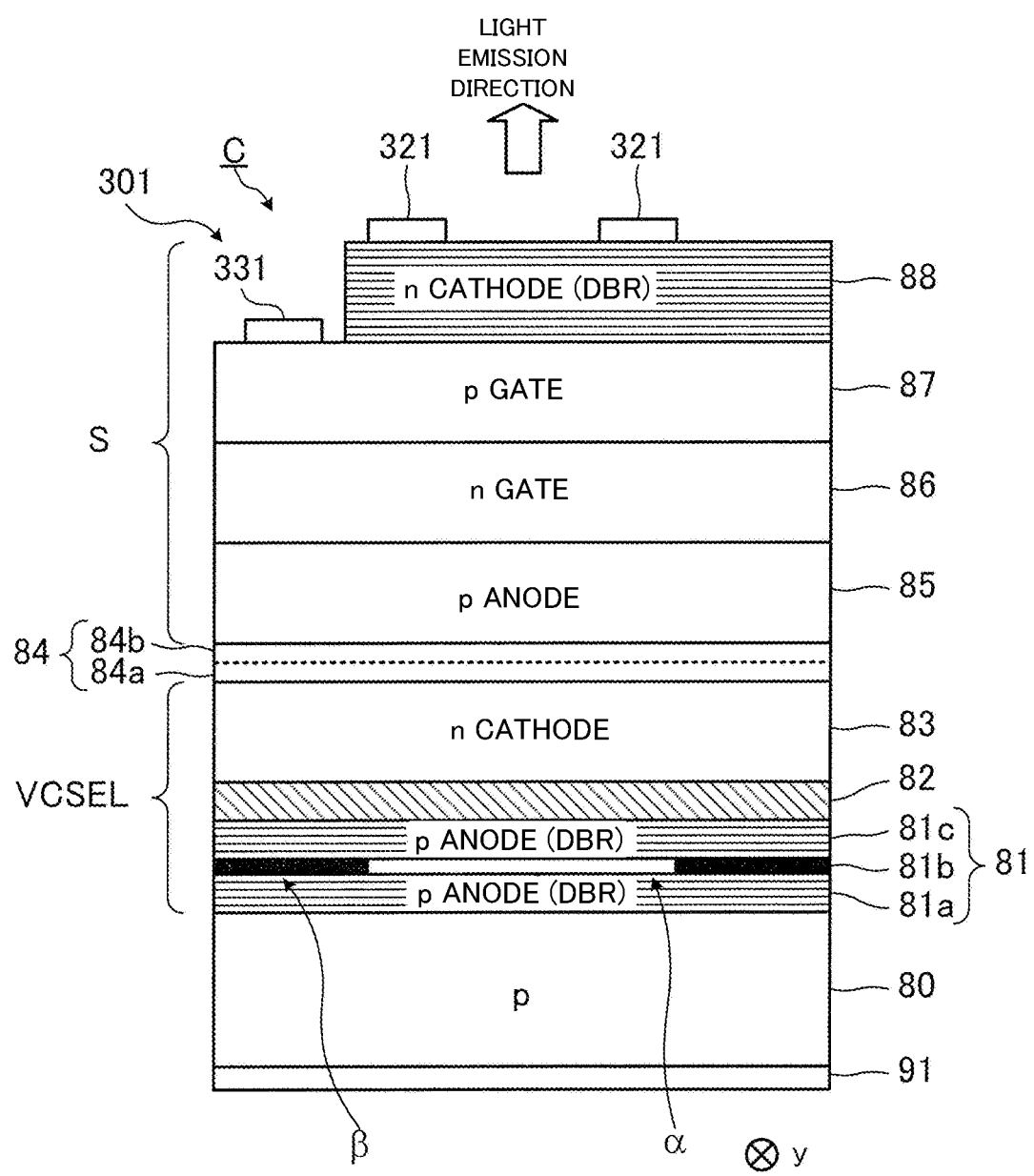
FIG. 27 is an enlarged cross-sectional view of an island which includes a laminate of a vertical cavity surface emitting laser and a setting thyristor and is for explaining a modification 3-1.

FIG. 27 is an enlarged cross-sectional view of an island 301 having a laminate of a vertical cavity surface emitting laser VCSEL and a setting thyristor S for explaining a modification 3-1.

The basic configuration of the modification 3-1 is the same as the modification 2-2 of the light emitting chip C of the second exemplary embodiment shown in FIG. 23, and thus a description thereof will not be made.

The vertical cavity surface emitting laser VCSEL resonates light, i.e. oscillates a laser in a light emitting layer 82 interposed between two DBR layers (the p anode (DBR) layer 81 and the n cathode (DBR) layer 88).

The position of the current constriction layer may be changed. Also, in place of the tunnel junction layer 84, a metallic conductive III-V compound layer may be used. Further, as a current constriction layer, a tunnel junction layer 84 or a metallic conductive III-V compound layer may be used. Furthermore, in the thyristors (the setting thyristors S and the transfer thyristors T), a voltage reducing layer 89 may be provided.

By the way, light from the vertical cavity surface emitting lasers VCSEL may be absorbed by a tunnel junction layer 84, a metallic conductive III-V compound layer, a voltage reducing layer 89, or the like, whereby the amount of light to be emitted may decrease. Even in this case, the modification 3-1 may be used in applications in which it does not matter that the amount of light is small.

Figure 28:
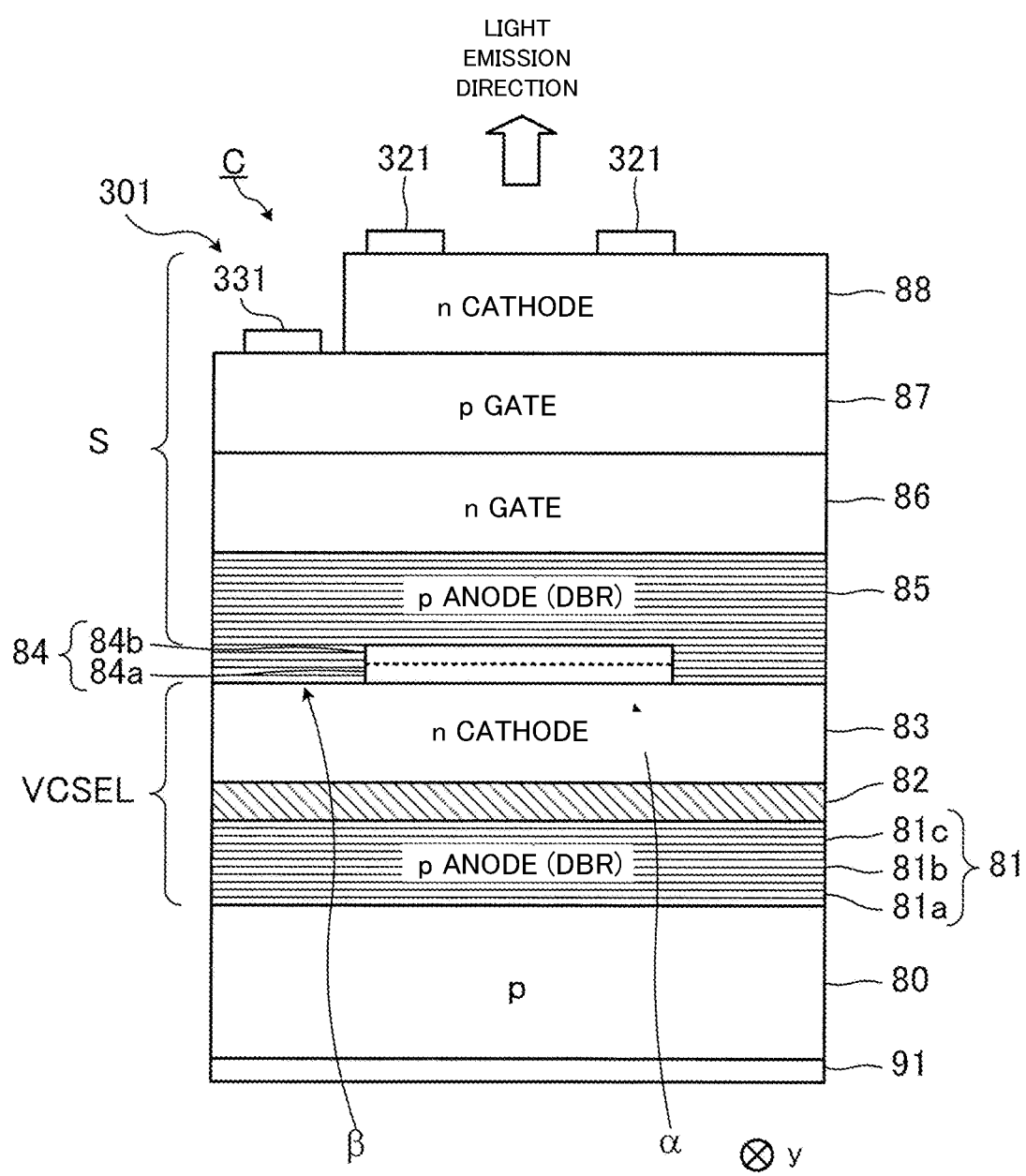
FIG. 28 is an enlarged cross-sectional view of an island which includes a laminate of a vertical cavity surface emitting laser and a setting thyristor and is for explaining a modification 3-2.

(Modification 3-2 of Light Emitting Chips C According to Third Exemplary Embodiment) FIG. 28 is an enlarged cross-sectional view of an island 301 having a laminate of a vertical cavity surface emitting laser VCSEL and a setting thyristor S for explaining a modification 3-2.

The basic configuration of the modification 3-2 is the same as the modification 1-2 of the light emitting chip C of the first exemplary embodiment shown in FIG. 19, and a p anode layer 81 and a p anode layer 85 are provided as DBR layers. The other configuration is the same as that in the modification 1-2, and thus a description thereof will not be made.

The vertical cavity surface emitting laser VCSEL resonates light, i.e. oscillates a laser between the two DBR layers (the p anode (DBR) layer 81 and the p anode (DBR) layer 85) with the light emitting layer 82 and the n cathode layer 83 interposed therebetween.

Also, since the modification 3-2 does not use a current constriction layer 81b, it may be easily applied to semiconductor materials on substrates of InP, GaN, sapphire, etc. to which it is difficult to apply steam oxidation.

By the way, since a tunnel junction layer 84 is used for current constriction, power consumption for non-radiative recombination is suppressed. Therefore, power consumption decreases, and light extraction efficiency improves.

Also, in place of the tunnel junction layer 84, a metallic conductive III-V compound layer may be used. Furthermore, in the thyristors (the setting thyristors S and the transfer thyristors T), a voltage reducing layer 89 may be provided.

By the way, light from the vertical cavity surface emitting lasers VCSEL may be absorbed by a tunnel junction layer 84, a metallic conductive III-V compound layer, a voltage reducing layer 89, or the like, whereby the amount of light to be emitted may decrease. Even in this case, the modification 3-2 may be used in applications in which it does not matter that the amount of light is small.

Fourth Exemplary Embodiment

In the first exemplary embodiment to the third exemplary embodiment, the transfer thyristors T are configured on the under diodes UD, and the under diodes UD and the transfer thyristors T are connected in series. Therefore, the "L" potential of the first transfer signal φ1 or the second transfer signal φ2 which is supplied to the transfer thyristors T is applied to the under diodes UD and the transfer thyristors T connected in series. For this reason, as the "L" potential, for example, −5 V is used.

In the fourth exemplary embodiment, the transfer thyristors T are configured so as not to be connected in series with the under diodes UD. Therefore, the "L" potential of the first transfer signal φ1 or the second transfer signal φ2 which is supplied to the transfer thyristors T decreases, and may be applied to the anodes and cathodes of the transfer thyristors T. For example, the "L" potential may be −3.3 V.

The configuration other than the structure of the light emitting chips C is the same as that in the first exemplary embodiment. Therefore, a description of identical parts will not be made, and different parts will be described.

FIG. 29 is an equivalent circuit diagram for explaining the circuit configuration of a light emitting chip C equipped with a self-scanning type light emitting element array (SLED) according to the fourth exemplary embodiment.

The light emitting chip C1(C) includes a light emitting part 102 (see FIG. 4A) configured with laser diodes LD1 to LD128. Further, the light emitting chip C1(C) includes a driving unit 101 which is composed of setting thyristors S1 to S128, transfer thyristors T1 to T128, coupling diodes D1 to D127, power-supply-line resistors Rg1 to Rg128, a start diode SD, and current limiting resistors R1 and R2.

In other words, each light emitting chip C according to the fourth exemplary embodiment does not include under diodes UD1 to UD128, unlike the light emitting chip C of the first exemplary embodiment shown in FIG. 5.

Figure 30:
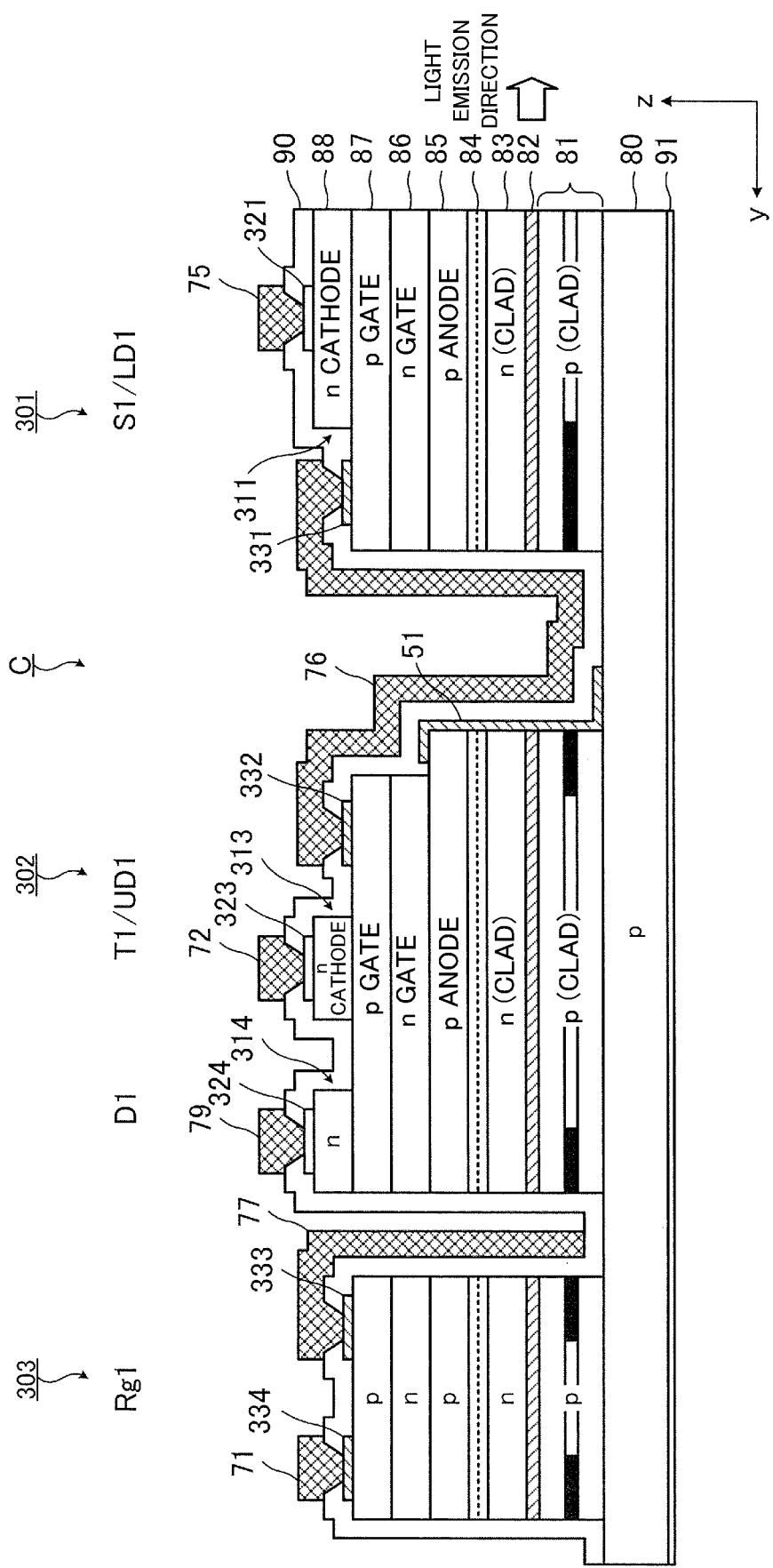
FIG. 30 is a cross-sectional view of islands of the light emitting chip according to the fourth embodiment.

FIG. 30 is a cross-sectional view illustrating islands 301, 302, and 303 of the light emitting chip C according to the fourth exemplary embodiment.

The planer layout of the light emitting chip C according to the fourth exemplary embodiment is the same as the planer layout of the light emitting chip of the first exemplary embodiment shown in FIG. 6A. Therefore, a description thereof will not be made.

The cross-sectional view of the islands 301 and 302 of the light emitting chip C of the fourth exemplary embodiment shown in FIG. 30 illustrates a cross section taken along the line VIB-VIB of FIG. 6A. However, FIG. 30 is a cross-sectional view illustrating the opposite side to the side illustrated in FIG. 6B, as seen from the negative x direction.

As shown in FIG. 30, in the light emitting chip C according to the fourth exemplary embodiment, in the island 302, a p anode layer 85 of a transfer thyristor T and a p-type substrate 80 are connected to each other through a connection wire 51 formed of Au(AuZn) or the like containing Zn which may easily make ohmic contacts with p-type semiconductor layers.

Therefore, the p anode layer 85 of the transfer thyristor T is set at a reference potential Vsub ("H" (0 V)) which is supplied to the back electrode 91 of the substrate 80.

Further, in a under diode UD positioned under the transfer thyristor T, the side surfaces of a p anode layer 81, a light emitting layer 82, and a n cathode layer 83 are short-circuited by the connection wire 51. Therefore, although the under diode UD exists, it does not operate. By the way, the side surface of the island 302 may be entirely covered with a protective layer 90. In addition, the connection wire 51 needs only to prevent the under diode UD from operating, and may be provided at any other part.

Also, the connection wire 51 may be connected to the n cathode (clad) layer 83 of the under diode UD1 of the island 302.

Figure 31:
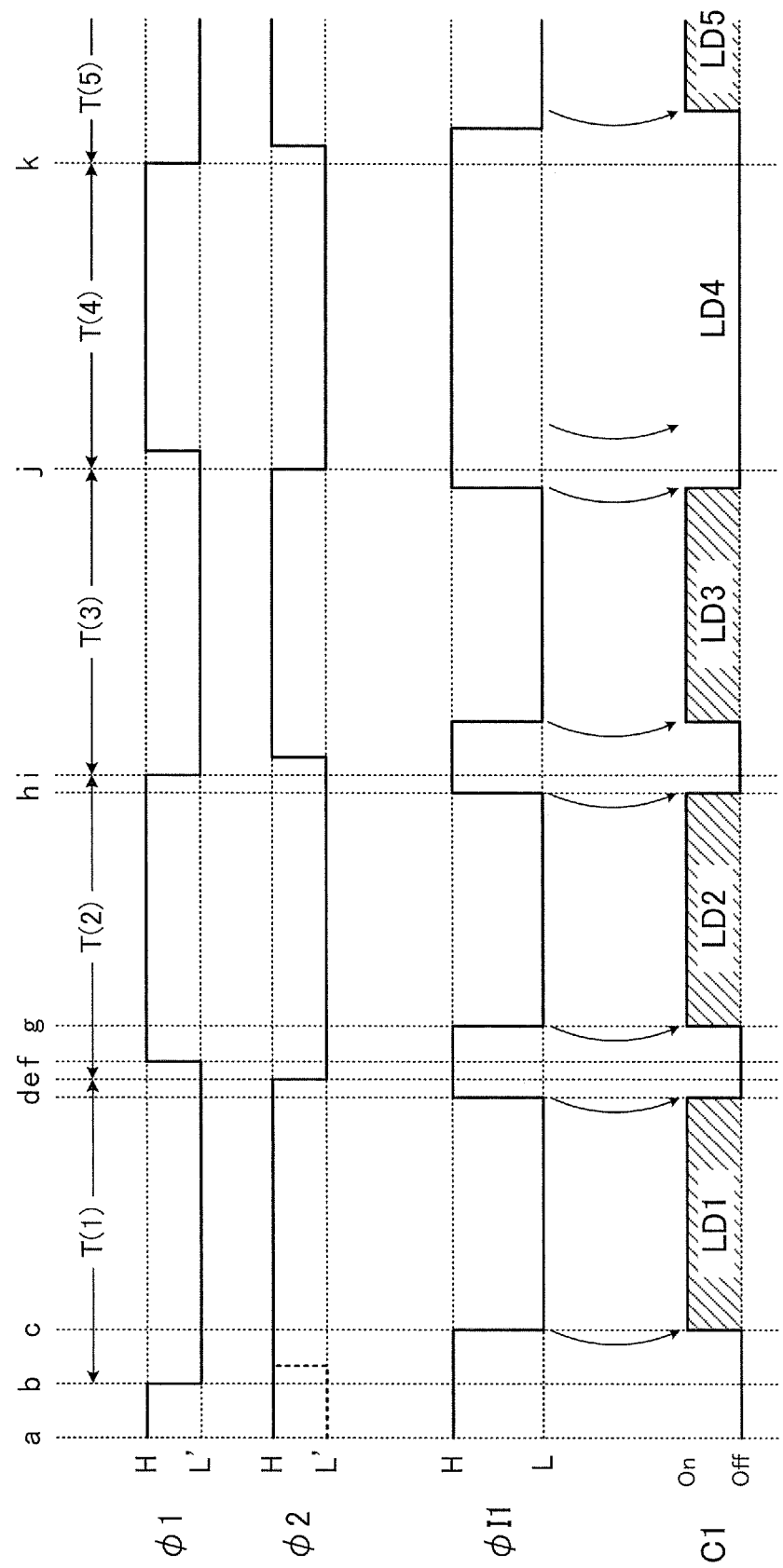
FIG. 31 is a timing chart for explaining an operation of the light emitting chip according to the fourth embodiment.

FIG. 31 is a timing chart for explaining an operation of a light emitting chip C according to the fourth exemplary embodiment.

Instead of the "L" of the first transfer signal φ1 and the second transfer signal φ2 In the timing chart of FIG. 9 for explaining a light emitting chip C according to the first exemplary embodiment, "L" is used. As described above, the first transfer signal φ1 and the second transfer signal φ2 are applied between the anode and cathode of the transfer thyristor T. Therefore, the "L" may be a voltage whose absolute value is smaller than that of the first transfer signal φ1 and the second transfer signal φ2 of the light emitting chips C according to the first exemplary embodiment. In other words, voltage which is applied to the under diodes UD (which is set at 1.7 V here) is unnecessary. In this example, the "L'" is −3.3 V. By the way, for the operation of the light emitting chip C, instead of the "L" (−5 V) of the first transfer signal φ1 and the second transfer signal φ2, the "L'" (−3.3 V) may be used such that the operation of the under diode UD becomes ignorable.

Since the voltage of the first transfer signal φ1 and the second transfer signal φ2 for the operation decreases, power consumption decreases.

The configuration of the light emitting chip C according to the fourth exemplary embodiment may be applied to the light emitting chips C of the first exemplary embodiment to the third exemplary embodiment.

Fifth Exemplary Embodiment

In the first exemplary embodiment to the fourth exemplary embodiment, the setting thyristors S are stacked on the light emitting elements (the laser diodes LD, the light emitting diodes LED, or the vertical cavity surface emitting lasers VCSEL), and are connected in series with them.

In each light emitting chip C according to a fifth exemplary embodiment, light emitting elements and setting thyristors S are not stacked, and are connected in series by connection wires.

Hereinafter, as the light emitting elements, laser diodes LD will be described.

Figure 32:
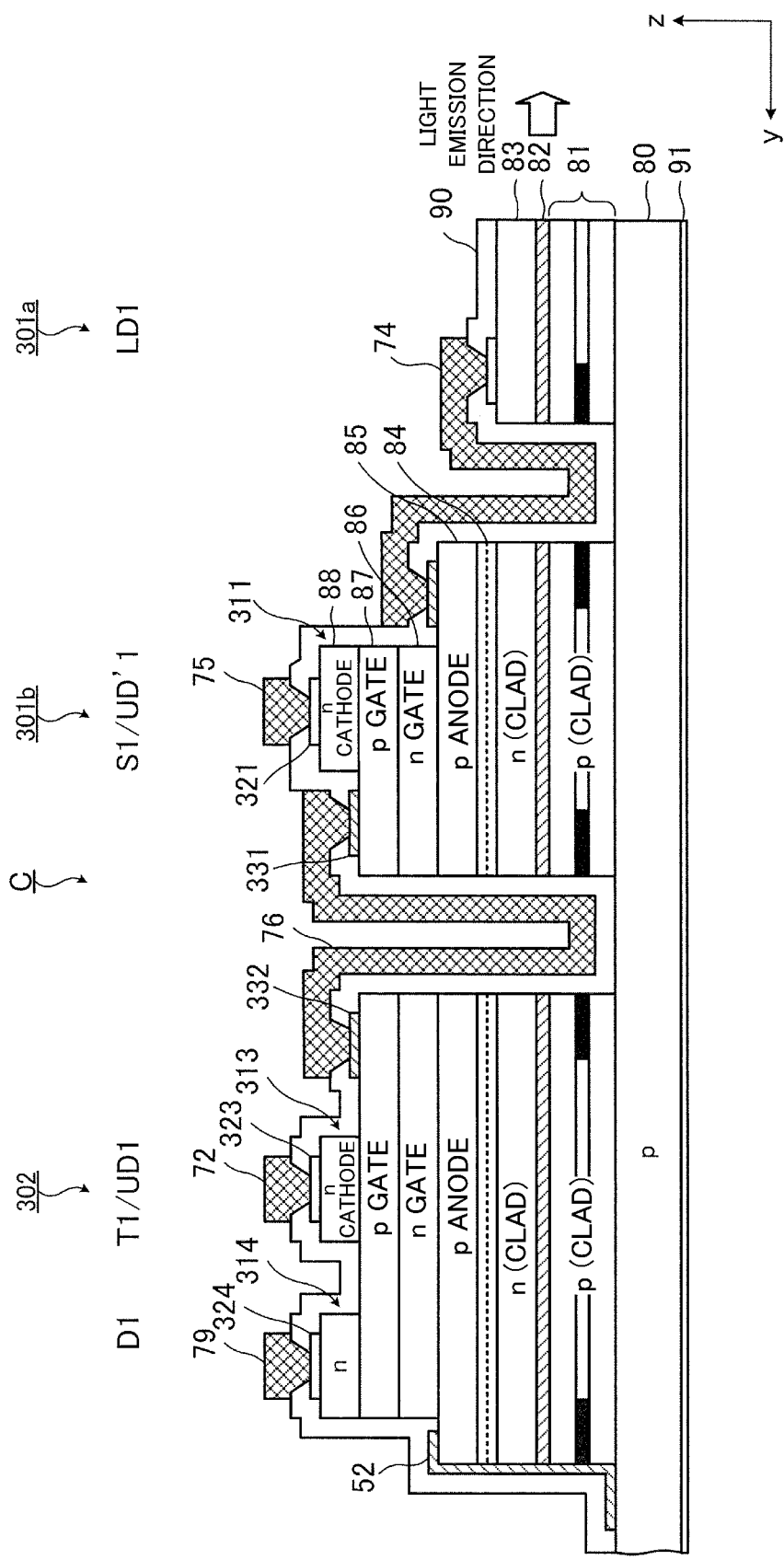
FIG. 32 is an enlarged cross-sectional view of an island having a laser diode, an island having a setting thyristor, and an island having a transfer thyristor T and so on, included in a light emitting chip according to a fifth embodiment.

FIG. 32 is an enlarged cross-sectional view illustrating an island 301a including a laser diode LD1, an island 301b including a setting thyristor S1, and an island 302 including a transfer thyristor T1 and so on, included in a light emitting chip C according to the fifth exemplary embodiment. By the way, an island 303 is identical to the island 303 shown in FIG. 7, and thus is not illustrated.

As shown in FIG. 32, in the light emitting chip C according to the fifth exemplary embodiment, unlike in the light emitting chip C of the fourth exemplary embodiment shown in FIG. 30, the island 301a and the island 301b constitute an island 301. In other words, in the island 301a, a p anode (clad) layer 81, a light emitting layer 82, and a n cathode (clad) layer 83 are stacked, whereby a laser diode LD1 is configured. The island 301b has the same layer configuration as that of the island 301 of FIG. 7. In other words, in the island 301b, a p anode (clad) layer 81, a light emitting layer 82, an n cathode (clad) layer 83, a tunnel junction layer 84, a p anode layer 85, an n gate layer 86, a p gate layer 87, and an n cathode layer 88 are stacked. However, the p anode (clad) layer 81, the light emitting layer 82, and the n cathode (clad) layer 83 constituting the island 301b do not serve as a laser diode LD, and constitutes an under diode UD'1 similar to the under diode UD1 of the island 302. By the way, in the island 302, a p anode layer 85 of a transfer thyristor T and a p-type substrate 80 are connected to each other through a connection wire 52 formed of Au(AuZn) or the like containing Zn which may easily make ohmic contacts with p-type semiconductor layers, like the connection wire 51 of the island 302 of FIG. 30. However, the connection wire 52 is provided at a part different from the part where the connection wire 51 in the case of FIG. 30 is provided.

In addition, the n cathode (clad) layer 83 of the island 301a which is the cathode of the laser diode LD1 and the p anode layer 85 of the setting thyristor S1 of the island 301b are connected by the connection wire 74. In other words, the laser diode LD1 and the setting thyristor S1 are connected in series. Moreover, the anode (clad) layer 81 of the laser diode LD1 is connected to the reference potential Vsub ("H" (0 V)) through the substrate 80, and the n cathode layer 88 of the setting thyristor S1 is connected to the lighting signal line 75.

By the way, the connection wire 74 may be connected to the n cathode (clad) layer 83 of the under diode UD'1 of the island 301b.

Also, since the fifth exemplary embodiment operates even though it does not have a tunnel junction layer 84 in each island, it has advantages such as prevention of deterioration in crystal quality, a longer life, and an improvement in yield.

As described above, the light emitting chip C according to the fifth exemplary embodiment has the circuit configuration shown by the circuit diagram equivalent to FIG. 29, similarly to the light emitting chips C according to the fourth exemplary embodiment. Therefore, the light emitting chip operates according to the timing chart shown in FIG. 31.

In other words, the laser diodes LD and the setting thyristors S may be stacked so as to be connected in series, or may be connected in series by connection wires.

By the way, the light emitting elements may be the light emitting diodes LED or the vertical cavity surface emitting lasers VCSEL described in the modifications and other exemplary embodiments described above, instead of the laser diodes LD.

Sixth Exemplary Embodiment

The light emitting chips C according to the first exemplary embodiment to the fifth exemplary embodiment are driven by turning on the transfer thyristors T in the order in the ON-state transfer (propagation) manner.

Light emitting chips C according to a sixth exemplary embodiment does not have transfer thyristors T. The other configuration is the same as that of the first exemplary embodiment, and hereinafter, a light emitting chip C will be described.

Figure 33:
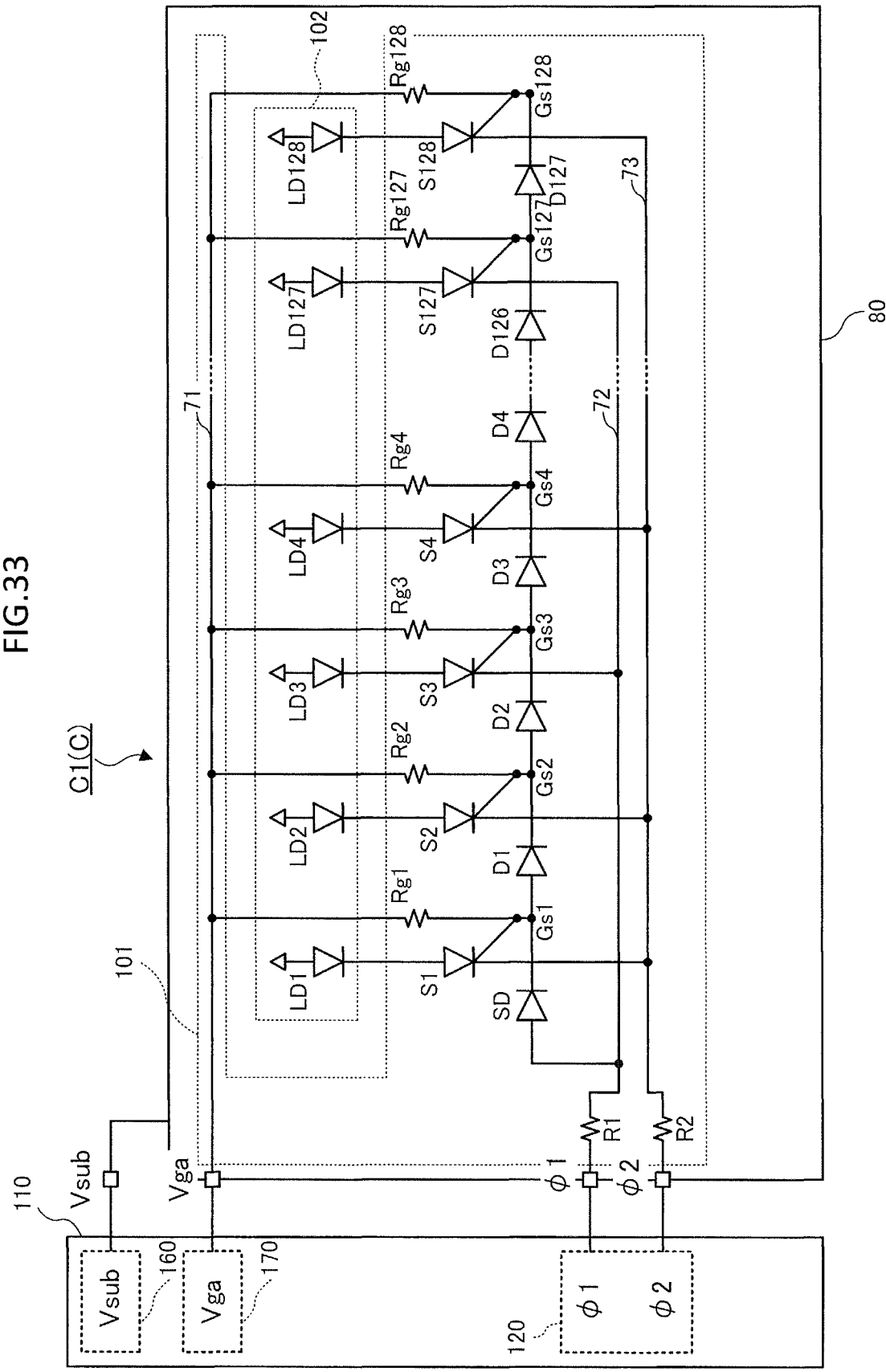
FIG. 33 is an equivalent circuit diagram for explaining the circuit configuration of a light emitting chip equipped with a self-scanning type light emitting element array (SLED) according to a sixth embodiment.

FIG. 33 is an equivalent circuit diagram for explaining the circuit configuration of a light emitting chip C equipped with a self-scanning type light emitting element array (SLED) according to the sixth exemplary embodiment. Similarly to the light emitting chip C of the first exemplary embodiment shown in FIG. 5, a light emitting chip C will be described with respect to the relation with a signal generating circuit 110 and taking the light emitting chip C1 as an example. For this reason, in FIG. 33, the light emitting chip is denoted by C1(C), instead of C. The other light emitting chips C2 to C40 have the same configuration as that of the light emitting chip C1.

The light emitting chip C according to the sixth exemplary embodiment is different from the light emitting chip C of the first exemplary embodiment shown in FIG. 5, in that under diodes UD are provided in place of the laser diodes LD of the first exemplary embodiment, and setting thyristors S are provided in place of the transfer thyristors T of the first exemplary embodiment. In other words, the function of the transfer thyristors T is imparted to the setting thyristors S.

In this case, if the setting thyristors S serving as transfer thyristors T are turned on by the first transfer signal φ1 and the second transfer signal φ2, the laser diodes LD are turned on (i.e. they emit light). By the way, lighting signals φI may be superimposed on the first transfer signal φ1 or the second transfer signal φ2 which is supplied to the setting thyristors S, in order to control the light emission amounts of the laser diodes LD.

According to this configuration, the number of elements which are used in the light emitting chip C decreases, and the size of the light emitting chip C decreases.

This light emitting chip C does not have an island 301, unlike in the planar layout diagram of FIG. 6A illustrating the light emitting chip C of the first exemplary embodiment. Therefore, also in this light emitting chip C, the laser diodes LD and the setting thyristors S are connected in series through a tunnel junction layer 84. Moreover, the anode (clad) layer 81 of each laser diode LD is connected to the reference potential Vsub ("H" (0 V)) through the substrate 80, and the n cathode layer 88 of each setting thyristor S is connected to the first transfer signal line 72 or the second transfer signal line 73. In other words, the laser diodes LD are provided on the reference potential (Vsub) side, and the setting thyristors S are provided on the side to which the first transfer signal φ1 or the second transfer signal φ2 (the side to which the first transfer signal line 72 or the second transfer signal line 73 is connected).

If the setting thyristors S are provided on the reference potential (Vsub) side, and the laser diodes LD are provided on the side to which a signal is supplied, a malfunction (an erroneous operation) in which transfer (propagation) of the ON state by the setting thyristors S is not performed occurs, as described in the first exemplary embodiment with respect to the influence of the under diodes UD on the operations of the transfer thyristors T.

In other words, the laser diodes LD are provided on the side to which the reference potential Vsub is supplied, and the setting thyristors S are provided on the side to which the first transfer signal φ1 or the second transfer signal φ2 (the side to which the first transfer signal line 72 or the second transfer signal line 73 is connected). Therefore, occurrence of a malfunction (an erroneous operation) in which transfer (propagation) of the ON state by the setting thyristors S is not performed is suppressed.

By the way, the light emitting elements may be the light emitting diodes LED or the vertical cavity surface emitting lasers VCSEL described in the modifications and other exemplary embodiments described above, instead of the laser diodes LD.

In the light emitting chips C according to the first exemplary embodiment to the sixth exemplary embodiment, as light emitting elements, the laser diodes LD, the light emitting diodes LED, or the vertical cavity surface emitting lasers VCSEL have been described; however, other light emitting elements such as laser transistors may be used. Each of transistors is turned on and off by inputting an ON/OFF signal to the base, or the base is short-circuited to the collector or the emitter. Therefore, transistors also are included in light emitting elements having rectifying characteristics Each of the self-scanning type light emitting element arrays (SLED) of the first exemplary embodiment to the sixth exemplary embodiment is composed of a light emitting part 102 having light emitting elements (laser diodes LD, light emitting diodes LED, or vertical cavity surface emitting lasers VCSEL), and a driving unit 101 having setting thyristors S, under diodes UD, transfer thyristors T, and so on. However, in the driving unit 101, thyristors for control and so on may be provided between the setting thyristors S and the transfer thyristors T and between other components. Also, other members such as diodes and resistors may be included.

Also, although the transfer thyristors T may be connected by the coupling diodes D, they may be connected by members capable of transferring change in potential, such as resistors.

In each of the light emitting chips C according to the first exemplary embodiment to the sixth exemplary embodiment, it is possible to change the polarities in the circuit while reversing the conductivity types of the light emitting elements (the laser diodes LD, the light emitting diodes LED, or the vertical cavity surface emitting lasers VCSEL), the setting thyristors S, the under diodes UD (including the under diodes UD' of the fifth exemplary embodiment), and the transfer thyristors T. In other words, it is possible to change an anode-common configuration to a cathode-common configuration, or change a cathode-common configuration to an anode-common configuration.

In addition, in order to suppress light emission delay or relaxation oscillation when the light emitting elements (the laser diodes LD, the light emitting diodes LED, or the vertical cavity surface emitting lasers VCSEL) are turned on, a minute current equal to or higher than a threshold current may be applied to the light emitting elements in advance, such that the light emitting elements become such a state that they emit a little of light or slightly oscillate. In other words, the light emitting elements may be made emit a little of light or slightly oscillate from before the setting thyristors S are turned on, such that when the setting thyristors S are turned on, the light emission amounts of the light emitting elements increase to the predetermined light amounts. As such a configuration, for example, on the anode layers of the light emitting elements (the laser diodes LD, the light emitting diodes LED, or the vertical cavity surface emitting lasers VCSEL), electrodes may be formed, and a voltage source or a current source may be connected to those electrodes in advance, such that a minute current is applied from the voltage source or the current source to the light emitting elements from before the setting thyristors S are turned on.

Also, in each exemplary embodiment, any other structures than the four-layer p-n-p-n structure may be used as the structures of the transfer thyristors T and the setting thyristors S, as long as they have functions of the transfer thyristors T and the setting thyristors S of the corresponding exemplary embodiment. For example, a p-i-n-i-n structure, a p-i-p-i-n structure, an n-p-i-p structure, a p-n-i-n structure, and so on having thyristor characteristics may be used. In the p-i-p-i-n structure, one of the i layer, the n layer, and the i layer interposed between the p layer and the n layer may serve as a gate layer; and an n ohmic electrode provided on the gate layer may serve as a gate Gt (a gate Gs) which is a terminal. In the p-n-i-n structure, one of the n layer and the i layer interposed between the p layer and the n layer may serve as a gate layer; and an n ohmic electrode provided on the gate layer may serve as a gate Gt (a gate Gs) which is a terminal. Also, in the p-i-p-i-n structure, one of the i layer, the p layer, and the i layer interposed between the p layer and the n layer may serve as a gate layer; and a p ohmic electrode 332 provided on the gate layer may serve as a gate Gt (a gate Gs) which is a terminal. In the n-p-i-p structure, one of the p layer and the i layer interposed between the n layer and the p layer may serve as a gate layer; and a p ohmic electrode 332 provided on the gate layer may serve as a gate Gt (a gate Gs) which is a terminal.

Further, the semiconductor structure of each exemplary embodiment in which the plurality of semiconductor layers constituting the thyristors and the plurality of semiconductor layers constituting the light emitting elements are stacked with the semiconductor layer forming the tunnel junction may be used for other applications than self-scanning type light emitting element arrays (SLED). For example, the semiconductor structure may be used for a single light emitting component which is composed of one light emitting element (a laser diode LD, a light emitting diode LED, a vertical cavity surface emitting laser VCSEL, or the like) and a setting thyristor S stacked thereon and is turned on in response to input of an electric signal, an optical signal, or the like from the outside. In this case, the light emitting element constitutes a light emitting part 102, and the setting thyristor S constitutes a driving unit 101.

The above description has been made mainly taking a p-type GaAs substrate as an example of the substrate 80. Examples of individual semiconductor layers (semiconductor layer laminates which are formed in the semiconductor layer laminate forming process of FIG. 10A) in the cases using other substrates will be described.

First, an example of a semiconductor layer laminate in the case of using a GaN substrate is as follows.

A p anode layer 81 is, for example, p-type $Al_{0.9}GaN$ with an impurity concentration of $1 \times 10^{18}/cm^3$. The Al composition may be changed in a range between 0 and 1.

On the GaN substrate, it is difficult to use an oxidation constriction layer as a current constriction layer. For this reason, a configuration using a tunnel junction layer for current constriction (FIG. 19 and FIG. 28) or a configuration using a metallic conductive III-V compound layer for current constriction are preferable structures. Alternatively, it is also effective to use ion injection as a current constriction method.

A light emitting layer 82 has a quantum well structure having well layers and barrier layers alternately stacked. The well layers are, for example, GaN, InGaN, AlGaN, or the like, and the barrier layers are AlGaN, GaN, or the like. However, the light emitting layer 82 may be, for example, a quantum line (quantum wire) or a quantum box (quantum dot).

An n cathode layer 83 is, for example, n-type $Al_{0.9}GaN$ with an impurity concentration of $1 \times 10^{18}/cm^3$. The Al composition may be changed in a range between 0 and 1.

A tunnel junction layer 84 is configured by the junction between an $n^{++}$ layer 84a containing a high concentration of n-type impurities and a $p^{++}$ layer 84b containing a high concentration of p-type impurities (see FIG. 10B). Each of the $n^{++}$ layer 84a and the $p^{++}$ layer 84b has, for example, an impurity concentration as high as $1 \times 10^{20}/cm^3$. By the way, the impurity concentration of an ordinary junction ranges from the order of $10^{17}/cm^3$ to the order of $10^{18}/cm^3$. Examples of the combination of the $n^{++}$ layer 84a and the $p^{++}$ layer 84b (hereinafter, denoted as $n^{++}$ layer 84a/$p^{++}$ layer 84b) include $n^{++}$ GaN/$p^{++}$ GaN, $n^{++}$ GaInN/$p^{++}$ GaInN, and $n^{++}$ AlGaN/$p^{++}$ AlGaN. By the way, combinations which are obtained by exchange between the combinations may be used.

A p anode layer 85 is, for example, p-type $Al_{0.9}GaN$ with an impurity concentration of $1 \times 10^{18}/cm^3$. The Al composition may be changed in a range between 0 and 1.

An n gate layer 86 is, for example, n-type $Al_{0.9}GaN$ with an impurity concentration of $1 \times 10^{17}/cm^3$. The Al composition may be changed in a range between 0 and 1.

A p gate layer 87 is, for example, p-type $Al_{0.9}GaN$ with an impurity concentration of $1 \times 10^{17}/cm^3$. The Al composition may be changed in a range between 0 and 1.

An n cathode layer 88 is, for example, n-type $Al_{0.9}GaN$ with an impurity concentration of $1 \times 10^{18}/cm^3$. The Al composition may be changed in a range between 0 and 1.

An example of a semiconductor layer laminate in the case of using an InP substrate is as follows.

A p anode layer 81 is, for example, p-type InGaAsP with an impurity concentration of $1 \times 10^{18}/cm^3$. Each of the Ga composition and the Al composition may be changed in a range between 0 and 1.

On the InP substrate, it is difficult to use an oxidation constriction layer as a current constriction layer. For this reason, a configuration using a tunnel junction layer for current constriction (FIG. 19 and FIG. 28) or a configuration using a metallic conductive III-V compound layer for current constriction are preferable structures. Alternatively, it is also effective to use ion injection as a current constriction method.

A light emitting layer 82 has a quantum well structure having well layers and barrier layers alternately stacked. The well layers are, for example, InAs, InGaAsP, AlGaInAs, GaInAsPSb, or the like, and the barrier layers are InP, InAsP, InGaAsP, AlGaInAsP, or the like. However, the light emitting layer 82 may be, for example, a quantum line (quantum wire) or a quantum box (quantum dot).

An n cathode layer 83 is, for example, n-type InGaAsP with an impurity concentration of $1 \times 10^{18}/cm^3$. Each of the Ga composition and the Al composition may be changed in a range between 0 and 1.

A tunnel junction layer 84 is configured by the junction between an $n^{++}$ layer 84a containing a high concentration of n-type impurities and a $p^{++}$ layer 84b containing a high concentration of p-type impurities (see FIG. 10B). Each of the $n^{++}$ layer 84a and the $p^{++}$ layer 84b has, for example, an impurity concentration as high as $1 \times 10^{20}/cm^3$. By the way, the impurity concentration of an ordinary junction ranges from the order of $10^{17}/cm^3$ to the order of $10^{18}/cm^3$. Examples of the combination of the $n^{++}$ layer 84a and the $p^{++}$ layer 84b (hereinafter, denoted as $n^{++}$ layer 84a/$p^{++}$ layer 84b) include $n^{++}$ InP/$p^{++}$ InP, $n^{++}$ InAsP/$p^{++}$ InAsP, $n^{++}$ InGaAsP/$p^{++}$ InGaAsP, and $n^{++}$ InGaAsPSb/$p^{++}$ InGaAsPSb. By the way, combinations which are obtained by exchange between the combinations may be used.

A p anode layer 85 is, for example, p-type InGaAsP with an impurity concentration of $1 \times 10^{18}/cm^3$. Each of the Ga composition and the Al composition may be changed in a range between 0 and 1.

An n gate layer 86 is, for example, n-type InGaAsP with an impurity concentration of $1 \times 10^{17}/cm^3$. Each of the Ga composition and the Al composition may be changed in a range between 0 and 1.

A p gate layer 87 is, for example, p-type InGaAsP with an impurity concentration of $1 \times 10^{17}/cm^3$. Each of the Ga composition and the Al composition may be changed in a range between 0 and 1.

An n cathode layer 88 is, for example, n-type InGaAsP with an impurity concentration of $1 \times 10^{18}/cm^3$. Each of the Ga composition and the Al composition may be changed in a range between 0 and 1.

These semiconductor layers are stacked, for example, by metal organic chemical vapor deposition (MOCVD), molecular beam epitaxy (MBE), etc. so that the semiconductor laminates are formed.

In addition, the above-described exemplary embodiments may also be applied to p-type, n-type, or i-type layers which are formed of organic materials.

Further, each of the exemplary embodiments may be used in combination with other exemplary embodiments.

In each of the above exemplary embodiments, the case where the light emitting device 65 is applied to the image forming apparatus 1 has been described. However, the light emitting device 65 may be used as a light source for performing recognition of a two-dimensional shape or three-dimensional shape of an object, measurement of a distance, and the like.

That is, the light-emitting device 65 may be applied to a light irradiating device that irradiates an object with light two-dimensionally. As an example, a light irradiating device that irradiates light two-dimensionally may be configured by arranging a plurality of light emitting devices 65 in a direction that intersects with the arrangement direction of the plurality of light emitting elements in the light emitting devices 65. Further, as another configuration, a scanning unit that scans the light emitted from the light emitting device 65 in a row in a direction intersecting the row may be provided. That is, a light irradiating device that irradiates light two-dimensionally by scanning light sequentially emitted in the main scanning direction based on the lighting control signal in a sub-scanning direction that intersects the row may be configured. Note that a polygon mirror, a MEMS mirror, and the like are examples of the scanning unit.

The present invention has been described in detail and with reference to specific exemplary embodiments, it will be apparent to those skilled in the art that various changes and modifications may be made without departing from the spirit and scope of the invention.

The foregoing description of the exemplary exemplary embodiments of the present invention has been provided for the purposes of illustration and description. It is not intended to be exhaustive or to limit the invention to the precise forms disclosed. Obviously, many modifications and variations will be apparent to practitioners skilled in the art. The exemplary embodiments were chosen and described in order to best explain the principles of the invention and its practical applications, thereby enabling others skilled in the art to understand the invention for various exemplary embodiments and with the various modifications as are suited to the particular use contemplated. It is intended that the scope of the invention be defined by the following claims and their equivalents.

What is claimed is:

1. A light emitting component comprising:
   a substrate;
   a plurality of light emitting elements each having one terminal connected to a predetermined reference potential and another terminal, the light emitting element having a rectifying characteristic; and
   a plurality of thyristors each connected in series with the other terminal of the light emitting elements, respectively, the thyristors being configured to make the light emitting element connected thereto emit light or increase light emission amount of the light emitting element when the thyristors turn on in an ON state.

2. The light emitting component according to claim 1, wherein the plurality of thyristors is configured to be sequentially turned on in an ON state transfer manner, to turn the plurality of light emitting elements in an ON state sequentially.

3. The light emitting component according to claim 2, wherein the thyristors are turned on by a voltage applied to the serial connections of the light emitting elements and the thyristors, to make the light emitting elements emit light or increase the light emission amounts.

4. The light emitting component according to claim 2, wherein the light emitting elements have constricted current paths.

5. The light emitting component according to claim 1, further comprising:
   a plurality of transfer thyristors each connected to the plurality of thyristors respectively, the transfer thyristors being configured to be sequentially turned on in an ON state transfer manner, to turn the thyristors connected thereto in a state in which the thyristors may transfer to the ON state.

6. The light emitting component according to claim 5, wherein the thyristors are turned on by a voltage applied to the serial connections of the light emitting elements and the thyristors, to make the light emitting elements emit light or increase the light emission amounts.

7. The light emitting component according to claim 5, wherein the light emitting elements have constricted current paths.

8. The light emitting component according to claim 1, wherein the thyristors are turned on by a voltage applied to the serial connections of the light emitting elements and the thyristors, to make the light emitting elements emit light or increase the light emission amounts.

9. The light emitting component according to claim 1, wherein the light emitting elements and the thyristors are connected in series through a tunnel junction layer or a metallic conductive III-V compound layer.

10. The light emitting component according to claim 1, wherein the thyristors comprise semiconductor layer laminates each comprising a plurality of semiconductor layers stacked, the semiconductor layer laminates comprising a voltage reducing layer for reducing a rising voltage of the thyristors.

11. The light emitting component according to claim 10, wherein the light emitting elements further comprise other semiconductor layer laminates each comprising a plurality of semiconductor layers stacked, and
the voltage reducing layer has a band gap energy smaller than those of the semiconductor layers constituting the other semiconductor layer laminates.

12. The light emitting component according to claim 10, wherein the voltage reducing layer has a band gap energy smaller than that of a semiconductor layer constituting light emitting layers of the light emitting elements.

13. The light emitting component according to claim 1, wherein the light emitting elements have constricted current paths.

14. A print head comprising a light emitting unit comprising the light emitting component according to claim 1, and an optical means configured to form an image of light emitted from the light emitting unit.

15. An image forming apparatus comprising:
   an image carrier;
   a charging unit that charges the image carrier;
   an exposing unit comprising the light emitting component according to claim 1, and that exposes the image carrier through the optical unit;
   a developing unit that develops an electrostatic latent image formed on the image carrier by exposing the image carrier by the exposing unit; and
   a transfer unit that transfers the image developed on the image carrier onto a transfer object.

16. A light irradiating device comprising the light emitting component according to claim 1, the light irradiating device being configured to irradiate an object to be irradiated two-dimensionally with light emitted from the light emitting component.

* * * * *